US010262276B2

(12) United States Patent
Puri et al.

(10) Patent No.: US 10,262,276 B2
(45) Date of Patent: Apr. 16, 2019

(54) QUANTUM PROCESSOR, AND METHOD OF QUANTUM PROCESSING

(71) Applicant: SOCPRA SCIENCES ET GENIE S.E.C., Sherbrooke (CA)

(72) Inventors: Shruti Puri, New Haven, CT (US); Arne L. Grimsmo, Stanmore (AU); Alexandre Blais, Sherbrooke (CA); Christian Kraglund Andersen, Zurich (CH)

(73) Assignee: SOCPRA SCIENCES ET GENIE S.E.C., Sherbrooke (CA)

( * ) Notice: Subject to any disclaimer, the term of this patent is extended or adjusted under 35 U.S.C. 154(b) by 0 days.

(21) Appl. No.: 15/988,693

(22) Filed: May 24, 2018

(65) Prior Publication Data

US 2018/0341874 A1 Nov. 29, 2018

(30) Foreign Application Priority Data

May 29, 2017 (CA) ..................................... 2968830

(51) Int. Cl.
*H03K 3/38* (2006.01)
*G06N 99/00* (2019.01)
(Continued)

(52) U.S. Cl.
CPC ........... *G06N 99/002* (2013.01); *H03B 17/00* (2013.01); *H03F 19/00* (2013.01); *H03B 2200/0044* (2013.01); *H03F 2200/336* (2013.01)

(58) Field of Classification Search
None
See application file for complete search history.

(56) References Cited

U.S. PATENT DOCUMENTS 9,818,064 B1 * 11/2017 Abdo ................. G01R 29/0814
2013/0127553 A1 * 5/2013 Morgner .................. G02F 1/39
331/94.1

(Continued)

OTHER PUBLICATIONS

Science Advances, Research article, Quantum Mechanics, A quantum annealing architecture with all-to-all connectivity from local interactions, Wolfgang Lechner, Philipp Hauke, Peter Zoller, retrieved from Internet May 24, 2017.

(Continued)

*Primary Examiner* — Lincoln Donovan
*Assistant Examiner* — Khareem E Almo
(74) *Attorney, Agent, or Firm* — Noron Rose Fulbright Canada LLP; Alexandre Daoust

(57) ABSTRACT

A method of quantum processing using a quantum processor comprising a plurality of Kerr non-linear oscillators (KNOs), each operably drivable by both i) a controllable single-boson drive and ii) a controllable two-boson drive, the method comprising simultaneously controlling a drive frequency and a drive amplitude of the controllable single-boson drives to define a problem and controlling a drive frequency and a drive amplitude of the two-photon drives to define the Hilbert space, including increasing the amplitude of the two-boson drive and reaching both amplitude conditions a) 4 times the amplitude of the two-boson drives being greater than the loss rate, and b) the amplitude of the two-boson drives being greater than the amplitude of the single-boson drive, and maintaining both amplitude conditions a) and b) until a solution to the problem is reached; and reading the solution.

17 Claims, 23 Drawing Sheets

(51) Int. Cl.
　　　*H03B 17/00*　　　(2006.01)
　　　*H03F 19/00*　　　(2006.01)

(56) References Cited

U.S. PATENT DOCUMENTS

| | | | |
|---|---|---|---|
| 2017/0091647 A1* | 3/2017 | Abdo | G01V 8/005 |
| 2017/0104493 A1* | 4/2017 | Goto | H03L 7/26 |
| 2018/0017978 A1* | 1/2018 | Goto | G05D 19/02 |
| 2018/0247217 A1* | 8/2018 | Heeres | G06N 99/002 |

OTHER PUBLICATIONS

Nature international journal of science, Scientific Reports, Bifurcation-based adiabatic quantum computation with a nonlinear oscillator network, Hayato Goto, published : Feb. 22, 2016.

Cornell University Library, arXiv.org, Quantum Physics, arXiv:1609.07117, Quantum annealing with a network of all-to-all connected, two-photon driven Kerr nonlinear oscillators, Shruti Puri, Christian Kraglund Andersen, Arne L. Grimsmo, Alexandre Blais, submitted on Sep. 22, 2016.

Cornell University Library, arXiv.org, Quantum Physics, arXiv:1605.03250, Universal quantum computation with a nonlinear oscillator network, Hayato Goto, submitted on May 11, 2016.

\* cited by examiner

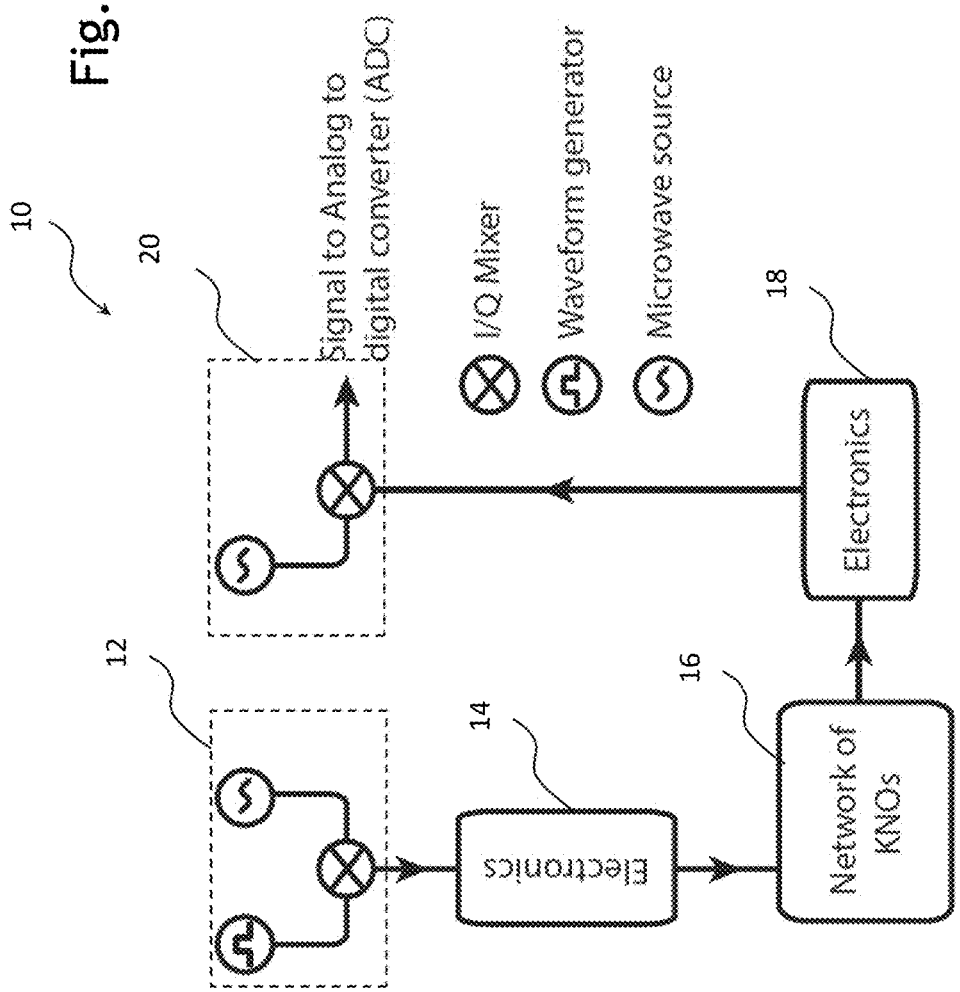

QUANTUM PROCESSOR, AND METHOD OF QUANTUM PROCESSING

BACKGROUND

It was known to perform quantum processing using resonators instead of qubits. Indeed, photonic cat states (quantum superposition of macroscopically distinct states) stored in high Q factor resonators show great promise for hardware efficient universal quantum computing. Although known approaches were satisfactory to a certain extent, there remained room for improvement. In particular, there was a need to provide additional resilience to noise of a nature which could affect quantum effects, and there was a need to provide scalability.

SUMMARY

Cat states can be prepared in a Kerr-nonlinear oscillator by the use of a two-boson drive. This preparation can be robust against single-boson loss. A two-boson drive can eliminate undesirable phase evolution induced by a Kerr nonlinearity. The concept of transitionless quantum driving can be exploited to provide non-adiabatic initialization of cat states.

In accordance with one aspect, there is provided a method of quantum processing using a quantum processor comprising a plurality of Kerr non-linear oscillators (KNOs), each operably drivable by both i) a controllable single-boson drive and ii) a controllable two-boson drive, the method comprising simultaneously controlling a drive frequency and a drive amplitude of the controllable single-boson drives to define a problem and a drive frequency and a drive amplitude of the two-photon drives to define the Hilbert space, in accordance with a protocol, said protocol including increasing the amplitude of the two-boson drive and reaching both amplitude conditions a) 4 times the amplitude of the two-boson drives being greater than the loss rate, and b) the amplitude of the two-boson drives being greater than the amplitude of the single-boson drive, and maintaining both amplitude conditions a) and b) until a solution to the problem is reached; and, reading the solution.

The solution can be read in a manner formerly known in the art, such as using homodyne detection. In an alternate embodiment, heterodyne detection can be used to read the solution, for instance.

As will be understood by persons having ordinary skill in the art, the specific moment in the protocol after which the amplitude conditions are to be maintained will vary from one problem to another. Generally, it can be preferred to exceed the amplitude conditions as much as possible within practical constraints. In practical terms, it can be preferred to exceed the amplitude condition a) by at least 4 times, preferably at least 10 times, more preferably at least 100 times, and to exceed amplitude condition b) by at least two times, preferably at least 4 times.

On another aspect, quantum annealing aims at solving combinatorial optimization problems mapped to Ising interactions between quantum spins. A quantum annealer can be provided with a scalable network of two-boson driven KNOs where each resonator encodes an Ising spin in a subspace formed by two coherent states of opposite phases. A fully-connected optimization problem can be mapped to local fields driving the oscillators, the oscillators themselves being connected with only local four-body interactions.

To perform quantum annealing, the KNOs can be arranged in a triangular lattice structure wherein the KNOs are arranged in a plurality of rows including a first row having a single KNO and subsequent rows each having a number of KNOs corresponding to the number of KNOs of the previous row plus one, and in which the KNOs are arranged in groups of nearest neighbor KNOs in which the KNOs of each group are locally interconnected to one another for boson exchange within the corresponding group via a corresponding connector, and wherein the KNOs of each group have individual frequencies a, b, c, d, different from one another while respecting a+b=c+d throughout the triangular lattice structure.

More specifically, the triangular lattice structure can be terminated by a plurality of fixed phase sources forming a termination row. Accordingly, the triangular lattice structure can have each connector connecting two adjacent KNOs of the same row, a KNO of a previous row, and a KNO of the next row or a fixed phase source if the next row is the termination row. The groups of nearest neighbors can thus be more specifically either formed of four KNOs, or of three KNOs and a corresponding one of said fixed phase sources. In the groups of nearest neighbors formed of three KNOs and a corresponding one of said fixed phase sources, the individual frequencies a, b, c, d, of the KNOs and of the fixed source are also different from one another while respecting a+b=c+d.

Typically, in the context of a quantum annealer in which the bosons are microwaves (non-optical photons), the frequency difference between KNOs of a same group can be above 100 MHz, preferably above 500 MHz. The frequency difference can vary depending on the application (e.g. optical photons, microwave photons or phonons). The fixed phase sources can be fixed resonators always on an 'on' state, which are not used to define the problem, but which can contribute to the boson exchange and the a+b=c+d condition. It will be understood that the expression "triangular" in "triangular lattice structure" refers to the connectivity structure, independently of the actual link sizes of a given embodiment. It will be understood that in a given embodiment, the actual link sizes could deform the actual structure in a manner that it resembles a different shape than a triangle (e.g. a circle). It will also be understood that connecting can be achieved by positive or negative coupling.

To perform quantum annealing with the triangular lattice structure, the method can further comprise: performing boson exchange within groups of nearest neighbors at corresponding coupling strengths and coupling constants, the KNOs of each group of nearest neighbors having a corresponding strength of Kerr-nonlinearity, wherein said protocol further includes controlling the drives in a manner that, for at least a portion of the protocol leading to the reaching of the solution i) each coupling strength is maintained greater than the amplitude of the corresponding single-boson drives and ii) each coupling constant is maintained smaller than the corresponding strengths of Kerr-nonlinearity.

In other words, the coupling can be in the form $C_{\langle i,j,k,l \rangle}(\hat{a}_i^\dagger \hat{a}_j^\dagger \hat{a}_k \hat{a}_l + h.c.)$, where $\hat{a}_i^\dagger, \hat{a}_j^\dagger, \hat{a}_k^\dagger, \hat{a}_l^\dagger$ and $\hat{a}_i, \hat{a}_j, \hat{a}_k, \hat{a}_l$ are the boson annihilation and creation operators for the groups of nearest neighbors. Moreover, if we state that $C_{\langle i,j,k,l \rangle}$ is the coupling constant for the connector/group of nearest neighbors i, j, k, l, $\varepsilon_i$ is the amplitude of two-boson drive, $K_i$ is the strength of Kerr non-linearity and $J_i$ is the amplitude of the single-boson drive for the KNO or fixed phase source i, the coupling constant $C_{\langle i,j,k,l \rangle}$ and the drives can be controlled so that $C_{\langle i,j,k,l \rangle} \varepsilon_i^{3/2}/K_i^{3/2} > J_i$ (each coupling strength is maintained greater than the amplitude of the corresponding single-boson drives) and $C_{\langle i,j,k,l \rangle} \ll K_i$ (each coupling constant is maintained smaller than the corresponding strengths of Kerr-nonlinearity) as nearing the solution to the problem, as will be presented in further detail below. It will be understood that the value of $C_{\langle i,j,k,l \rangle}$ can vary from one connector/group of nearest neighbors to another, and that the values of $\varepsilon_i$, $K_i$, and $J_i$ can vary from one KNO or fixed phase source to another. It will be understood that in a given protocol for a given problem, the amplitude conditions can be met before the coupling conditions, or the coupling conditions can be met before the amplitude conditions, for instance. The coupling conditions may be met from the beginning of the protocol, or only met after a certain point during the protocol, for instance.

In accordance with another aspect, there is provided a quantum annealer comprising a plurality of Kerr non-linear oscillators (KNOs), each operably drivable by both i) a controllable single-boson drive and ii) a controllable two-boson drive, the KNOs being arranged in a triangular lattice structure wherein the KNOs are arranged in a plurality of rows including a first row having a single KNO and subsequent rows each having a number of KNOs corresponding to the number of KNOs of the previous row plus one; and a plurality of connectors, each connector connecting the KNOs in a manner to allow boson exchange between KNOs within groups of nearest neighbors.

In the triangular lattice structure, KNOs can be arranged in groups of nearest neighbor KNOs in which the KNOs of each group are locally interconnected to one another for boson exchange within the corresponding group via a corresponding connector. In each group of nearest neighbors, the KNOs can have individual frequencies a, b, c, d, different from one another while respecting a+b=c+d throughout the triangular lattice structure.

The triangular lattice structure can be terminated by a plurality of fixed phase sources forming a termination row, the groups of nearest neighbors thus being either formed of four KNOs, or of three KNOs and a corresponding one of said fixed phase sources. In the groups of nearest neighbors formed of three KNOs and a corresponding one of said fixed phase sources, the individual frequencies a, b, c, d, of the KNOs and of the fixed source are also different from one another while respecting a+b=c+d. The fixed phase sources can be oscillators, such as KNOs or resonators for instance, driven in a manner to be maintained at a fixed phase. Alternately, the fixed phase sources can be coherent drives, for instance.

The connectors can be adapted to allow the mode of operation presented above.

As well known in the art, Kerr non-linear oscillators are understood to provide an n(n−1) type response, where n is the number of bosons in the oscillator.

One possible embodiment for KNOs is Kerr non-linear resonators (KNRs) in which the bosons used are more specifically photons. Indeed, KNRs, which are characterized by photon-to-photon interaction, display very rich physics and are consequently the focus of much theoretical and experimental work. These nonlinear oscillators exhibit bifurcation, can be used to generate squeezed radiation and for quantum limited amplification. Moreover, a KNR initialized in a coherent state evolves to a quantum superposition of out-of-phase coherent states, also known as a cat state. In practice, Kerr nonlinearities K in atomic systems are, however, often small in comparison to photon loss rate κ, making the observation of these non-classical states of light difficult. As an alternative approach, strong photon-photon interaction can readily be realized in superconducting quantum circuits, with K\κ~30 demonstrated experimentally. This has led to the observation of cat states in the transient dynamics of a KNR realized by coupling a superconducting qubit to a microwave resonator. These photonic cat states play an important role in understanding the role of decoherence in macroscopic systems, in precision measurements and are useful for quantum computation. However, they are sensitive to undesirable interactions and photon loss.

To address this issue, one approach, known as the qcMAP gate, relies on the strong dispersive qubit-field interaction that is possible in circuit quantum electrodynamics (circuit QED) to transfer an arbitrary state of a superconducting qubit into a multi-legged cat state. This method is, however, susceptible to single-photon loss that decoheres the cat. This loss also reduces the amplitude of the cat, something that must be compensated for by re-pumping in order to avoid significant overlap between the coherent state. A second approach exploits engineered two-photon dissipation realized by coupling a superconducting qubit to two microwave cavities. In the absence of single-photon loss, the steady-state of the field is a cat state whose parity depends on the initial number state of the field. To preserve coherence of the cat, an important experimental challenge is that the rate of single-photon loss must be much smaller than the rate of two-photon loss.

A simple alternative approach to encode and stabilize cat states based on two-photon driving of a KNR, presented in greater detail below, takes advantage of the fact that the coherent states $|\pm\alpha\rangle$ and, consequently the cat states $|\mathcal{C}_\alpha^\pm\rangle = \mathcal{N}_\alpha^\pm(|\alpha\rangle \pm |-\alpha\rangle)$ with $\mathcal{N}_\alpha^\pm = 1/\sqrt{2(1 \pm e^{-2|\alpha|^2})}$, are degenerate eigenstates of the KNR under two-photon driving. Remarkably, this property holds true even in the presence of single-photon loss making this protocol particularly robust and obviating the need for energy re-pumping. Moreover, in contrast to the above-mentioned scheme, cat state preparation with this approach does not require dissipation but rather relies on adiabatically turning on the two-photon drive, the number state $|0/1\rangle$ evolving into $|\mathcal{C}_{\alpha(t)}^{+/-}\rangle$. We find that the fidelity of this preparation approaches unity when the Kerr nonlinearity K is large with respect to the photon loss rate κ, something that is easily realized in current circuit QED experiments. By exploiting the concept of transitionless quantum driving, we show that rapid, non-adiabatic cat state preparation is possible by controlling the amplitude and phase of the two-photon drive.

While large Kerr nonlinearities can be used to produce cat states, it can also lead to undesired deformations of these states. This deformation is problematic for qubit-based schemes because of the spurious Kerr nonlinearity inherited by the field from the qubit. This can affect, for example, the qcMAP protocol where the qubit-induced Kerr nonlinearity can lead to undesirable phase evolution and distortion of the cat state. Although this deterministic phase evolution can be corrected with qubit-induced-gates, this can involve exposing the field to the decoherence channel of the qubit. Moreover, in the presence of photons loss, this phase evolution leads to non-deterministic phase errors. As presented below, the addition of a two-photon drive of appropriate amplitude and phase during the qcMAP can cancel this distortion and the corresponding dephasing.

Taking into consideration the context of the engineered subspace of a two-photon driven KNR, we consider a universal set of gates for an encoding where the coherent states {|+α⟩, |−α⟩} In mapped to the logical states {|0⟩, |1⟩}. This mapping is possible because of the quasi-orthogonality of coherent states for large α. Accordingly, high-fidelity operations can be realized with realistic parameters. For instance, superconducting Josephson parametric amplifiers allow the implementation of a two-photon drive along with a Kerr nonlinearity in a relatively simple setup attractive for building a large scale quantum computing architecture.

Many hard combinatorial optimization problems arising in diverse areas such as physics, chemistry, biology, and social science can be mapped onto finding the ground state of an Ising Hamiltonian. This problem, referred to as the Ising problem, is in general NP-hard. Quantum annealing, based on adiabatic quantum computing (AQC), aims to find solutions to the Ising problem, with the hope of a significant speedup over classical algorithms. In AQC, a system is evolved slowly from the non-degenerate ground state of a trivial initial Hamiltonian, to that of a final Hamiltonian encoding a computational problem. During the time-evolution, the energy spectrum of the system changes and, for the adiabatic condition to be satisfied, the evolution must be slow compared to the inverse minimum energy gap between the instantaneous ground state and the excited states. The scaling behaviour of the gap with problem size, thus, determines the efficiency of the adiabatic annealing algorithm.

In order to perform quantum annealing, the Ising spins can be mapped to two levels of a quantum system, i.e. a qubit, and the optimization problem is encoded in the interactions between these qubits. Adiabatic optimization with a variety of physical realizations such as nuclear magnetic spins and superconducting qubits has been demonstrated. However, despite great efforts, whether these systems are able to solve large problems in the presence of noise remained an open question.

A general Ising problem is defined on a fully connected graph of Ising spins. However, efficient embedding of large problems with such long-range interactions is a challenge because physical systems more naturally realize local connectivity. In one approach, a fully connected graph of Ising spins is embedded in a so-called Chimera graph. Alternatively, N logical Ising spins can be encoded in M=N(N−1)/2 physical spins with M−N+1 constraints. Each physical spin represents the relative configuration of a pair of logical spins. An all-to-all connected Ising problem in the logical spins can be realized by mapping the logical couplings onto local fields acting on the physical spins and a problem-independent four-body coupling to enforce the constraints. This simple design requires only precise control of local fields, making it attractive for scaling to large problem sizes. Accordingly, a physical platform for quantum annealing can be provided that is both scalable and shows robustness to noise, in which the Ising problem is encoded in a network of two-boson driven KNOs. A single Ising spin can be mapped to two coherent states with opposite phases, which constitute a two-fold degenerate eigenspace of the two-boson-driven KNR in the rotating frame of the drive. Quantum adiabatic algorithms can be encoded by a quantum spin in quasi-orthogonal coherent states, in a system where the dominant source of error is single-boson loss from the oscillators. However, coherent states can be invariant under the action of the jump operator, and the encoded Ising spin can stabilized against bit flips. The adiabatic optimization can be carried out by initializing the resonators to vacuum, and varying only single-site drives to adiabatically evolve the system to the ground state of the embedded Ising problem. This realization can allow encoding arbitrary Ising problems in a manner which overcomes connectivity restrictions, or restrictions on the signs and amplitudes of the spin-spin couplings.

Earlier studies have focused on idealized quantum systems without noise analysis and did not consider practical implementations of these ideas. In contrast, an analysis presented below considers the performance of quantum annealing in the presence of single-photon loss, by far the dominant loss mechanism. The probability for the system to jump from the instantaneous ground state to one of its excited states due to boson loss during the adiabatic protocol can be greatly suppressed. This resilience to the detrimental effects of photon loss can lead to high success probabilities in finding the optimal solution to optimization problems mapped on two-photon driven KNRs.

It will be understood that the expression 'computer' as used herein is not to be interpreted in a limiting manner. It is rather used in a broad sense to generally refer to the combination of some form of one or more processing units and some form of memory system accessible by the processing unit(s). Similarly, the expression 'controller' as used herein is not to be interpreted in a limiting manner but rather in a general sense of a device, or of a system having more than one device, performing the function(s) of controlling one or more device such as an electronic device or an actuator for instance.

It will be understood that the various functions of a computer or of a controller can be performed by hardware or by a combination of both hardware and software. For example, hardware can include logic gates included as part of a silicon chip of the processor. Software can be in the form of data such as computer-readable instructions stored in the memory system. With respect to a computer, a controller, a processing unit, or a processor chip, the expression "configured to" relates to the presence of hardware or a combination of hardware and software which is operable to perform the associated functions.

Many further features and combinations thereof concerning the present improvements will appear to those skilled in the art following a reading of the instant disclosure.

DESCRIPTION OF THE FIGURES

In the figures,

FIG. 24 is a schematic diagram of a quantum processor.

DETAILED DESCRIPTION

Figure 1:
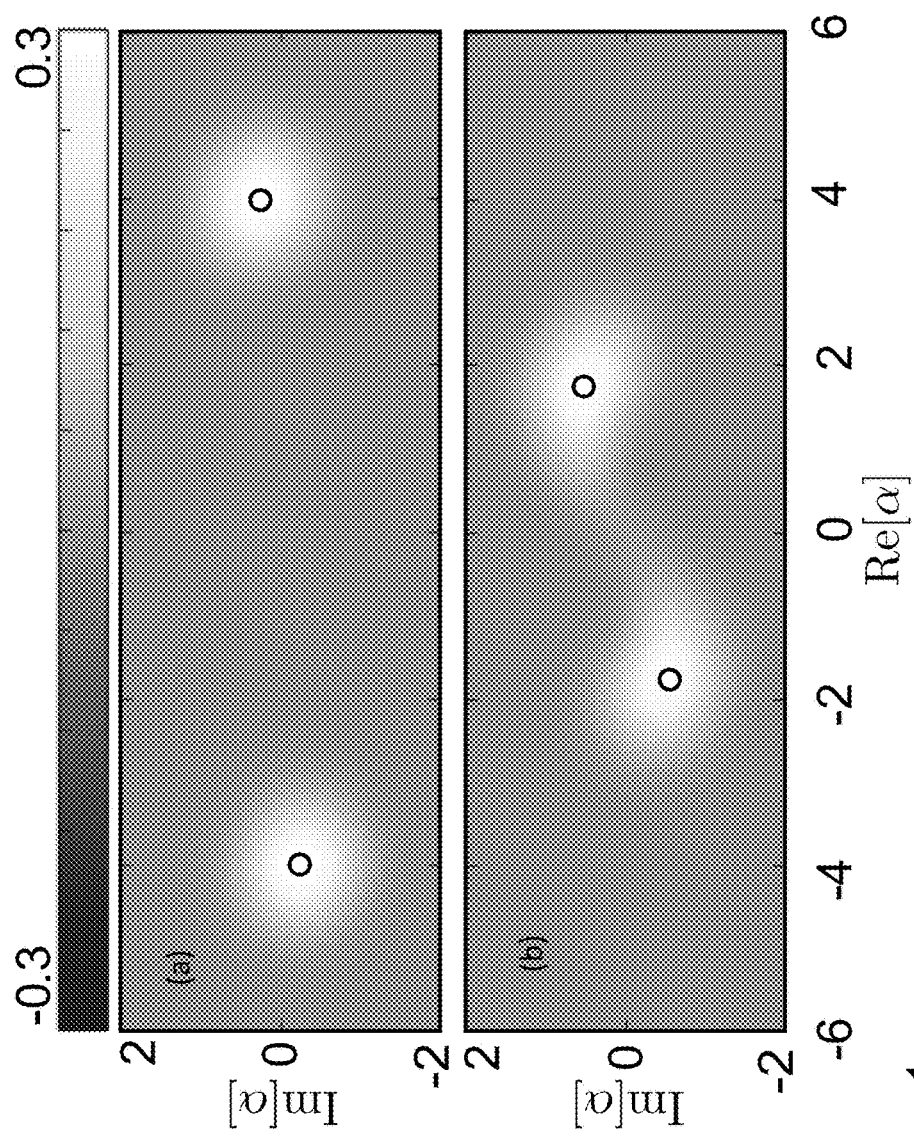
FIG. 1 represents a steady-state Wigner function of a two-photon driven KNR with $|K|/\kappa=\frac{1}{8}$ and (a) $\varepsilon_p=16K$, $K>0$ and (b) $\varepsilon_p=4K$, $K<0$, corresponding to $\kappa/8|K\alpha_0^2|\sim\frac{1}{16}$ and $\sim\frac{1}{4}$ respectively. The black circles indicate the expected position of the coherent states.

Demonstration Concerning Conditions to Control Losses
The Two-Photon Driven KNR Hamiltonian in a Frame Rotating at the Resonator Frequency $$\hat{H}_0 = -K\hat{a}^\dagger\hat{a}^\dagger\hat{a}\hat{a} + (\varepsilon_p \hat{a}^{\dagger 2} + \varepsilon_p^* \hat{a}^2). \quad (1)$$

In the above expression, K is the amplitude of the Kerr nonlinearity and $\varepsilon_p$ the amplitude of the two-photon drive. The above Hamiltonian is known as the Cassinian oscillator Hamiltonian, and can be embodied, for example, by a SQUID-terminated $\lambda/4$ microwave resonator with flux pumping at twice the resonator frequency, a device known as Josephson parametric amplifier (JPA). This Hamiltonian can be re-written as $$\hat{H}_0 = -K\left(\hat{a}^{\dagger 2} - \frac{\varepsilon_p^*}{K}\right)\left(\hat{a}^2 - \frac{\varepsilon_p}{K}\right) + \frac{|\varepsilon_p|^2}{K}. \quad (2)$$

This form of the Hamiltonian illustrates that the two coherent states $|\pm\alpha\rangle$ with $\alpha = (\varepsilon_p/K)^{1/2}$, which are the eigenstates of the annihilation operator $\hat{a}$, are also degenerate eigenstates of Eq.(1) with energy $|\varepsilon_p|^2/K$. Equivalently, the even-odd parity states $|\mathcal{C}_\alpha^\pm\rangle$ are also the eigenstates of $\hat{H}_0$. This argument can be generalized to Hamiltonians of the form $-K\hat{a}^{\dagger n}\hat{a}^n + (\varepsilon_p \hat{a}^{\dagger n} + \varepsilon_p^* \hat{a}^n)$ that have a set of n coherent states as degenerate eigenstates (see below).

In the presence of single-photon loss, the resonator state evolves according to the master equation $\dot{\hat{\rho}} = -i(\hat{H}_{e\!f\!f}\hat{\rho} - \hat{\rho}\hat{H}_{e\!f\!f}^\dagger) + \kappa\hat{a}\hat{\rho}\hat{a}^\dagger$, with the non-Hermitian effective Hamiltonian $\hat{H}_{e\!f\!f} = \hat{H}_0 - i\kappa\hat{a}^\dagger\hat{a}/2$. While the steady-state of this master equation can be obtained analytically, it is simple to show (see below) that for $\kappa/8|K\alpha_0|^2 \ll 1$ the coherent states $|\pm\alpha_0\rangle = |\pm r_0 e^{i\theta_0}\rangle$ are degenerate eigenstates of $\hat{H}_{e\!f\!f}$ with $$r_0 = \left(\frac{4\varepsilon_p^2 - \kappa^2/4}{4K^2}\right)^{1/4}, \tan 2\theta_0 = \frac{\kappa}{\sqrt{16\varepsilon_p^2 - \kappa^2}}. \quad (3)$$

This reduces to the eigenstates of $\hat{H}_0$ in the absence of photon loss. The angle $\theta_0$ is determined by $\varepsilon_p$, with $\theta_0 < 0$ ($\theta_0 > 0$) for $\varepsilon_p > 0$ ($\varepsilon_p < 0$). The last term of the master equation, $\kappa\hat{a}\hat{\rho}\hat{a}^\dagger$, induces nondeterministic quantum jumps between the even and the odd parity cat states, $|\mathcal{C}_{\alpha_0}^+\rangle$ and $|\mathcal{C}_{\alpha_0}^-\rangle$, leading to decoherence, but not to leakage out of the degenerate subspace $\{|\mathcal{C}_{\alpha_0}^\pm\rangle\}$. In steady-state, the density matrix therefore takes the form $\hat{\rho}_s = (|\alpha_0\rangle\langle\alpha_0| + |-\alpha_0\rangle\langle-\alpha_0|)/2_2$ (see below).

FIG. 1 shows the steady-state Wigner function of a two-photon driven KNR for $\kappa/8|K\alpha_0|^2 \sim 1/4$ and $\sim 1/16$ obtained by numerical integration of the master equation. Even for the relatively large value of $\kappa/8|K\alpha_0|^2 \sim 1/16$ (shown in panel a), the steady-state approaches the ideal case $\hat{\rho}_s$ with a fidelity of 99.91%. As expected and evident from FIG. 1(b), the coherent states are deformed at the larger value of $\kappa/8|K\alpha_0|^2 \sim 1/4$ and the fidelity with respect to the ideal steady state is reduced to 96.55%. These numerical results confirm that, even in the presence of single-photon loss, it is possible to confine the state of the resonator to the manifold of coherent states $|\pm\alpha_0\rangle$. Although the photon loss channel remains the dominant source of error, the resonator can also have small amount of dephasing noise, which can cause jumps between $|\alpha_0\rangle$ and $|-\alpha_0\rangle$. With this bit-flip rate decreasing exponentially with $\alpha_0$ (see also Supplementary Information below), this channel is neglected here.

Adiabatic Initialization of Cat States:
Going beyond steady-states, we now describe a protocol to deterministically prepare cat states. The vacuum $|n=0\rangle$ and the single-photon Fock state $|n=1\rangle$ are the two-degenerate eigenstates of the undriven KNR. Under the application of a time-dependent two-photon drive $\varepsilon_p(t)$, the instantaneous eigenstates of the system are the degenerate states $|\pm\alpha_0(t)\rangle$ (or equivalently $|\mathcal{C}_{\alpha_0(t)}^\pm\rangle$), where $\alpha_0(t)$ is given by Eq.(3). Since the two-photon drive preserves parity, under adiabatic increase of $\varepsilon_p(t)$, the vacuum state $|0\rangle$ evolves to the even parity cat state $|\mathcal{C}_{\alpha_0(t)}^+\rangle$ while the single-photon Fock state evolves to the odd parity cat state $|\mathcal{C}_{\alpha_0(t)}^-\rangle$ see Supplementary Information below for the evolution of the energy spectrum). To demonstrate this deterministic preparation, we take as an example $\varepsilon_p(t) = \varepsilon_p^0[1 - \exp(-t^4/\tau^4)]$ such that for $t \gg \tau$, $\varepsilon_p(t) \sim \varepsilon_p^0 = 4K$ with $\tau K = 5$ to satisfy the adiabatic condition. Without photon loss, the fidelity of the resulting cat state at $t = 6.5/K$ is 99.9% while for $K/\kappa = 250$ the fidelity at $t = 6.5/K$ is reduced to 98.3%.

High-Fidelity Nonadiabatic Initialization:
To speed up the adiabatic preparation described above, we follow the approach of transitionless driving. This technique relies on introducing an auxiliary counter-adiabatic Hamiltonian, $\hat{H}'(t) = i[|\dot{\psi}_n(t)\rangle\langle\psi_n(t)| - |\psi_n(t)\rangle\langle\dot{\psi}_n(t)|]$, chosen such that the system follows the instantaneous eigenstate $|\psi_n(t)\rangle$ of the system Hamiltonian $\hat{H}_0(t)$ even under non-adiabatic changes of the system parameters. This idea has been experimentally demonstrated with Bose-Einstein condensates in optical lattices and nitrogen vacancy centres in diamonds. Here, to prepare the even parity cat-state $|\mathcal{C}_{\alpha_0(t)}^+(t)\rangle$, the required counter-adiabatic Hamiltonian is $$\hat{H}'(t) = i\frac{\dot{\alpha}_0(t)}{\mathcal{N}_{\alpha_0(t)}^-}[\hat{a}^\dagger |C_{\alpha_0(t)}^-\rangle\langle C_{\alpha_0(t)}^+| - |C_{\alpha_0(t)}^+\rangle\langle C_{\alpha_0(t)}^-|\hat{a}]. \quad (4)$$

Figure 2:
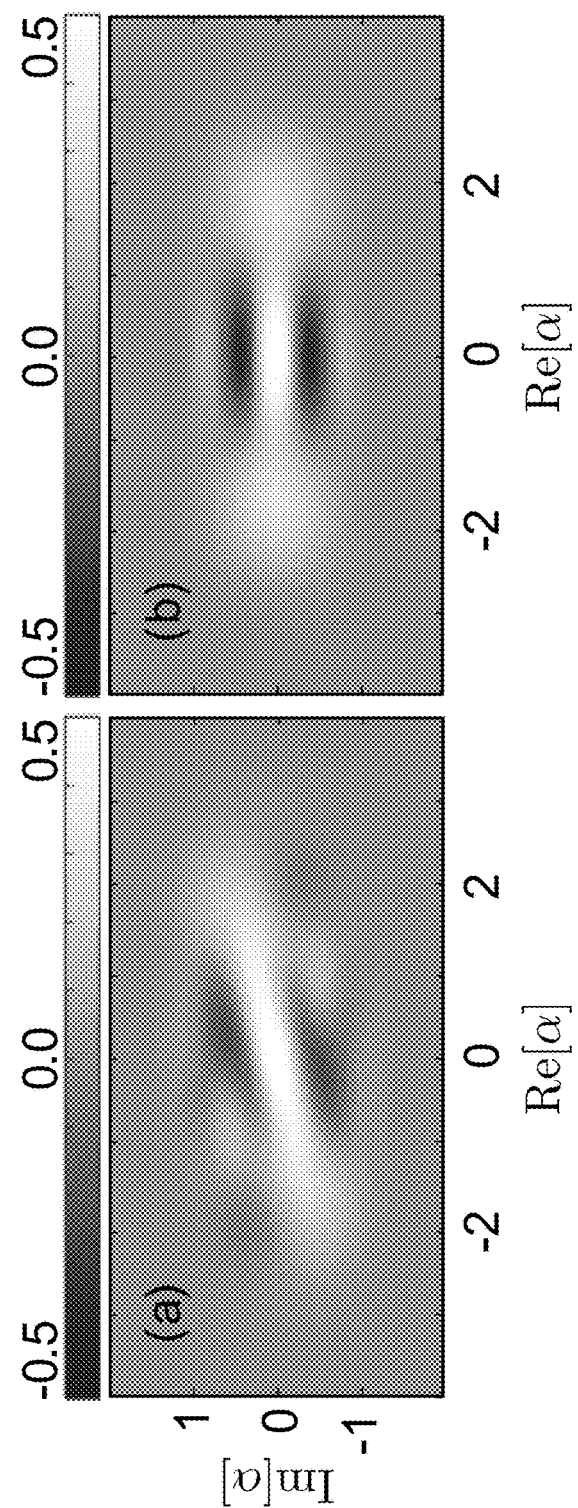
FIG. 2 represents a Wigner function for a KNR initialized in vacuum $|0\rangle$ and driven by (a) a single parametric drive $\varepsilon_p=\varepsilon_p^0[1-\exp(-t^4/\tau^4)]$ (b) with two orthogonal parametric drives, $\varepsilon_p=\varepsilon_p^0[1-\exp(-t^4/\tau^4)]$ and $\varepsilon_p'(t)=i\dot\alpha_0(t)N_{\alpha_0}^-(t)/(1+2\alpha_0(t))$, where $\alpha_0(t)=\sqrt{\varepsilon_p(t)/K}$. The Wigner function is plotted at time $t=1.37\tau$, with $\tau=1/K$, $\varepsilon_p^0=4K$. Without the auxiliary drive $\varepsilon_p'$ the non-adiabatic driving of the system results in an imperfect cat state. However, the auxiliary drive induces counter-adiabatic terms, resulting in near perfect initialization of the cat state.

While exact, this does not correspond to an easily realizable Hamiltonian. It can, however, be approximated to (see Methods, below), $$\hat{H}'(t) \sim i\frac{\dot{\alpha}_0(t)}{\mathcal{N}_{\alpha_0(t)}^-[1+2\alpha_0(t)]}(\hat{a}^{\dagger 2} - \hat{a}^2), \quad (5)$$

which can be implemented with an additional two-photon drive orthogonal to $\varepsilon_p(t)$. As an illustration of this method, we reconsider the example presented in the previous section now with the much shorter evolution time t=1/K. As shown by the Wigner function in FIG. 2(a), without the additional two-photon drive of Eq.(5), the state at time t=1.37/K is highly distorted. On the other hand, and as illustrated in FIG. 2(b), initialization with the appropriate auxiliary orthogonal two-photon drive leads to cat-state fidelities of 99.9% with $\kappa$=0 and 99.5% with $\kappa$=K/250. In other words, the protocol is made ~5 times faster by the addition of the orthogonal drive, thereby improving the fidelity in the presence of single-photon loss. These results, obtained with the analytical expression of Eq.(5), can be further improved upon using numerical optimal control. For example, we find that cat states can be initialized in times as short as 0.3/K with fidelity 99.995% (see Supplementary Information below). Adiabatic cat state preparation with two-photon driving was also investigated in a noiseless idealized KNR. However, eigenspace distortion can arise, as will be discussed below, during gate operations and higher-order nonlinearities can exist in realistic physical implementations.

Realization with Superconducting Circuits:

One standard approach to realize a two-photon driven Kerr-nonlinear resonator is to terminate a $\lambda$/4 microwave resonator with a flux-pumped SQUID, a device known as a Josephson parametric amplifier (see also Supplementary Information below). The non-linear inductance of the SQUID induces a Kerr nonlinearity and a two-photon drive is introduced by the modulation of the flux-pump at twice the resonator frequency. As an illustrative example, with a realistic JPA Kerr-nonlinearity of K/2$\pi$=750 KHz it is possible to encode a cat state with $\alpha_0$=2 in a time 0.3/K=63.6 ns using the transitionless driving approach with numerically optimized pulse shape. We have, moreover, simulated the cat state initialization protocol under the exact Hamiltonian of a JPA including the full Josephson junction cosine potential. As discussed in the Supplementary Information below, the results are essentially unchanged showing that the strong state confinement to the coherent states $|\pm\alpha_0\rangle$ is also robust against higher-order nonlinearities that will arise in a circuit implementation of these ideas. An alternative realization of the two-photon driven KNR is based on a 3D microwave cavity coupled to a Josephson junction. The non-linear inductance of the junction induces a Kerr non-linearity, while a microwave drive on the junction at the 3D cavity frequency introduces the required two-photon drive.

We note that an engineered dissipation approach can also rely on a two-photon drive to achieve confinement to the subspace of two coherent states with opposite phases, however, the rate is required to be made large with respect to the single-photon loss rate $\kappa$ for high fidelity initialization of cat states, which can be challenging experimentally. In contrast, the approach presented herein does not rely on dissipation but rather takes advantage of the large Kerr-nonlinearity K that can be realized in superconducting quantum circuits. Even in the presence of two-photon loss, robust confinement is obtained if K>$\kappa_{2ph}$, a condition that can be easily satisfied in practice.

Figure 3:
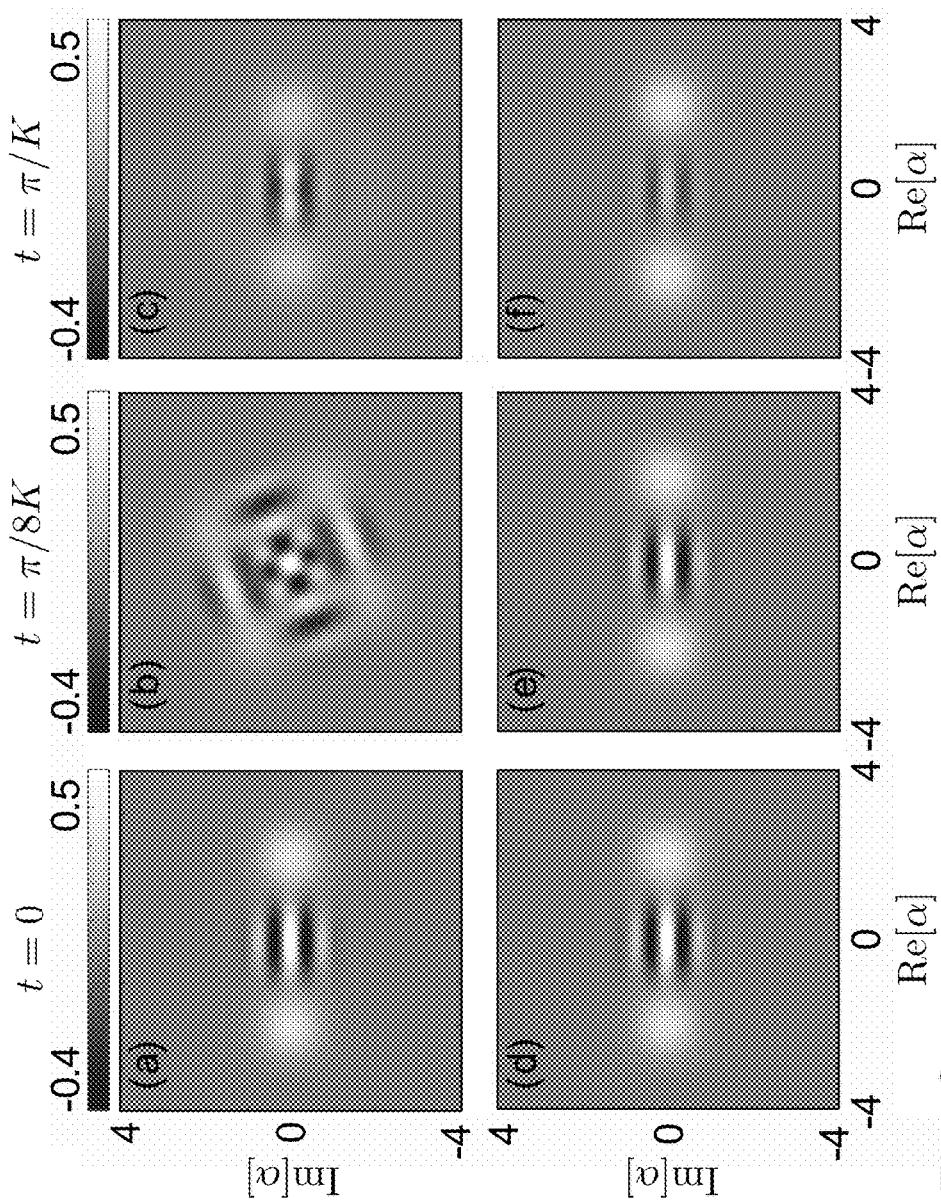
FIG. 3 represents Wigner functions at different times for a lossy KNR initialized to $|\mathcal{C}_2^+\rangle$ without (a-c) and with (d-f) two-photon driving. $K/\kappa=20$ and $\varepsilon_p\sim4K$.

Stabilization of Cat States Against Kerr Induced Rotation and Dephasing:

Even with high-fidelity cat state preparation, it is important to limit the unwanted phase evolution and dephasing arising from Kerr nonlinearity and single-photon loss. We now illustrate, with two examples, how a two-photon drive of appropriate amplitude and phase can correct this unwanted evolution. First consider a resonator deterministically initialized to $|\langle_\alpha^+\rangle$. FIG. 3(a-c) illustrates the evolution of this initial state in the absence of two-photon drive. Kerr nonlinearity leads to deterministic deformation of the state which, in the presence of single-photon loss, also induces additional dephasing. This results in a reduction of the contrast of the Wigner function fringes, a reduction of the separation of the cat components and a broadening of these components. As a result, the fidelity of $|\mathcal{C}_\alpha^\pm\rangle$ decreases faster in a KNR than in a linear resonator (see Supplementary Information below). While the deterministic phase rotation can be accounted for and corrected in a simple way, this is not the case for Kerr-induced dephasing. FIG. 3(d-f) illustrates the same initial cat state now stabilized against Kerr-induced rotation and dephasing by the application of a two-photon drive. This drive is chosen such that its amplitude $\varepsilon_p$ satisfies Eq.(3). The confinement in phase space provided by the two-photon driven KNR prevents amplitude damping of the stabilized coherent states $|\pm\alpha_0\rangle$. As a result, the cat state fidelity in this system decreases more slowly in time that in a linear resonator. As a simple extension, we also find that it is possible to stabilize coherent states against Kerr-induced rotation and dephasing (see Supplementary Information below). These somewhat counterintuitive results show that, even in the presence of loss, a Gaussian drive (i.e. two-photon drive) can completely remove the highly non-Gaussian effect of a Kerr nonlinearity.

Figure 4:
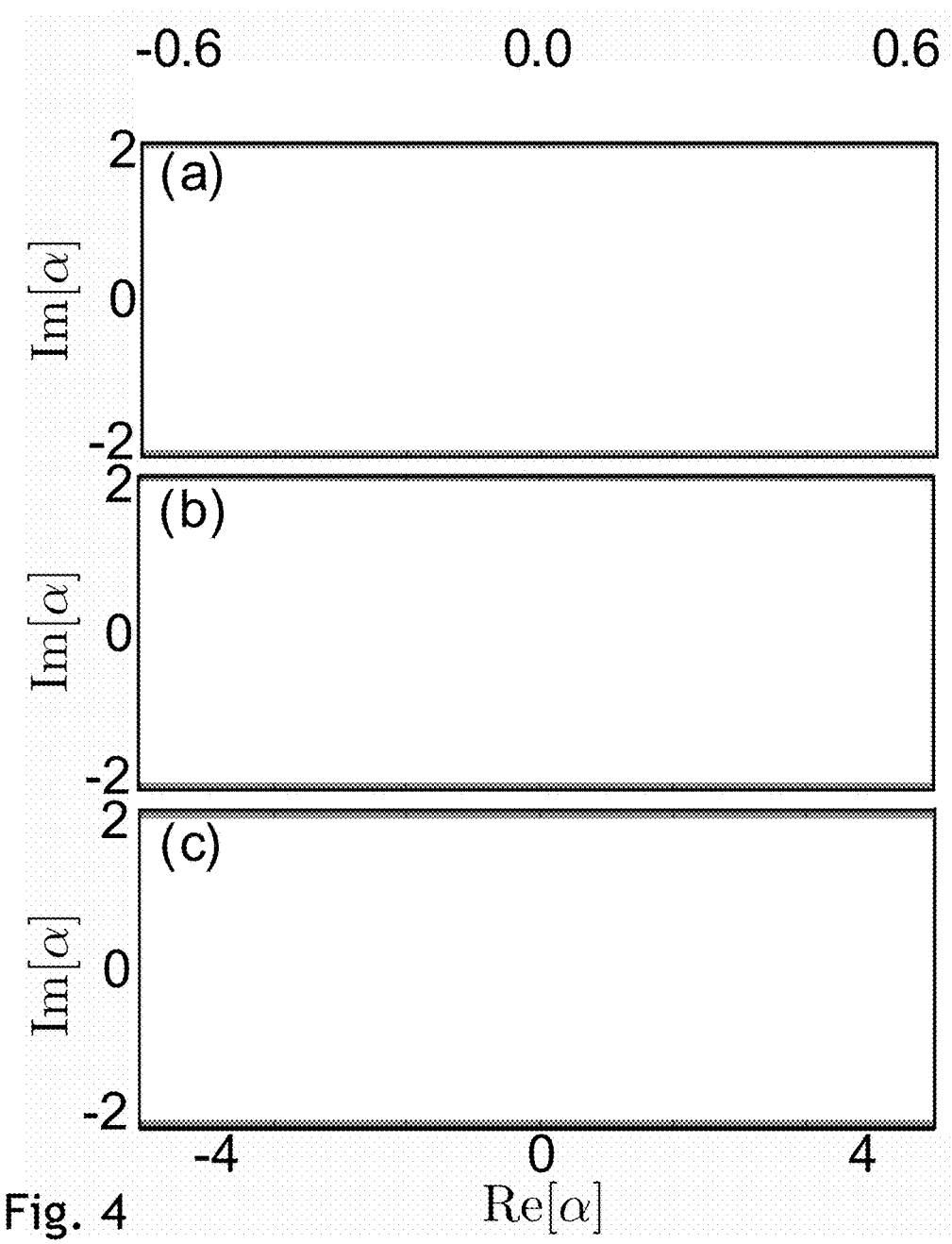
FIG. 4 represents a Wigner function of final state under qcMAP gate with (a) ideal dispersive Hamiltonian, (b) full Jaynes-Cummings Hamiltonian and (c) full Jaynes-Cummings Hamiltonian and two-photon drive.

As a second example, a qcMAP gate is considered for cat state preparation, a protocol that relies on the strong dispersive qubit-resonator interaction that is realized in circuit QED. In practice, this strong interaction is accompanied by a qubit-induced Kerr nonlinearity of the field. As a result, even at modest $\alpha$, cat states suffer from deformations. This effect is illustrated in FIG. 4(a,b) which shows the cat state obtained from qcMAP under ideal dispersive interaction (ignoring any Kerr nonlinearities) and under the full Jaynes-Cummings Hamiltonian, respectively. Distortions are apparent in panel b) and the fidelity to the ideal cat is reduced to 94.1%. In contrast, FIG. 4(c) shows the same Wigner function prepared using the qcMAP protocol with the full Jaynes-Cummings interaction and an additional two-photon drive. The resulting fidelity is 99.4%, approaching the fidelity of 99.8% obtained under the ideal, but not realistic, dispersive Hamiltonian. The amplitude of the two-photon drive was optimized numerically to take into account the qubit-induced Kerr nonlinearity (see Supplementary Information below).

Universal Quantum Logic Gates:

The realization of a universal set of gates in the two-photon driven KNR will now be discussed. Taking advantage of the quasi-orthogonality of coherent states for large $\alpha$, both the $\{|\mathcal{C}_{\alpha_0}^{\pm}\rangle\}$ and the $\{|\alpha_0\rangle\}$ basis can be used as logical states. Here, we choose the latter which we will now refer to as $\{|0\rangle, |1\rangle\}$. With this choice, a logical Z rotation can be realized by lifting the degeneracy between $|0\rangle$ and $|1\rangle$ using a single-photon drive in combination to $\hat{H}_0$: $\hat{H}_z = \hat{H}_0 + \varepsilon_z(\hat{a}^\dagger + \hat{a})$. For $|\varepsilon_z| \ll |4K\alpha_0^3|$ and $\varepsilon_p$ real, the only effect of this additional drive is to lift the degeneracy by $\delta_z = 4\varepsilon_z\alpha_0$ (Supplementary Information below). Indeed, in the space spanned by $\{|0\rangle, |1\rangle\}$, the single-photon drive Hamiltonian can be expressed as $\bar{I}\varepsilon_z(\hat{a}^\dagger+\hat{a})\bar{I} = \delta_z \bar{\sigma}_z/2$, where $\bar{I} = |\bar{0}\rangle\langle\bar{0}| + |\bar{1}\rangle\langle\bar{1}|$ and $\bar{\sigma}_z = |\bar{0}\rangle\langle\bar{0}| - |\bar{1}\rangle\langle\bar{1}|$. Numerical simulations of this process for a time $\tau = 1/\delta_z$, corresponding to the gate $\hat{R}_z(\pi)$, with the resonator initialized to $|\mathcal{C}_{\alpha_0}^+\rangle$ and the choices $\varepsilon_p = 4K$, $\varepsilon_z = 0.8K$ leads to a fidelity of 99.9% with $\kappa = 0$ and 99.5% for $K/\kappa = 250$.

Increasing $\varepsilon_z$, so that the condition $|\varepsilon_z| \ll |4K\alpha_0^3|$ is no longer satisfied, distorts the eigenstates and as a consequence the fidelity of the gate decreases. The dependence of the gate fidelity on the strength of the single photon drive is examined further in Supplementary Information below.

The strong state confinement resulting from the two-photon driven KNR prevents population transfer between the two logical states, making it difficult to implement X rotations. One approach to implement $\hat{R}(\pi/2)$ is to temporarily remove the two-photon drive and let the state evolve under the Kerr Hamiltonian. Alternatively, an arbitrary $\hat{R}_x(\theta)$ can be realized by introducing a detuning between the two-photon drive and the resonator corresponding to the Hamiltonian $\hat{H}_x = \hat{H}_0 + \delta_x \hat{a}^\dagger \hat{a}$. For $\delta_x \ll 2\varepsilon_p$ (Supplementary Information below), this can be understood by projecting the number operator in the logical basis: $\bar{I}\hat{a}^\dagger\hat{a}\bar{I} = |\alpha_0|^2 \bar{I} - |\alpha_0|^2 e^{-2|\alpha_0|^2} \sigma_x$. Despite the exponential reduction with $\alpha_0$ of the effective Rabi frequency, high-fidelity rotations can be achieved. Numerical simulations on a resonator initialized to $|0\rangle$ and for a time $\tau = \pi/(4\delta_x |\alpha_0|^2 e^{-2|\alpha_0|^2})$, corresponding to the gate $\hat{R}_x(\pi/2)$, leads to a fidelity of 99.7% for $\kappa = 0$ and 98.6% for $K/\kappa = 250$ with $\varepsilon_p = K$ and $\delta_x = K/3$. Similarly to the Z rotations, the fidelity of the X gate also decreases if the condition $\delta_x \ll 2\varepsilon_p$ is not met (see Supplementary Information below).

To complete the set of universal gates, an entangling gate between the field stored in two distinct resonators, or alternatively two modes of a single resonator, is needed.

From the discussion on the $\hat{R}_z(\theta)$ gate, it follows that a $\bar{\sigma}_{z1}\bar{\sigma}_{z2}$ interaction between the two fields is obtained by linearly coupling the two-photon driven KNRs, the Hamiltonian now reading $\hat{H}_{zz} = \hat{H}_{01} + \hat{H}_{02} + \varepsilon z_z(\hat{a}_1^\dagger \hat{a}_2 + \hat{a}_1 \hat{a}_2^\dagger)$. To simplify the discussion, the two resonators are assumed to be identical with $\hat{H}_{0i} = -K\hat{a}_i^{\dagger 2}\hat{a}_i^2 + \varepsilon_p(\hat{a}_i^{\dagger 2} + \hat{a}_i^2)$. Expressed in the logical basis, the bilinear coupling Hamiltonian takes the desired form $\delta_{zz} \bar{\sigma}_{z1}\bar{\sigma}_{z2}$, with $\delta_{zz} = 4\varepsilon_{zz}|\alpha_0|^2$. In order to demonstrate this gate we simulate the master equation under $\hat{H}_{zz}$ with the resonators initialized to the product state $|\mathcal{C}_{\alpha_0}^+\rangle \oplus |\mathcal{C}_{\alpha_0}^+\rangle$ and $\varepsilon_p = 4K$, $\varepsilon_{zz} = K/5$. As expected, the initial product state is transformed to the maximally entangled state $(|0, 0\rangle + i|0, 1\rangle + i|1, 0\rangle + |1, 1\rangle)/2$ at $t = \pi/2\delta_{zz}$ with fidelity $F = 99.99\%$ for $\kappa = 0$ and $F = 94\%$ for $K/\kappa = 250$ Supplementary Information below examines the fidelity dependence on the strength of the two-photon drive.

As demonstrated above, in the presence of a two-photon drive, the eigenspace of a KNR can be engineered to be two out-of-phase coherent states that are robust against single-photon loss. This quantum state engineering offers a practical way to correct the undesirable effects of Kerr nonlinearity in applications such as the qcMAP gate. Protocols for fast-high fidelity initialization and manipulation cat states for quantum information processing are also presented. This approach can offer improvements based on dispersive qubit-resonator interactions or reservoir engineering. These results suggest a minimal approach to prepare and manipulate cat states of the field of a microwave resonator using for instance a Josephson parametric amplifier (JPA) and can be of immediate practical importance for realization of a scalable, hardware efficient platform for quantum computation. n-component cat states can be initialized based on the fact that n coherent states are the degenerate eigenstates of the Hamiltonian $\hat{H} = -K\hat{a}^{\dagger n}\hat{a}^n + \varepsilon_p(\hat{a}^{\dagger n} + \hat{a}^n)$. Such a Hamiltonian could be implemented with a JPA, in which the cosine potential of a Josephson junction supplies the required nonlinearity and flux modulation through the SQUID loop at n-times the resonator frequency triggers the n-photon drive. Accordingly, in light of the above, JPA's will be understood to be powerful devices for implementing quantum algorithms based on multi-component cats.

Methods—Noise Resistance

Eigenstates of the n-Photon Driven Hamiltonian:

Consider the Hamiltonian $$\hat{H}_n = -K\hat{a}^{\dagger n}\hat{a}^n + (\varepsilon_p \hat{a}^{\dagger n} + \varepsilon_p^* \hat{a}^n) = -K\left(\hat{a}^{\dagger n} - \frac{\varepsilon_p^*}{K}\right)\left(\hat{a}^n - \frac{\varepsilon_p}{K}\right) + \frac{|\varepsilon_p|^2}{K}. \quad (6)$$

The second form makes it clear that the coherent state $|\alpha\rangle$ with $\alpha^n - \varepsilon_p/K = 0$ is an eigenstate of $\hat{H}_n$. Thus, in general, there are n coherent states that are the degenerate eigenstates of $\hat{H}_n$ with energy $|\varepsilon_p|^2/K$.

Effective Hamiltonian and Steady-State:

Under single-photon loss, the system's master equation takes the form $$\dot{\hat{\rho}} = -i(\hat{H}_{eff}\hat{\rho} - \hat{\rho}\hat{H}_{eff}^\dagger) + \kappa\hat{a}\hat{\rho}\hat{a}^\dagger, \quad (7)$$

where $\hat{H}_{eff} = \hat{H}_0 - i\kappa\hat{a}^\dagger\hat{a}/2$ and $\hat{H}_0 = -K\hat{a}^\dagger\hat{a}^\dagger\hat{a}\hat{a} + (\varepsilon_p \hat{a}^{\dagger 2} + \varepsilon_p^* \hat{a}^2)$. Under displacement transformation $D(\alpha_0) = \exp(\alpha_0 \hat{a}^\dagger - \alpha_0^* \hat{a})$, $\hat{H}_{eff}$ reads $$\hat{H}'_{eff} = D^\dagger(\alpha_0)\hat{H}_{eff} D(\alpha_0) = \quad (8)$$

$$\left[\left(-2K\alpha_0^2\alpha_0^* + 2\varepsilon_p\alpha_0^* - i\frac{K}{2}\alpha_0\right)\hat{a}^\dagger + h.c.\right] + [(-K\alpha_0^2 + \varepsilon_p)\hat{a}^{\dagger 2} + h.c.] -$$

$$4K|\alpha|^2 \hat{a}^\dagger\hat{a} - i\frac{K}{2}\hat{a}^\dagger\hat{a} - K\hat{a}^{\dagger 2}\hat{a}^2 - (2K\alpha_0\hat{a}^{\dagger 2}\hat{a} + h.c.),$$

where the constant term $E = -K|\alpha_0|^4 + \varepsilon_p^*\alpha_0^2 + \varepsilon_p\alpha_0^{*2} - i\kappa|\alpha_0|^2/2$ that represents a shift in energy of the non-Hermitan effective Hamiltonian has been dropped. $\alpha_0$ is taken to satisfy $$-2K\alpha_0^2\alpha_0^* + 2\varepsilon_p\alpha_0^* - i\frac{K}{2}\alpha_0 = 0, \quad (9)$$

such as to cancel the first line of $\hat{H}_{eff}^I$ which now reads $$\hat{H}'_{eff} = [(-K\alpha_0^2 + \varepsilon_p)\hat{a}^{\dagger 2} + h.c.] - \qquad (10)$$
$$\left(4K|\alpha_0|^2 + i\frac{\kappa}{2}\right)\hat{a}^\dagger\hat{a} - K\hat{a}^{\dagger 2}\hat{a}^2 - 2K\alpha_0\hat{a}^{\dagger 2}\hat{a} - 2K\alpha_0^*\hat{a}^\dagger\hat{a}^2.$$

Eq. (9) is satisfied for $\alpha_0=0$, $\pm r_0 e^{i\theta_0}$ where $$r_0 = \left(\frac{4\varepsilon_p^2 - \kappa^2/4}{4K^2}\right)^{1/4}, \theta_0 = \frac{1}{2}\tan^{-1}\left(\frac{\kappa}{\sqrt{16\varepsilon_p^2 - \kappa^2}}\right). \qquad (11)$$

The non-trivial solutions $\pm r_0 e^{i\theta_0}$ exist when $\varepsilon_p > \kappa/4$. For $\alpha_0=0$ and $\kappa<4\varepsilon_p$ the first two terms of Eq.(10) represent a near resonant parametric drive of strength $\varepsilon_p$. This results in large fluctuations making the system unstable around $\alpha_0=0$. On the other hand, for $\alpha_0=\pm r_0 e^{i\theta_0}$, the displaced effective Hamiltonian can be rewritten as $$\hat{H}'_{eff} = \frac{1}{2}\left[i\frac{\kappa\alpha_0}{2\alpha_0^*}\hat{a}^{\dagger 2} + c.c.\right] - \qquad (12)$$
$$\left(4K|\alpha_0|^2 + i\frac{\kappa}{2}\right)\hat{a}^\dagger\hat{a} - K\hat{a}^{\dagger 2}\hat{a}^2 - 2K\alpha_0\hat{a}^{\dagger 2}\hat{a} - 2K\alpha_0^*\hat{a}^\dagger\hat{a}^2.$$

The first two terms of Eq.(12) now represent a parametric drive whose amplitude has an absolute value of $\kappa/2$ and is detuned by $4K|\alpha_0|^2+i\kappa/2 \approx 4K|\alpha_0|^2$. In other words, the effect of single-photon loss $\kappa$ is to squeeze the field around $\alpha_0=\pm r_0 e^{i\theta_0}$ leading to increased quantum fluctuations. For $\kappa \ll 8K|\alpha_0|^2$, the resulting fluctuations are, however, small and $|0\rangle$ remains an eigenstate in the displaced frame. This implies that, back in the lab frame, $|\pm\alpha_0\rangle$ are the degenerate eigenstates of $\hat{H}_{eff}$. As a result, $\hat{\rho}_s=(|\alpha_0\rangle\langle\alpha_0|+|-\alpha_0\rangle\langle-\alpha_0|)/2$ is a steady-state of Eq.(7). It is, moreover, the unique steady-state of this system since only the two eigenstates $|\pm\alpha_0\rangle$ of the effective Hamiltonian are also invariant under the quantum jump operator $\hat{a}$. Following the analysis here, it is also possible to characterize the effect of, for example, single-photon drive, detuning, etc (see Supplementary Information below).

Cat State Decoherence Under Single-Photon Loss:

In the previous section, we saw that the coherent states $|\pm\alpha_0\rangle$ are eigenstates of the two-photon driven KNR even in the presence of single-photon loss. However, this loss channel results in decoherence of superpositions of these two states, i.e. of cat states. Indeed, the last term of the master equation Eq.(7), $\kappa\hat{a}\hat{\rho}\hat{a}^\dagger$, transforms the even parity cat state $|\mathcal{C}_{\alpha_0}^+\rangle$ to the odd parity cat state $|\mathcal{C}_{\alpha_0}^-\rangle$ and vice-versa. This results in decoherence and reduction in the contrast of the Wigner function fringes. The rate of this phase decay is given by $\gamma=\kappa|\alpha_0-(-\alpha_0)|^2/2=2\kappa|\alpha_0|^2$.

Consider for example the cat state initialization protocol with $\varepsilon_p=\varepsilon_p^0[1-\exp(-t^4/\tau^4)]$ and $\varepsilon_p^0=4K$ so that $\alpha_0(t)=2\sqrt{[1-\exp(-t^4/\tau^4)]}$. The phase error during this initialization can be estimated to be $\exp(-2\int\kappa|\alpha_0(t)|^2 dt)=0.016$, resulting in a fidelity of 98.4%. This estimate compares very well with the numerically estimated fidelity quoted earlier in the manuscript (98.3%).

Additional Hamiltonian for Faster than Adiabatic Initialization of Cat State:

Consider the exact Hamiltonian in Eq.(5) required for transitionless quantum driving. At short times t~0, we have that $\alpha_0(t) \sim 0$ and as a result $|\mathcal{C}_0^+\rangle \sim |n=0\rangle$ and $|\mathcal{C}_0^-\rangle \sim |n=1\rangle$. Therefore, $[\hat{a}^\dagger|\mathcal{C}_{\alpha_0(t)}^-\rangle\langle\mathcal{C}_{\alpha_0(t)}^+|-|\mathcal{C}_{\alpha_0(t)}^+\rangle\langle\mathcal{C}_{\alpha_0(t)}^-|\hat{a}] \sim [\hat{a}^\dagger|1\rangle\langle0|-|0\rangle\langle1|\hat{a}] \sim \hat{a}^{\dagger 2}-\hat{a}^2$. On the contrary, at long time the coherent states become quasi-orthogonal and a single photon jump leads to the transition between even and odd photon number cat states. This suggests that if $\alpha_0(t) \gg 1$, it is possible to approximate $[\hat{a}^\dagger|\mathcal{C}_{\alpha_0(t)}^-\rangle\langle\mathcal{C}_{\alpha_0(t)}^+|-|\mathcal{C}_{\alpha_0(t)}^+\rangle\langle\mathcal{C}_{\alpha_0(t)}^-|\hat{a}] \sim (\hat{a}^{\dagger 2}-\hat{a}^2)/2\alpha_0(t)$ in the restricted coherent state basis. Therefore, in order to reconcile both short and long time behaviour, we choose, $[\hat{a}^\dagger|\mathcal{C}_{\alpha_0(t)}^-\rangle\langle\mathcal{C}_{\alpha_0(t)}^+|-|\mathcal{C}_{\alpha_0(t)}^+\rangle\langle\mathcal{C}_{\alpha_0(t)}^-|\hat{a}] \sim (\hat{a}^{\dagger 2}-\hat{a}^2)/[1+2\alpha_0(t)]$ to obtain Eq.(5).

Supplementary Information: Engineering the Quantum States of Light in a Kerr-Nonlinear Resonator by Two-Photon Driving Stabilization of Coherent States in a Two-Photon Driven KNR As presented above, $\hat{\rho}_s=(|\alpha_0\rangle\langle\alpha_0|+|-\alpha_0\rangle\langle-\alpha_0|)/2$ is the unique steady-state of a two-photon driven KNR. It is worth pointing out that, although this is the unique steady-state, the time for the system to reach $\hat{\rho}_s$ can approach infinity as $|\alpha_0|$ increases because $\langle-\alpha_0|\alpha_0\rangle=\exp(-2|\alpha_0|^2) \sim 0$. As a result, a system initialized in the state $a|\alpha_0\rangle+b|-\alpha_0\rangle$ will evolve to $|a|^2|\alpha_0\rangle\langle\alpha_0|+|b|^2|-\alpha_0\rangle\langle-\alpha_0|$ only after a long time $t \gg 1/\kappa$ if $\alpha_0$ is large.

Figure 5:
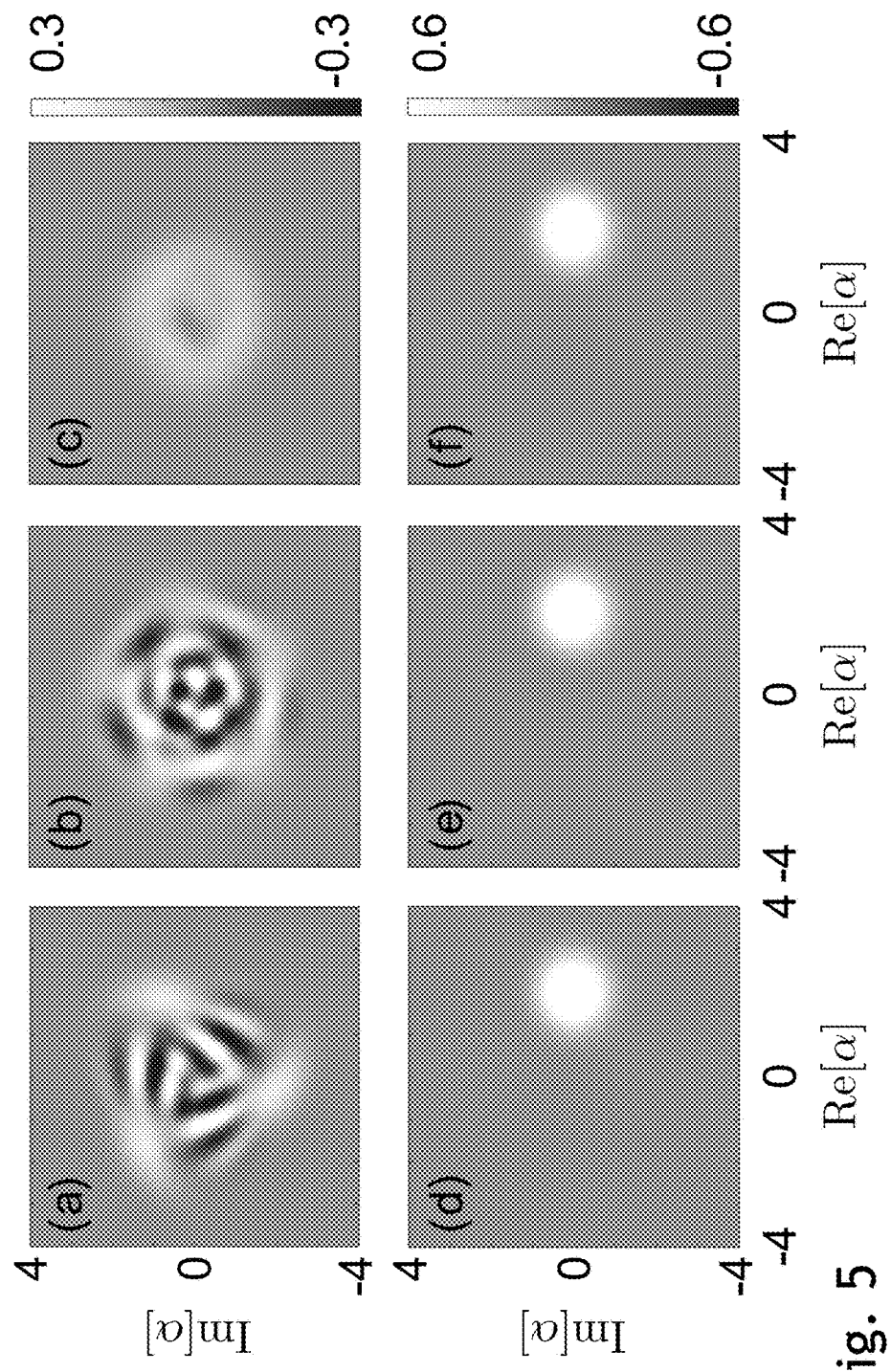
FIG. 5 represents time evolution of the Wigner function when the resonator is initialized to the coherent state $|2\rangle$ and $\kappa=K/250$. In the absence of a parametric drive (a-c), the coherent state evolves under the Kerr Hamiltonian and will finally decay to the vacuum state $|0\rangle$. With a parametric drive $\varepsilon_p \sim 4K$ (d-e) (satisfying Eq. (3) in the main text), the initial state is the eigenstate of the effective Hamiltonian and it remains in that state.

As a corollary, we find that the two-photon driven KNR initialized to either of the coherent states $|\pm\alpha_0\rangle$, remains in that state even in the presence of single-photon loss, as long as $\alpha_0$ satisfies Eq.(11) in the main text and $\kappa \ll 8K|\alpha_0|^2$. This is illustrated in FIG. 5, which shows the Wigner function obtained by numerical integration of the master equation for the system initialized to the coherent state $|\alpha_0\rangle$ without (FIG. 5(a-c)) and with (FIG. 5(d-f)) two-photon drive. We note that all simulations in this work were carried out with a standard master equation solver and with Hilbert space size large enough to ensure negligible truncation errors. For example, simulations with $|\alpha|=1, 2, 4$ were carried out with a Hilbert space size of N=20, 40, 80 respectively.

Photon-Dephasing

To take into account dephasing at a rate $\kappa_\phi$, the master equation takes the form $$\dot{\hat{\rho}}=-i(\hat{H}_{eff}\hat{\rho}-\hat{\rho}\hat{H}_{eff}^\dagger)+\kappa_\phi\hat{a}^\dagger\hat{a}\hat{\rho}\hat{a}^\dagger\hat{a}, \qquad (13)$$

with $\hat{H}_{eff}=\hat{H}_0-i\kappa_\phi\hat{a}^\dagger\hat{a}\hat{a}^\dagger\hat{a}/2=\hat{H}_0-i\kappa_\phi\hat{a}^{\dagger 2}\hat{a}^2/2-i\kappa_\phi\hat{a}^\dagger\hat{a}/2$. This effective Hamiltonian is equivalent to the effective Hamiltonan when $\kappa_\phi=0$ but with a Kerr nonlinearity $K-i\kappa_\phi/2$ and single-photon loss $\kappa_\phi$. Following the derivation in the second section we find that the amplitude $\alpha_0$ must now satisfy $$(-2K-i\kappa_\phi)\alpha_0^2\alpha_0^* + 2\varepsilon_p\alpha_0^* - i\frac{\kappa_\phi}{2}\alpha_0 = 0. \qquad (14)$$

For $\kappa_\phi \ll 4K|\alpha_0|^2$, the coherent states $|\pm\alpha_0\rangle$ are again the degenerate eigenstates of the system. The action of the third term in the above master equation, $\hat{a}^\dagger\hat{a}\hat{\rho}\hat{a}^\dagger\hat{a}$, it to flip the state of the resonator from $|\alpha_0\rangle$ to $|-\alpha_0\rangle$ and vice-versa at a rate of $\kappa_\phi|\alpha_0|^2 e^{-2|\alpha_0|^2}$.

Two-Photon Loss

Two-photon loss, the process in which the system loses pairs of photons to the bath, can accompany non-linear interactions. However, ordinarily, the rate of two-photon dissipation is small. The master equation in the presence of such a loss (with rate $\kappa_{2ph}$) takes the form $$\dot{\rho}=-i(\hat{H}_{eff}\hat{\rho}-\hat{\rho}\hat{H}_{eff}^\dagger)+\kappa_{2ph}\hat{a}^2\hat{\rho}\hat{a}^{\dagger 2}, \quad (15)$$

where $\hat{H}_{eff}=\hat{H}_0-i\kappa_{2ph}\hat{a}^{\dagger 2}\hat{a}^2/2$. This expression implies that two-photon loss effectively acts as a Kerr-nonlinearity of amplitude $-i\kappa_{2ph}/2$. As a result, the degenerate eigenstates of the effective Hamiltonian become $|\pm\alpha\rangle$ with $\alpha=\sqrt{\varepsilon_p/(K+i\kappa_{2ph}/2)}$. The two-photon jump operator, given by the second term in the above expression, does not cause a phase-flip or spin-flip since $\hat{a}^2|\pm\alpha\rangle=\alpha^2|\pm\alpha\rangle$ and $\hat{a}^2|\mathcal{C}_\alpha^\pm\rangle=\alpha^2|\mathcal{C}_\alpha^\pm\rangle$. As a result, two-photon loss is, by itself, not detrimental to cat state preparation. However, this deterministic phase rotation, in addition to non-deterministic single-photon loss can lead to additional dephasing. With typical parameter such as the one described in the main body of the paper and in section V of the supplement, $\kappa_{2ph}\ll K$ and dephasing is therefore negligible.

Eigenstates and Eigenvalues of the Two-Photon Driven KNR

The eigenstates and eigenenergies of the time-dependent KNR driven by a two-photon process can be evaluated as follows:

$$\hat{H}_0(t)=K\hat{a}^\dagger\hat{a}^\dagger\hat{a}\hat{a}-[\varepsilon_p(t)\hat{a}^{\dagger 2}+\varepsilon_p(t)^*\hat{a}^2], \quad (16)$$

with $\varepsilon_p(t)=\varepsilon_p^0[1-\exp(-t^4/\tau^4)]$ so that $\varepsilon_p(t=0)=0$, $\varepsilon_p(t) \sim \varepsilon_p^0=4K$ for $t\gg\tau$ and $\tau K=5$. This particular time dependence was chosen to assure adiabaticity of the evolution. Other choices are possible and pulse shaping techniques could lead to fidelity increases. We also note that the sign of the Kerr nonlinearity as changed with respect to the demonstration presented above.

Figure 6:
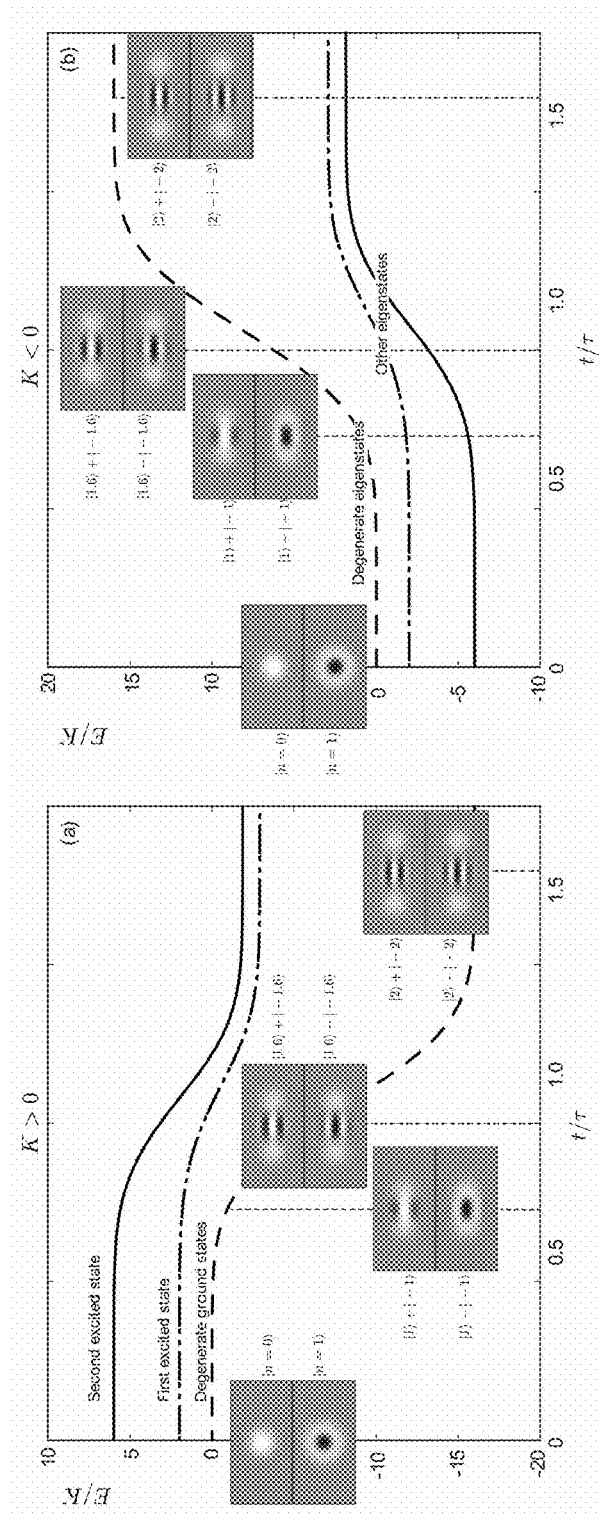
FIG. 6 represents numerically evaluated eigenenergies and Wigner function of the first four eigenstates for (a) $K>0$ (b) $K<0$, $\varepsilon_p(t)=\varepsilon_p^0[1-\exp(-t^4/\tau^4)]$, $\varepsilon_p^0=4K$ and $\tau=5K$.

We take $K>0$ for which the ground states at $t=0$ are the Fock states $|0\rangle$, $|1\rangle$ with energy $E_0=E_1=0$. Under adiabatic evolution, these degenerate ground states transform to the instantaneous eigenstates of the Hamiltonian, $|\mathcal{C}_{\alpha_0(t)}^\pm\rangle$ for $t\gg\tau$ with energy $E_0=E_1=-\varepsilon_p\alpha_0(t)^2$ and $\alpha_0=\sqrt{\varepsilon_p(t)/K}$. The eigenenergies of the ground, first and second instantaneous eigenstates are plotted in FIG. 6(a). The figure also shows the simulated Wigner functions corresponding to the instantaneous eigenstates at different times. Note that if $K<0$ the states $|0\rangle$, $|1\rangle$ are excited states of the initial undriven Kerr Hamiltonian. However as the two-photon drive amplitude increases these states are slowly transformed to the eigenstates $|\mathcal{C}_{\alpha_0(t)}^\pm\rangle$, which are eigenstates but not necessarily the ground states of $\hat{H}_0(t)$. FIG. 6(b) illustrates the time dependence of the eigenenergies and eigenstates when $K<0$ and $\varepsilon_p^0=4K$.

The eigenenergy spectrum illustrates that for adiabatic initialization of cat states in time $\tau$, $\Delta_{min}\tau\gg 1$. Here $\Delta_{min}$ is the minimum energy gap and, from FIG. 6, $\Delta_{min}=2K$. It is possible to increase this gap and therefore speed-up the initialization by introducing a time-dependent detuning $\delta(t)$ between the two-photon drive and the bare resonator frequency. The initialization protocol is then carried out by increasing the two-photon drive strength and decreasing the detuning from $\delta(0)=\delta_0$ to $\delta(\tau)=0$. The detuning given by the Hamiltonian $\delta(t)\hat{a}^\dagger\hat{a}$ conserves parity at all times (that is, it does not mix the even and odd parity cat states) and increases the minimum energy gap during the adiabatic evolution, leading to a faster initialization. Consider for example a resonator subjected to the time-dependent Hamiltonian, $\hat{H}(t)=-K\hat{a}^\dagger\hat{a}\hat{a}\hat{a}+(t/\tau)\varepsilon_p^0[\hat{a}^{\dagger 2}+\hat{a}^2]-\delta_0(1-t/\tau)\hat{a}^\dagger\hat{a}$, with $\varepsilon_p^0=4K$, $\delta_0=1.7K$ and $\tau=2K$. The minimum energy gap during this evolution is $\Delta_{min}=4.3K$. At $t=0$, the Fock states are the eigenstates, whereas at $t=\tau$ the eigenstates are the cat states $|\mathcal{C}_{\alpha_0(t)}^\pm\rangle$. We find that such a resonator initialized to vacuum evolves to the cat state $|\mathcal{C}_{\alpha_0(t)}^+\rangle$ at $t=\tau$ with a fidelity of 99.9% for $\kappa=0$, and 99.3% for $\kappa=K/250$. If, on the other hand, $\delta_0=0$ and the initialization is carried out in a time $\tau=2/K$, then the cat state fidelity is reduced to 85.6% when $\kappa=0$ and 84.9% when $\kappa=K/250$ because of non-adiabatic errors. As already mentioned, further speed-ups could be obtained by pulse shaping techniques.

Pulse Optimization with GRAPE

An implementation of the Gradient Ascent Pulse Engineering (GRAPE) algorithm was used to design the pulse for fast cat state initialization using the non-adiabatic protocol described in the main text. Following the result of the main text, fast initialization is achieved by evolution under the time dependent Hamiltonian $\hat{H}(t)=\hat{H}_0(t)+\hat{H}'(t)$, with $$\hat{H}_0(t)=-K\hat{a}^{\dagger 2}\hat{a}^2+\varepsilon_{p,x}(t)(\hat{a}^{\dagger 2}+\hat{a}^2), \hat{H}'(t)=i\varepsilon_{p,y}(t)(\hat{a}^{\dagger 2}-\hat{a}^2). \quad (17)$$

Figure 7:
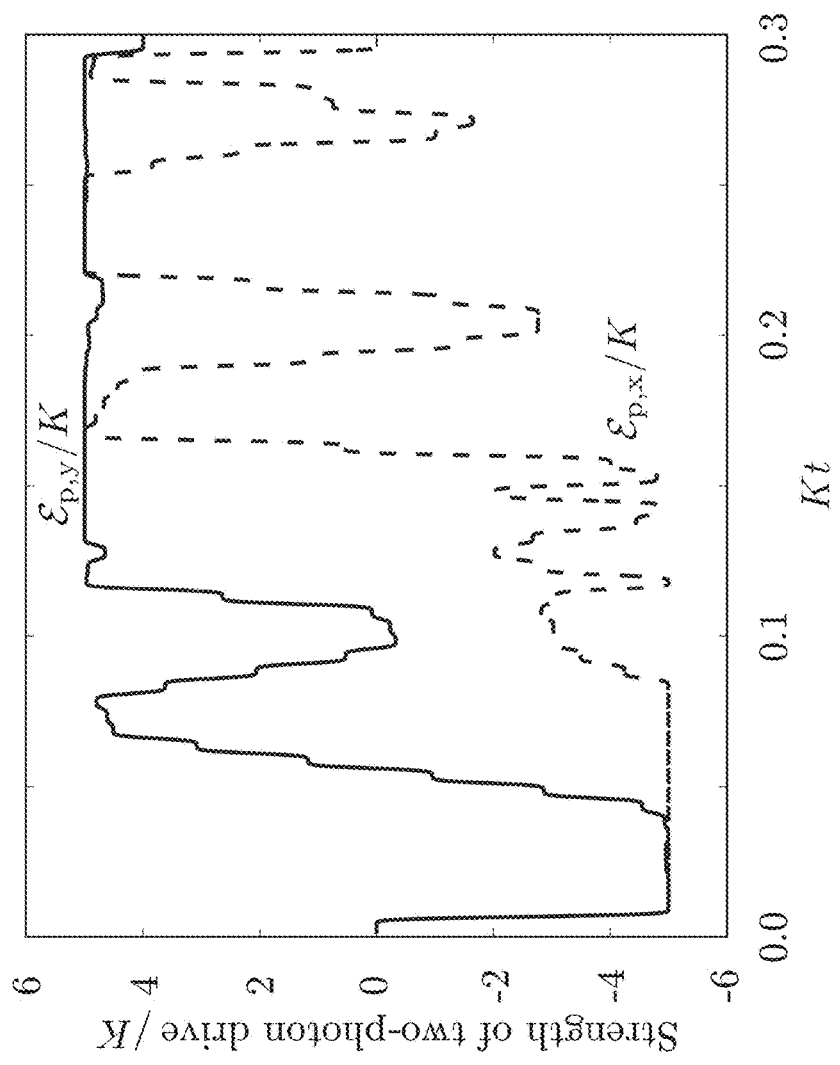
FIG. 7 represents optimized pulse shapes using an implementation of the GRAPE algorithm[4] for $\varepsilon_{p,x}(t)/K$ (dotted) and $\varepsilon_{p,y}(t)/K$ (solid) in order to initialize the cat state $\mathcal{C}_2^+$ with high fidelity in time $T=0.3/K$.

Our GRAPE implementation allows the restriction of the two-photon drive $\varepsilon_{p,y}$ to zero at the beginning $t=0$ and end $t=T$ of the protocol. The two-photon drive $\varepsilon_{p,x}$ is restricted to $4K$ at $t=T$ to realize a stabilized cat $\mathcal{C}_2^+$ at the end of the protocol. Furthermore, in order to allow only realistic drive amplitudes during the evolution, the pulse amplitude is restricted such that $|\varepsilon_{p,y}|, |\varepsilon_{p,x}|<6K$. The resulting pulse, optimized to yield the cat state $\mathcal{C}_2^+$ at $t=T=0.3/K$ is shown in FIG. 7. The fidelity of the resulting cat state is 99.95% and the time step is chosen so that the time-scale for the modulation of the drive amplitude is realistic ($\geq 1$ ns).

Implementation of the Encoding Scheme in cQED with a Josephson Parametric Amplifier Numerical simulations of the cat state preparation protocol with a Josephson parametric amplifier (JPA) are now presented. The Hamiltonian of a lumped element JPA is given by $$\hat{H}(t)=\frac{\hat{q}^2}{2C}-2E_J\cos\left(\frac{\Phi(t)}{\phi_0}\right)\cos\left(\frac{\hat{\phi}}{\phi_0}\right), \text{ where} \quad (18)$$

$$\hat{q}=i\sqrt{\frac{\hbar C\omega_r}{2}}(\hat{a}^\dagger-\hat{a}), \hat{\phi}=\sqrt{\frac{\hbar}{2C\omega_r}}(\hat{a}^\dagger+\hat{a}) \quad (19)$$

and $\phi_0=\hbar/2e$ is the flux quanta while $\Phi(t)=\Phi+\delta\Phi(t)$ is the classical flux through the SQUID loop. In our simulations, this flux is modulated around $\Phi=0.2\phi_0$ at twice the resonator frequency $\omega_r$, $\delta\Phi(t)=\delta\Phi_0(t)\cos(2\omega_r t)$. In this expression, $\Phi_0(t)$ represents the slowly varying envelope of the modulation. As already discussed, for cat state initialization, $\Phi_0(t)$ is chosen to adiabatically change from zero to a maximum amplitude.

Fourth-Order Expansion to Map to Cassinian Oscillator Hamiltonian

As usual, to map the above Hamiltonian to the Cassinian oscillator with time dependent two-photon drive, we expand the cosine term to the fourth order and make the rotating wave approximation. The resulting Hamiltonian is $$\hat{H}=\hbar\omega_r\hat{a}^\dagger\hat{a}-K\hat{a}^{\dagger 2}\hat{a}^2+\varepsilon_p(\hat{a}^{\dagger 2}e^{-2i\omega_r t}+\hat{a}^2 e^{2i\omega_r t}), \quad (20)$$

where we have defined $$\omega_r=\omega_0\sqrt{\cos\left(\frac{\Phi}{\phi_0}\right)\cos\left(\frac{\delta\Phi_0(t)}{\phi_0}\right)}, \omega_0=4\sqrt{\frac{E_J E_C}{\hbar^2}} \quad (21)$$

-continued $$K = \frac{E_C}{2}, \quad (22)$$

$$\varepsilon_p = \frac{\sqrt{E_J E_C}}{2} \frac{\sin\left(\frac{\Phi}{\phi_0}\right)\sin\left(\frac{\delta\Phi_0(t)}{\phi_0}\right)}{\sqrt{\cos\left(\frac{\Phi}{\phi_0}\right)\cos\left(\frac{\delta\Phi_0(t)}{\phi_0}\right)}}, \quad (23)$$

with $E_C = e^2/\mathcal{C}$ the charging energy. The strength of the two photon drive is governed by the amplitude of $\delta\Phi_0$. In practice, it cannot be made too large to avoid large change in the resonator frequency. As discussed in the main text, in order to encode an even parity cat state the resonator is initialized to vacuum state at t=0, followed by an adiabatic increase in the two-photon drive amplitude. This is achieved by slowly increasing the amplitude of the flux modulation which, for simplicity, is here chose as $\delta\Phi_0(t) = \delta\Phi_0 \times t/\tau$.

Simulation of the Full Cosine Potential

Figure 8:
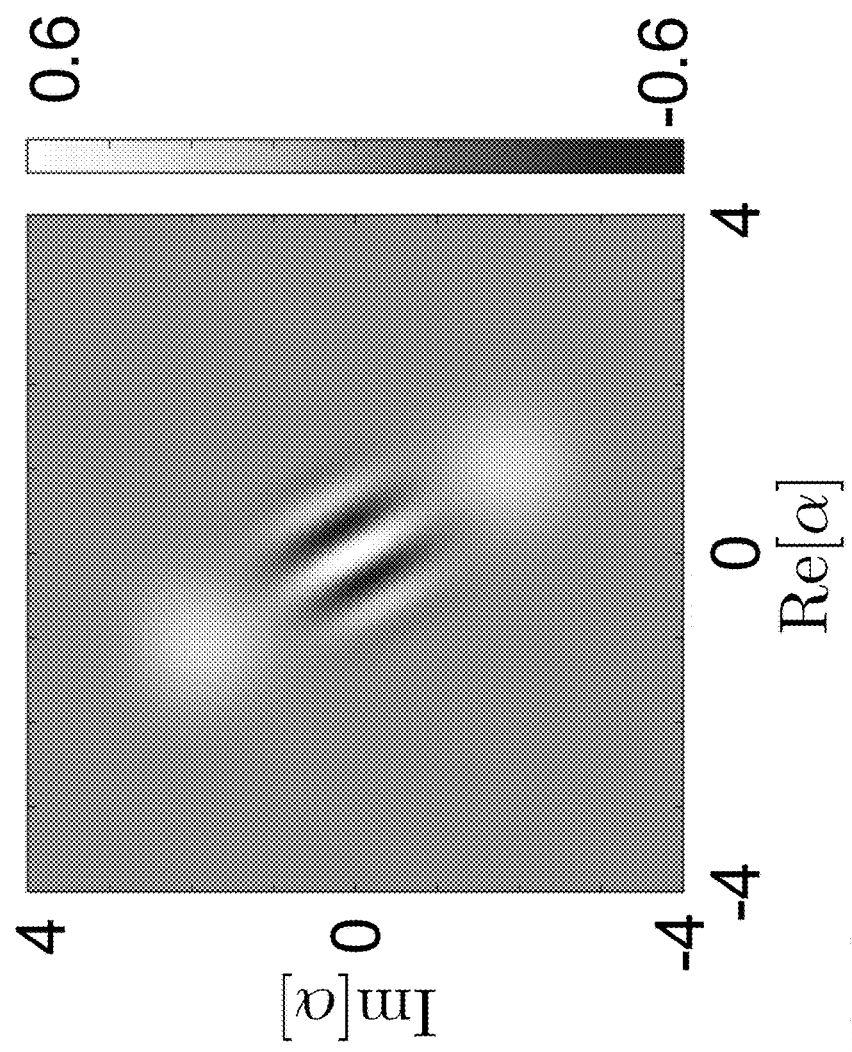
FIG. 8 represents the Wigner function of the cat state in the lab frame simulated using a realistic circuit of a resonator coupled to a flux-modulated SQUID.

In order to account for higher-order effect or the rotating terms, we simulated the full Hamiltonian Eq.(18) from t=0 to t=$\tau$ with $\delta\Phi_0$=0.04$\phi_0$. The Wigner function of the resulting density matrix at t=$\tau$ is shown in FIG. 8. From Eq.(22) and (23), the size of the cat state is related to $\beta = \sqrt{\varepsilon_p/K} \propto (E_J/E_C)^{1/4}$. As a result, initialization of large cat states requires large $E_J/E_C$. However, as this ratio is increased, higher-order terms become more important and can lead to reduction of the cat-state fidelity. Another consequence, as can be seen from Eq.(21), is that the frequency of the resonator $\propto \sqrt{E_J E_C}$ must be at least a few GHz to avoid thermal excitations from the bath. Keeping this in mind, we have used in our simulation the experimentally realistic parameters: $E_C/2\pi$=1.5 MHz, $E_J/2$=$\pi$=600 GHz so that the estimated frequency $\omega_r/2\pi$=3.75 GHz, nonlinearity K/2$\pi$=750 KHz and two-photon drive strength $\varepsilon_p/2\pi$=3.7 MHz. From simulations of the full Hamiltonian, we find that the cat state $|\text{cat}\rangle$ with $|\alpha|^2$=4.8 is realized in time t=$\tau$=26.67 µs with a fidelity of 99.4%. In other words, for these realistic parameters, the effect of higher-order terms appears to be minimal. Here and in the main paper, we have estimated fidelities using $F = \text{Tr}[\sqrt{\rho_{target}} \rho \sqrt{\rho_{target}}]$. We note that the rotation observed in FIG. 8 is due to the fact that this simulation was realized in the laboratory frame.

Effect of Single Photon Drive

A two-photon driven KNR with an additional single-photon drive is now considered. To simplify the analysis, we take $\kappa$=0. The Hamiltonian is given by $$\hat{H}_z = -K\hat{a}^\dagger\hat{a}^\dagger\hat{a}\hat{a} + \varepsilon_p(\hat{a}^{\dagger 2}+\hat{a}^2) + \varepsilon_z\hat{a} + \varepsilon_z^*\hat{a}, \quad (24)$$

where the phase of the single photon drive is defined with respect to the two-photon drive. Under a displacement transformation $D(\alpha_0)$ the Hamiltonian reads $$\hat{H}_z = [(-2K\alpha_0^2\alpha_0^* + 2\varepsilon_p\alpha_0^* + \varepsilon_z)\hat{a}^\dagger + h.c.] + [(-K\alpha_0^2 + \varepsilon_p) \hat{a}^{\dagger 2} + h.c.] - 4K|\alpha|^2\hat{a}^\dagger\hat{a} - K\hat{a}^{\dagger 2}\hat{a}^2 - (2K\alpha_0\hat{a}^{\dagger 2}\hat{a}+h.c.), \quad (25)$$

where the constant term $E = -K|\alpha_0|^4 + \varepsilon_p(\alpha_0^2 + \alpha_0^{*2}) + \varepsilon_z^*\alpha_0 + \varepsilon_z\alpha_0$ representing a shift in energy was dropped. For the coefficient of the $\hat{a}$, $\hat{a}^\dagger$ at terms to vanish, $$-2K\alpha_0^2\alpha_0^* + 2\varepsilon_p\alpha_0^* + \varepsilon_z = 0, \quad (26)$$

is taken such that $$\hat{H}'_z = \left[\frac{-\varepsilon_z}{2\alpha_0^*}\hat{a}^{\dagger 2} + h.c.\right] - 4K|\alpha_0|^2\hat{a}^\dagger\hat{a} - K\hat{a}^{\dagger 2}\hat{a}^2 - 2K\alpha_0\hat{a}^{\dagger 2}\hat{a} - (2K\alpha_0^*\hat{a}^\dagger\hat{a}^2 + h.c.). \quad (27)$$

Following the derivation in the manuscript (Methods), $|0\rangle$ is an eigenstate of $\hat{H}_z'$ except for the first term which represents an off-resonant parametric drive of strength $|\varepsilon_z/2\alpha_0^*|$, detuned by $4K|\alpha_0|^2$. For $|\varepsilon_z/\alpha_0^*| \ll 4K|\alpha_0|^2$, fluctuations around $\alpha_0$ are small and $|0\rangle$ remains an eigenstate in the displaced frame. Again following the Methods section in the Manuscript, there are three solutions of Eq.(26) which, for small $\varepsilon_z$, are of the form $-\alpha_0 + \varepsilon$, $\varepsilon$ and $\alpha_0 + \varepsilon$ where $\alpha_0 = \sqrt{\varepsilon_p/K}$ and $\varepsilon \sim \varepsilon_z/4\varepsilon_p$.

Only two of these ($\alpha_0 + \varepsilon$ and $-\alpha_0 + \varepsilon$) satisfy the condition $|\varepsilon_z/\alpha_0| \ll 4K|\alpha_0|^2$. The large quantum fluctuations around the third solution makes it unstable. As a result, in the laboratory frame, the eigenstates of the system are $|\alpha_0 + \varepsilon\rangle$ and $|-\alpha_0 + \varepsilon\rangle$, where $\varepsilon$ is a small correction ($\varepsilon \to 0$ for $\varepsilon_z \ll 4\varepsilon_p$). In other words, the single-photon drive only slightly displaces the coherent components of the cat. From the above expression of the energy E, it is however clear that the degeneracy between the eigenstates $|\alpha_0 + \varepsilon\rangle$ and $|-\alpha_0 + \varepsilon\rangle$ is lifted by an amount $\delta_z = 4\text{Re}[\varepsilon_z\alpha_0]$.

In the eigenspace spanned by $|\pm\alpha_0\rangle$, the single-photon drive can be written as $\delta_z\bar{\sigma}_z/2 + 2\text{Im}[\varepsilon_z\alpha_0^*]e^{-2|\alpha_0|^2}\bar{\sigma}_x$. If $\varepsilon_z$ and $\varepsilon_p$ are real so that $\alpha_0$ is real, then $\text{Im}[\varepsilon_z\alpha_0^*]=0$ and hence the only effect of the single-photon drive is to lift the degeneracy between $|\pm\alpha_0\rangle$ or the logical $|0\rangle$ and $|1\rangle$.

Effect of Detuning

In this section we analyze the effect of detuning the two-photon drive from the resonator. The Hamiltonian is given by $$\hat{H}_z = \delta\hat{a}^\dagger\hat{a} - K\hat{a}^\dagger\hat{a}^\dagger\hat{a}\hat{a} + \varepsilon_p(\hat{a}^{\dagger 2}+\hat{a}^2). \quad (28)$$

Under a displacement transformation $D(\alpha_0)$ the new Hamiltonian reads $$\hat{H}_z' = (-2K\alpha_0^2\alpha_0^* + 2\varepsilon_p\alpha_0^* + \delta\alpha_0)\hat{a}^\dagger + c.c. + (-K\alpha_0^2 + \varepsilon_p)\hat{a}^{\dagger 2} + c.c. - 4K|\alpha_0|^2\hat{a}^\dagger\hat{a} + \delta\hat{a}^\dagger\hat{a} - K\hat{a}^{\dagger 2}\hat{a}^2 - (2K\alpha_0\hat{a}^{\dagger 2}\hat{a} + c.c.), \quad (29)$$

where the constant term $E = -K|\alpha_0|^4 + \varepsilon_p(\alpha_0^2 + \alpha_0^{*2}) + \delta|\alpha_0|^2$ representing a shift in energy is dropped. For the coefficient of the $\hat{a}$, $\hat{a}^\dagger$ at terms to vanish, $$-2K\alpha_0^2\alpha_0^* + 2\varepsilon_p\alpha_0^* + \delta\alpha_0 = 0, \quad (30)$$

so that, $$\hat{H}'_z = \frac{\delta\alpha_0}{2\alpha_0^*}\hat{a}^{\dagger 2} + c.c. - 4K|\alpha_0|^2\hat{a}^\dagger\hat{a} + \delta\hat{a}^\dagger\hat{a} - K\hat{a}^{\dagger 2}\hat{a}^2 - 2K\alpha_0\hat{a}^{\dagger 2}\hat{a} - (2K\alpha_0^*\hat{a}^\dagger\hat{a}^2 + c.c.). \quad (31)$$

Again, we follow the derivation outlined in the previous section to find that, if $|\delta| \ll 2\varepsilon_p$, then the eigenstates of the system are $|\pm\alpha_0\rangle$ where $\alpha_0 = \sqrt{(2\varepsilon_p+\delta)/2K}$. Because of the non-orthogonality of these states, the term $\hat{a}^\dagger\hat{a}$ has non-zero matrix elements $\langle\alpha_0|\hat{a}^\dagger\hat{a}|-\alpha_0\rangle = -|\alpha_0|^2 e^{-2|\alpha_0|^2}$.

Evolution During the Gate Operations

Figure 9:
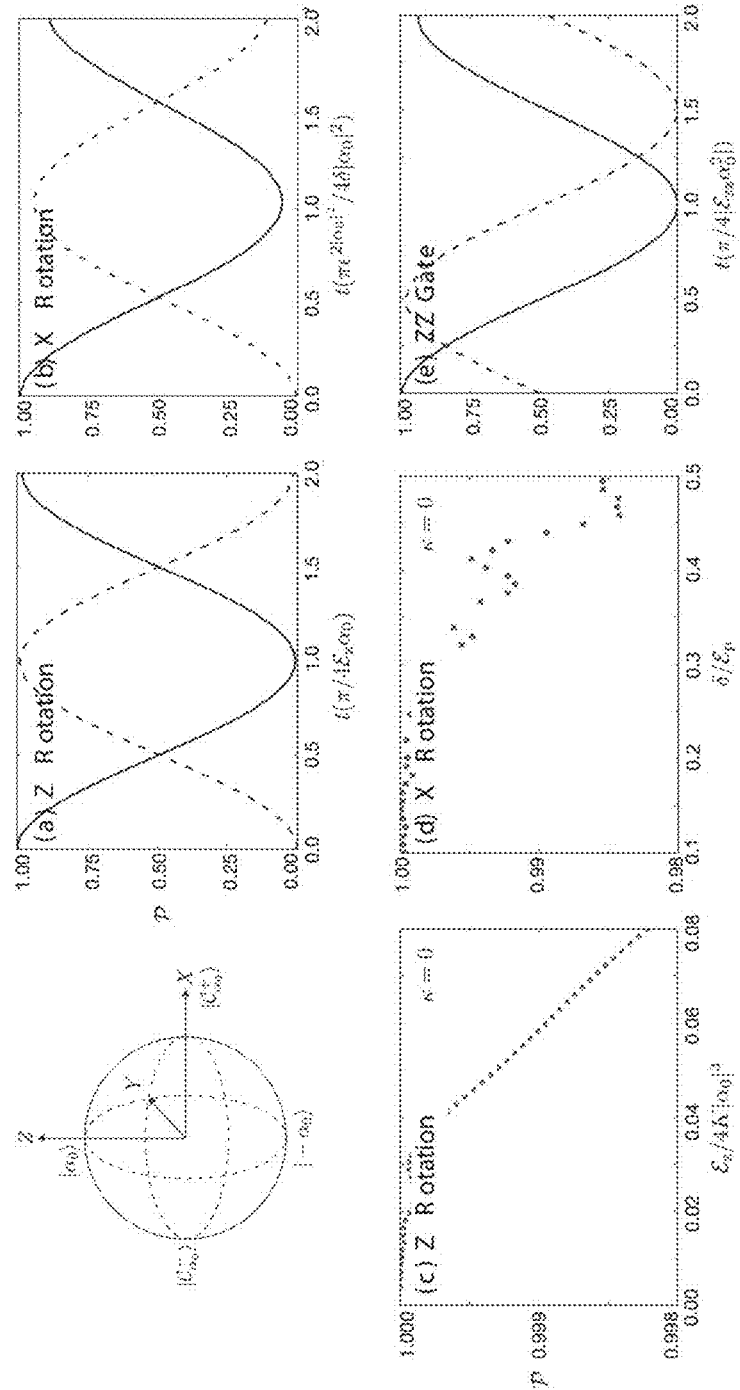
FIG. 9. (a) represents probability for the system to be in state $|\mathcal{C}_{\alpha_0}^+\rangle$ (solid) and $|\mathcal{C}_{\alpha_0}^-\rangle$ (dashed) for $\varepsilon_p=4K$, $\varepsilon=0.8K$, $\alpha_0=2$. (b) represents probability for the system to be in state $|\alpha_0\rangle$ (solid) and $|-\alpha_0\rangle$ (dashed) for $\varepsilon_p=K$, $\delta=K/3$, $\alpha_0=1$. Single photon loss for the simulations (a,b) is $\kappa=K/250$. (c) represents probability for the system to be in the state $|\mathcal{C}_{\alpha_0}^-\rangle$ at time $T=\pi/4\varepsilon_z\alpha_0$ when it was initialized to the state $|\mathcal{C}_{\alpha_0}^+\rangle$ at $t=0$. (d) represents probability for the system to be in the state $|\alpha_0\rangle$ at time $T=\pi/4\delta|\alpha_0|^2 \exp(-2|\alpha_0|^2)$ when it was initialized to the state $|-\alpha_0\rangle$ at $t=0$. (e) represents probability for the system to be in state $|\alpha, \alpha\rangle+|\alpha, -\alpha\rangle+|-\alpha, \alpha\rangle+|-\alpha, -\alpha\rangle$ (solid) and $|\alpha, \alpha\rangle+i|\alpha, -\alpha\rangle+i|-\alpha, \alpha\rangle+|-\alpha, -\alpha\rangle$ (dashed) for $\varepsilon_p=4K$, $\varepsilon_{zz}=K/5$, $\alpha_0=2$. Single photon loss for the simulations is $\kappa=K/250$. The Bloch sphere is shown on the top left to illustrate the rotation axis.

Details on the performance of the single qubit $\hat{R}_z(\theta)$, $\bar{R}_x(\theta)$ and two-qubit gate are now presented. FIG. 9a) shows the probability for the system to be in the state $|\mathcal{C}\alpha_0^-\rangle$ under evolution of the system with $H_0 + \hat{H}_z$ and single-photon loss for the system initially in $|\mathcal{C}_{\alpha_0}^=\rangle$. As expected, the probability shows a period of $\pi/4\varepsilon_z\alpha_0$. In the same way, FIG. 9b) shows the probability for the system to be in the $|-\alpha_0\rangle$ state under evolution of the system with $H_0 + \hat{H}_x$ and single-photon loss for the system initially in $|\alpha_0\rangle$. Again as expected, the probability shows a period of $\pi e^{2|\alpha_0|^2}/4\delta_x|\alpha_0|^2$.

As we saw in sections VI and VI, the mapping of the eigenstates to the coherent states $|\pm\alpha_0\rangle$ is valid only when $\varepsilon_z \ll 4K|\alpha_0|^3$ and $\delta \ll 2\varepsilon p$. As a result, the gate performance depends on $\varepsilon_z/4K|\alpha_0|^3$ and $\delta/\varepsilon_p$. To demonstrate this, FIG. 9c) shows the probability of the system, initialized to $|\mathcal{C}_{\alpha_0}^+\rangle$ at t=0, to be in the state $|\mathcal{C}_{\alpha_0}^-\rangle$ after a time T=$\pi$/4$\varepsilon_z\alpha_0$. The strength of the two-photon drive is fixed to $\varepsilon_p$=4K and to take into account the errors induced only due to large $\varepsilon_z$ we use $\kappa$=0. Similarly, FIG. 9d) shows the probability of the system, initialized to $|\alpha_0\rangle$ at t=0, to be in the state $|-\alpha_0\rangle$ after a time T=$\pi$/4$\delta|\alpha_0|^2$ exp($-2|\alpha_0|^2$), with $\varepsilon_p$=K and $\kappa$=0. As the figures indicate, with increasing $\varepsilon_z$ and $\delta$ the probability of achieving a perfect Z and X rotation decreases respectively. The small oscillations in the probability show that the eigenstates of the Hamiltonian are no longer coherent states. Finally, for the entangling gate the system initialized to the product state $|\mathcal{C}_{\alpha_0}^+\rangle \otimes |\mathcal{C}_{\alpha_0}^+\rangle$. FIG. 9(e) shows the time evolution of the probability for the system to be in the entangled state $|\psi_e\rangle=|\alpha_0,\alpha_0\rangle+i|\alpha_0,-\alpha_0\rangle+i|-\alpha_0,\alpha_0\rangle+|-\alpha_0,-\alpha_0\rangle$ and the expected periodicity, $\pi/8|\varepsilon z_z\alpha_0^2|$, is observed.

Fidelity of a Cat State in KNR with and without Two-Photon Drive

Figure 10:
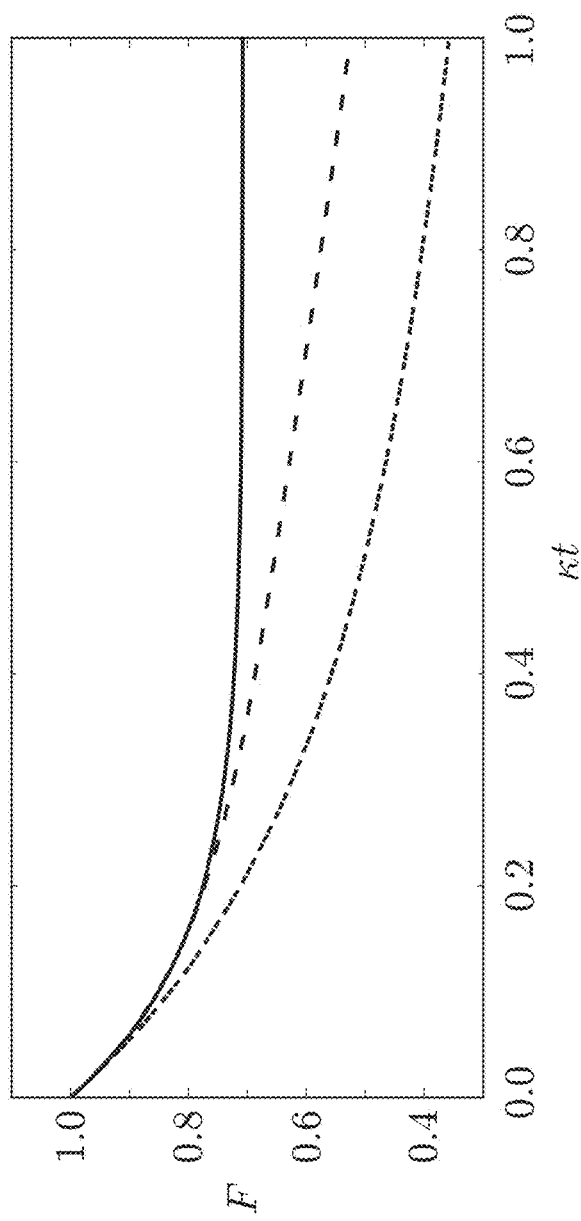
FIG. 10 represents time dependence of the fidelity of the cat state, with $\kappa \neq 0$, $K=0$, $\varepsilon_p=0$ (dashed line), $K=20\kappa$, $\varepsilon_p=0$ (triple-dash line), and $K=20$, $\varepsilon_p=4K$ (solid line).

As presented above, the fidelity of a cat state decreases faster in a KNR compared to a linear one. This is illustrated in FIG. 10 which compares the time-decay of the fidelity of a cat state $|\mathcal{C}_2^+\rangle$ initialized in a linear resonator (dashed line) and KNR (triple-dashed line) with single-photon loss. In order to account only for non-deterministic errors, the fidelity in the lossy KNR is defined with respect to that of a lossless KNR. The cat state can be stabilized against Kerr-induced rotation and dephasing by the application of a two-photon drive chosen such that its amplitude $\varepsilon_p$ satisfies Eq.(3) in the main text. This is confirmed by the time dependence of fidelity in FIG. 10 (solid line). As explained above, in a two-photon driven Kerr-resonator, a single-photon loss will only cause random jumps between the cat state $|\mathcal{C}_\alpha^\pm\rangle$ i.e., there is no energy relaxation, resulting in higher state fidelity than a linear cavity.

qcMAP Gate with Two-Photon Driving qcMAP gate protocol can be used to generate FIG. 4. The qubit is initialized to $(|e\rangle+|g\rangle)/\sqrt{2}$ and the resonator to the coherent state $|\alpha_0\rangle$ (for simplicity we assume that $\alpha_0$ is a real number). The qubit and the resonator interact for a time $T_{gate}$ according to the ideal dispersive interaction $\hat{H}_{disp}$=g$^2$/$\Delta \hat{a}^\dagger\hat{a}\hat{\sigma}_z$, the full Jaynes-Cummings interaction, $\hat{H}_{j.c}$=$\Delta\hat{\sigma}_z$+g$(\hat{a}^\dagger\hat{\sigma}_-+\hat{a}\hat{\sigma}_+)$ or the full JC interaction with two photon drive $\hat{H}_c=\hat{H}_{j.c}-(\varepsilon_p\hat{a}^{\dagger 2}+\varepsilon_p^*\hat{a}^2)$. During this first step, the qubit and resonator ideally evolve to the entangled state $(|\alpha_0,g\rangle+|-\alpha_0,e\rangle)$ ignoring normalization. Next, an ideal displacement operation D($\alpha_0$) transforms the state to $(|2\alpha_0, g\rangle+|0, e\rangle)$. This is followed by an ideal qubit rotation conditioned on the number of photons in the resonator which is applied to disentangle the qubit from the resonator. This leaves the system in $(|2\alpha_0\rangle+|0\rangle)\otimes|g\rangle$. Finally, an ideal displacement of the resonator by $-\alpha_0$ results in the cat state $|\alpha_0\rangle+|-\alpha_0\rangle$. The Wigner function of this final state is shown in FIG. 4. In the simulations, we used the parameters: g/2$\pi$=111.4 MHz, $\Delta$/2$\pi$=1.59 GHz, $\kappa$/2$\pi$=7 KHz, $\varepsilon_p$=$\varepsilon_p^0 e^{i\phi}$, $\varepsilon_p^0$/2$\pi$=557 KHz and $\phi$=$\pi$/2.

In order get an understanding for the phase and amplitude of the required two-photon drive, we examine $\hat{H}_c$ by expanding the Jaynes-Cummings interaction to the fourth order $$\hat{H}_c = \Delta\hat{\sigma}_z + \frac{g^2}{\Delta}\hat{a}^\dagger\hat{a}\hat{\sigma}_z - \frac{g^4}{\Delta^3}(\hat{a}^\dagger\hat{a})^2\hat{\sigma}_z - (\varepsilon_p^*\hat{a}^2 + \varepsilon_p\hat{a}^{\dagger 2}) \sim \Delta\hat{\sigma}_z + \quad (32)$$

-continued
$$\frac{g^2}{\Delta}\hat{a}^\dagger\hat{a}\hat{\sigma}_z - \frac{g^4}{\Delta^3}\hat{a}^{\dagger 2}\hat{a}^2\hat{\sigma}_z - (\varepsilon_p^*\hat{a}^2 + \varepsilon_p\hat{a}^{\dagger 2}),$$

where we have assumed $g^2/\Delta - g^4/\Delta^3 \sim g^2/\Delta$. To simplify the discussion, we now replace $\hat{\sigma}_z$ by its average value in the above expressions. In other words, we consider an infinite $T_1$ qubit. Going to a rotating frame, the above Hamiltonian then takes the form $$\hat{H}_c = -\frac{g^4}{\Delta^3}\hat{a}^{\dagger 2}\hat{a}^2\langle\hat{\sigma}_z\rangle - (\varepsilon_p^*\hat{a}^2 e^{i(g^2/\Delta)\langle\hat{\sigma}_z\rangle t} + \varepsilon_p\hat{a}^{\dagger 2}e^{-i(g^2/\Delta)\langle\hat{\sigma}_z\rangle t}). \quad (33)$$

We are interested in time $T_{gate}$ such that the coherent states have rotated by $\pm\pi/2$ depending on the state of the qubit, i.e., $(g^2/\Delta)T_{gate}=\pi/2$. At this particular time, the above Hamiltonian reads $$\hat{H}_c = -K\hat{a}^{\dagger 2}\hat{a}^2\langle\hat{\sigma}_z\rangle - (\varepsilon_p^*\hat{a}^2 e^{i\pi\langle\hat{\sigma}_z\rangle/2}+\varepsilon_p\hat{a}^{\dagger 2}e^{-i\pi\langle\hat{\sigma}_z\rangle/2}) \quad (34)$$

where $K=g^4/\Delta^3$ and $\langle\hat{\sigma}_z\rangle_z=\pm 1$. By comparing the above Hamiltonian with that of Eq.(1) of the main paper, we find that a two photon drive of amplitude $\varepsilon_p=-K\alpha_0^2$ will ensure that the coherent states $|\pm\alpha_0\rangle$ or $(|\alpha_0, g\rangle+|-\alpha_0, e\rangle)$ with the qubits) are the eigenstates of the Hamiltonian. In practice, the amplitude of $|\varepsilon_p|$ in the numerical simulations is slightly smaller than that predicted here because of the higher-order contributions of the Jaynes-Cummings Hamiltonian.

Demonstration RE Scalability for Quantum Annealing

Adiabatic Protocol for Quantum Annealing:

Quantum annealing can be executed with the time-dependent Hamiltonian $$\hat{H}(t) = \left(1-\frac{t}{\tau}\right)\hat{H}_i + \left(\frac{t}{\tau}\right)\hat{H}_p, \quad (35)$$

where $\hat{H}_i$ is the initial trivial Hamiltonian whose ground state is known, and $\hat{H}_p$ is the final Hamiltonian at t=$\tau$ which encodes an Ising spin problem:

$$\hat{H}_p = \Sigma_{i>j}^N J_{i,j}\hat{\sigma}_{z,i}\hat{\sigma}_{z,j}$$

Here, $\hat{\sigma}_{z,i}=|1\rangle\langle 1|-|0\rangle\langle 0|$ is the Pauli-z matrix for the i$^{th}$ spin and $J_{i,j}$ is the interaction strength between the i$^{th}$ and j$^{th}$ spin. Crucially, the initial and final Hamiltonian do not commute. For simplicity, we have assumed a linear time dependence, but more complex annealing schedules can be used. The system, initialized to the ground state of $\hat{H}_i$, adiabatically evolves to the ground state of the problem Hamiltonian, $\hat{H}_p$ at time t=$\tau \gg 1/\Delta_{min}$, where $\Delta_{min}$ is the minimum energy gap.

Single Spin in a Two-Photon Driven Kerr-Nonlinear Resonator

Figure 11:
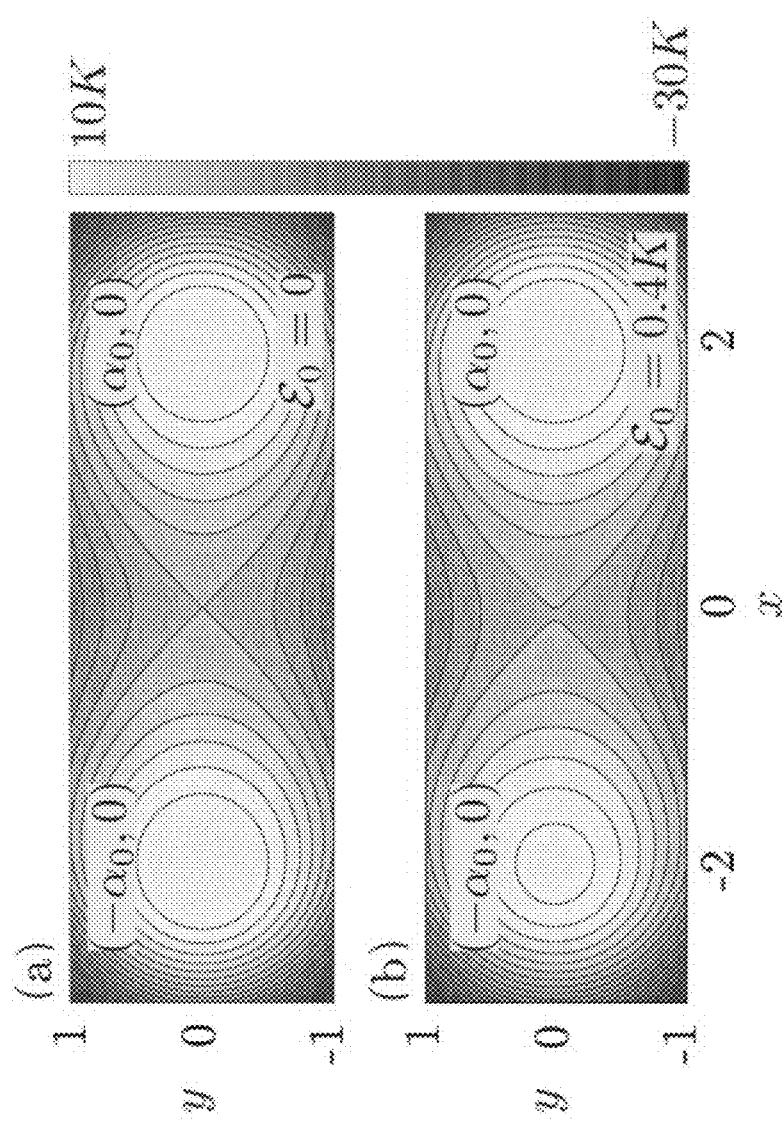
FIG. 11 represents the contour plot of the metapotential corresponding to $\hat{H}_p=-K\hat{a}^{\dagger 2}\hat{a}^2+\varepsilon_p(\hat{a}^{\dagger 2}+\hat{a}^2)+\varepsilon_0(\hat{a}^\dagger+\hat{a})$, with $\varepsilon_p=4K$ and (a) $\varepsilon_0=0$, (b) $\varepsilon_0=0.4K$. The metapotentials, shown in the units of the Kerr-nonlinearity, are characterized by (a) two peaks of equal heights corresponding to the degenerate states $|\bar{0}\rangle$ and $|\bar{1}\rangle$, and (b) two peaks of different heights, indicating lifting of degeneracy between the encoded spin states $|\bar{0}\rangle$ and $|\bar{1}\rangle$.

The Hamiltonian of a two-photon driven KNR in a frame rotating at the drive frequency is given by $\hat{H}_0=-K\hat{a}^{\dagger 2}\hat{a}^2+\varepsilon_p(\hat{a}^{\dagger 2}+\hat{a}^2)$, where K is the Kerr-nonlinearity and $\varepsilon_p$ the strength of the two-photon drive. In a KNR, the coherent states $|\pm\alpha_0\rangle$, which are eigenstates of the photon annihilation operator, are stabilized by the two-photon drive with $\alpha_0=\approx\varepsilon_p/K^{15}$. This statement can be visualized more intuitively by considering the metapotential obtained by replacing the operators $\hat{a}$ and $\hat{a}^\dagger$ with the complex classical variables z+iy and x-iy in the expression for $\hat{H}_0$. As shown in FIG. 11a, this metapotential is an inverted double well with two peaks of equal height at ($\pm\alpha_0$, 0), corresponding to two stable points (see Supplementary Notes). This is consistent with the quantum picture according to which the coherent states $|\pm\alpha_0\rangle$ are two degenerate eigenstates of $\hat{H}_0$ with eigenenergy $\varepsilon_p^2/K$ (see Methods below). Taking advantage of this well-defined two-state subspace, we choose to encode an Ising spin $\{|\bar{0}\rangle, |\bar{1}\rangle\}$ in the stable states $\{|-\alpha_0\rangle, |\alpha_0\rangle\}$. Importantly, this mapping is robust against single-photon loss from the resonator when the rate of single-photon loss is small $\kappa \ll 8\varepsilon_p$, a condition than can readily be realized in superconducting circuits. Moreover, the photon jump operator $\hat{a}$ leaves the coherent states invariant $\hat{a}|\bar{0}/\bar{1}\rangle = \pm\alpha_0|\bar{0}/\bar{1}\rangle$. As a result, if the amplitude $\alpha_0$ is large such that $\langle\bar{0}/\bar{1}|\hat{a}|\bar{1}/\bar{0}\rangle = \mp\alpha_0 e^{-2|\alpha_0|^2} \sim 0$, a single photon loss does not lead to a spin-flip error.

Having defined the spin subspace, we now discuss the realization of a problem Hamiltonian in this system. As an illustrative example, we first address the trivial problem of finding the ground state of a single spin in a magnetic field. Consider the Hamiltonian of a two-photon driven KNR with an additional weak single-photon drive of amplitude $\varepsilon_0$, $\hat{H}_p = -K\hat{a}^{\dagger 2}\hat{a}^2 + \varepsilon_p(\hat{a}^{\dagger 2} + \hat{a}^2) + \varepsilon_0(\hat{a}^\dagger + \hat{a})$. As illustrated in FIG. 11b for small $\varepsilon_0$, under this drive, the two peaks located at $(\pm\alpha_0, 0)$ in the metapotential associated to $\hat{H}_p$ are now of unequal height with the peak at $(-\alpha_0, 0)$ lower than the one at $(\alpha_0, 0)$ if $\varepsilon_0 > 0$, and vice versa for $\varepsilon_0 < 0$. These two states remain stable, but have different energies, indicating that the single-photon drive induces an effective magnetic field on the Ising spins $\{|\hat{0}\rangle, |\bar{1}\rangle\}$. Indeed, a full quantum analysis shows that if $|\varepsilon_0| \ll 4K|\alpha_0|^3$, then $|\pm\alpha_0\rangle$ remain the eigenstates of $\hat{H}_p$ but their degeneracy is lifted by $4\varepsilon_0\alpha_0$. In other words, in the spin subspace, $\hat{H}_p$ can be expressed as $\hat{H}_p = 2\varepsilon_0\alpha_0\hat{\bar{\sigma}}_z + $ const., with $\hat{\bar{\sigma}}_z = |\bar{1}\rangle\langle\bar{1}| - |\bar{0}\rangle\langle\bar{0}|$. This is the required problem Hamiltonian for a single spin in a magnetic field. This simple observation will play an essential role in the implementation of the LHZ scheme discussed below. Note that for larger $\varepsilon_0$, the eigenstates can deviate from coherent states (see Supplementary Notes below). Choosing $|\varepsilon_0| \ll 4K|\alpha_0|^3$, however, ensures that $\{|\bar{0}\rangle, |\bar{1}\rangle\}$ are indeed coherent states to an excellent approximation, such that $\langle\bar{0}/\bar{1}|\hat{a}|\bar{1}/\bar{0}\rangle \sim 0$ and the encoded subspace remains well protected from the photon loss channel.

Following Eq. (35), we require an initial Hamiltonian which does not commute with the final problem Hamiltonian and which has a simple non-degenerate ground state. This is achieved by introducing a finite detuning $\delta_0 > 0$ between the drives and resonator frequency. In a frame rotating at the frequency of the drives, the initial Hamiltonian is chosen as $\hat{H}_i = \delta_0 \hat{a}^\dagger \hat{a} - K\hat{a}^{\dagger 2}\hat{a}^2$ with $\delta_0 < K$. This choice of initial Hamiltonian generates large phase fluctuations that helps maximize quantum tunneling to states with well-defined phase at the final stages of the adiabatic evolution. In this frame, the ground and first excited states are the vacuum $|0\rangle$ and single-photon Fock state $|n=1\rangle$, respectively, and which are separated by an energy gap $\delta_0$. If a photon is lost from the resonator, the excited state $|n=1\rangle$ decays to the ground state $|0\rangle$ which, on the other hand, is invariant under photon loss. Since it is simple to prepare in the superconducting circuit implementation that we consider below, the vacuum state is a natural choice for the initial state.

Figure 12:
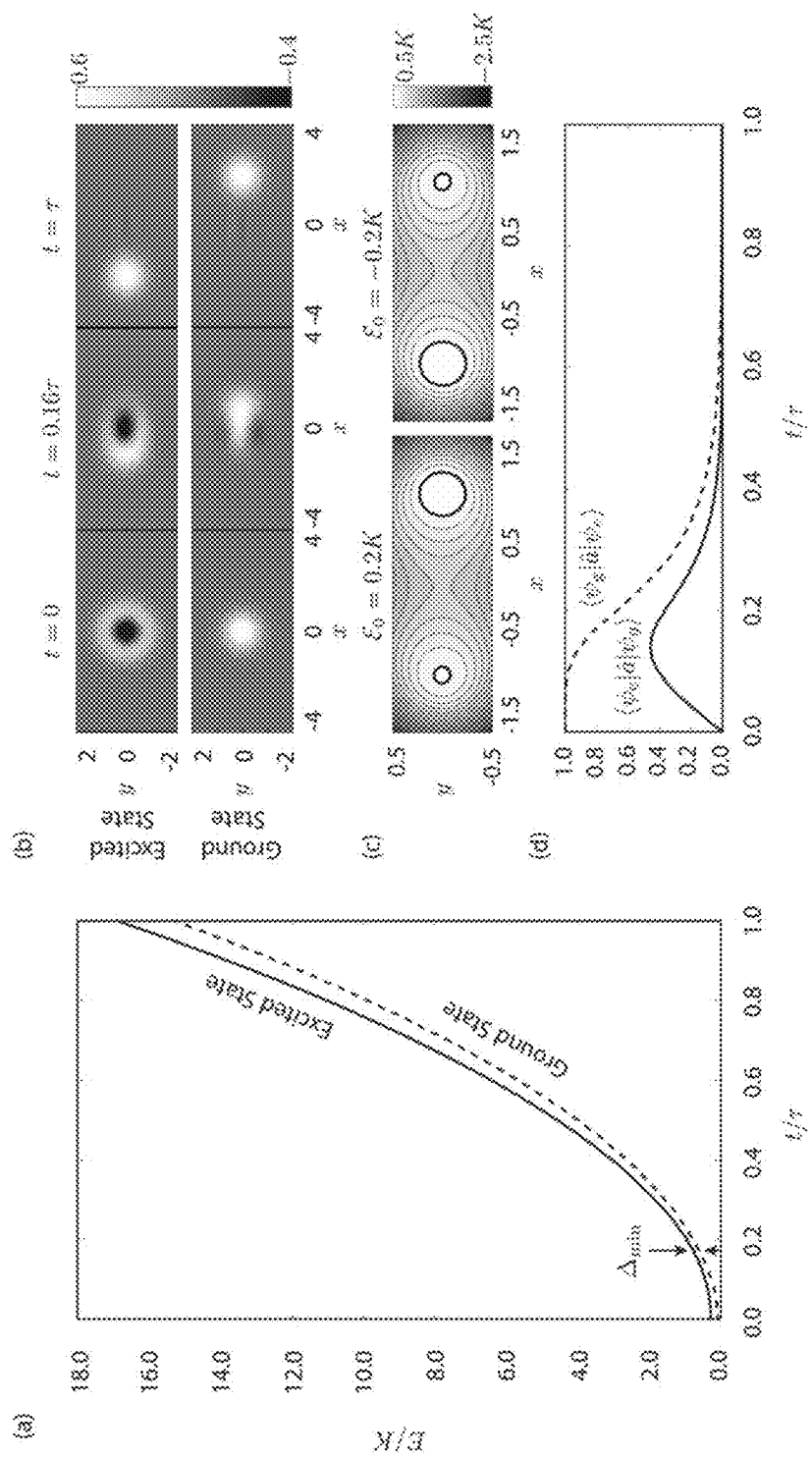
FIG. 12 represents adiabatic protocol with single spin. (a) represents change of the energy of the ground and first excited state as a function of time in a single resonator for $\varepsilon_p=4K$, $\varepsilon_0=0.2K$ and $\delta_0=0.2K$. The minimum energy gap is also shown with $\Delta_{min}=0.16K$. (b) represents the Wigner function of the KNR state at three different times when initialized to either the excited $|n=1\rangle$ or (vacuum) ground state $|0\rangle$, respectively. (c) represents petapotential corresponding to $\hat{H}_1$ ($t=0.2\tau$) with $\varepsilon_0=0.2K$ and $\varepsilon_0=-0.2K$ showing two peaks of unequal height. The lower peak (corresponding to the ground state) is circular, whereas the higher one (corresponding to the excited state) is deformed as highlighted by circles. (d) represents transition matrix elements between the ground $|\psi_g(t)\rangle$ and excited states $|\psi_e(t)\rangle$ in the event of a photon jump during the adiabatic protocol.

The time-dependent Hamiltonian required for the adiabatic computation can be realized by slowly varying the two- and single-photon drive strengths and detuning so that $\hat{H}_1(t) = (1-t/\tau)\hat{H}_i + (t/\tau)\hat{H}_p$, realizing Eq.(35) for a single-spin. Note that the form of $\hat{H}_1(t)$ conveniently ensures that the nonlinear Kerr term is time-independent. The time-dependent detuning is achieved by tuning the single- and two-photon drive frequencies (see Methods below). By adiabatically controlling the frequency and amplitude of the drives it is possible to evolve the state of the KNR from the vacuum $|0\rangle$ at $t=0$, to the ground state of a single Ising spin in a magnetic field at $t=\tau$. FIG. 12a shows the change of the energy landscape throughout this evolution found by numerically diagonalizing the instantaneous Hamiltonian $\hat{H}_1(t)$ for $\varepsilon_p = 4K$, $\alpha_0 = 2$, $\varepsilon_0 = 0.2K$ and $\delta_0 = 0.2K$. The minimum energy gap $\Delta_{min}$ is indicated. As illustrated by the Wigner functions in the FIG. 12b, a resonator initialized to the vacuum state at $t=0$ evolves through highly non-classical and non-Gaussian states towards the ground state $|\bar{0}\rangle$ at $t=\tau$, with $\tau \sim 30/\Delta_{min}$ in this example. If, on the other hand, the KNR is initialized to the single-photon Fock state at $t=0$, then it evolves to the first excited state $|\bar{1}\rangle$ at $t=\tau$. The average probability to reach the correct ground state is 99.9% for both $\varepsilon_0 > 0$ and $\varepsilon_0 < 0$. The 0.1% probability of erroneously ending in the excited state arises from non-adiabatic errors and can be reduced by increasing the evolution time. For example, for $\tau = 60/\Delta_{min}$ we find a success probability of 99.99%.

Effect of Single-Photon Loss:

An appealing feature of this implementation is that, at the start of the adiabatic protocol, the ground (vacuum) state is invariant under single-photon loss. Similarly, at the end of the adiabatic protocol at $t=\tau$, irrespective of the problem Hamiltonian (i.e., $\varepsilon_0 > 0$ or $\varepsilon_0 < 0$) the ground state (coherent states $|\bar{0}\rangle$ or $|\bar{1}\rangle$) is also invariant under single-photon loss. It follows that towards the beginning and end of the protocol, photon loss will not induce errors. Moreover, even at intermediate times $0 < t < \tau$, the ground state of $\hat{H}_1(t)$ remains largely unaffected by photon loss. This can be understood intuitively from the distortion of the metapotential, as shown in FIG. 12c at $t=0.2\tau$ for the same parameters as FIG. 12a. While the metapotential still shows two peaks, the region around the lower peak (corresponding to the ground state) is a circle whereas that around the higher peak (corresponding to the excited state) is deformed. This suggests that the ground state is closer to a coherent state and, therefore, more robust to photon loss than the excited state (see also Supplementary Notes below). Quantitatively, the effect of single-photon loss is seen by numerically evaluating the transition matrix elements $\langle\psi_g(t)|\hat{a}|\psi_e(t)\rangle$, $\langle\psi_e(t)|\hat{a}|\psi_g(t)\rangle$ for the duration of the protocol, where $|\psi_g(t)\rangle$ and $|\psi_e(t)\rangle$ are the ground and excited state of $\hat{H}_1(t)$ respectively. As shown in FIG. 12d, the transition from the ground to excited state is greatly suppressed throughout the whole adiabatic evolution. This asymmetry in the transition rates distinguishes AQC with two-photon driven KNRs from implementations with qubits, something that will be made even clearer below with examples.

Two Coupled Spins with Driven KNRs:

Before going to larger lattices, consider the problem of two interacting spins embedded in a system of two linearly coupled KNRs, each driven by a two-photon drive and given by the Hamiltonian $\hat{H}_p = \Sigma_{k=1}^2 [-K\hat{a}_k^{\dagger 2}\hat{a}_k^2 + \varepsilon_p(\hat{a}_k^{\dagger 2} + \hat{a}_k^2)] + J_{1,2}(\hat{a}_1^\dagger \hat{a}_2 + \hat{a}_2^\dagger \hat{a}_1)$. Here, $J_{1,2}$ is the amplitude of the single-photon exchange coupling and, for simplicity, the two resonators are assumed to have identical parameters. For small $J_{1,2}$, this Hamiltonian can be expressed in the $\{|\bar{0}\rangle, |\bar{1}\rangle\}$ basis as the problem Hamiltonian[15]

$\hat{H} = 4J_{1,2}|\alpha_0|^2 \hat{\bar{\sigma}}_{z,1}\hat{\bar{\sigma}}_{z,2} + $ const. The nature of the interaction is encoded in the phase of the coupling with $J_{1,2} < 0$ ($J_{1,2} > 0$) corresponding to the ferromagnetic (anti-ferromagnetic) case. For the initial Hamiltonian, we take $\hat{H}_i = \Sigma_k (\delta_0 \hat{a}_k^\dagger \hat{a}_k - K\hat{a}_k^{\dagger 2}\hat{a}_k^2) + J_{1,2}(\hat{a}_1^\dagger \hat{a}_2 + \hat{a}_2^\dagger \hat{a}_1)$ and, following Eq.(35), the full time-dependent Hamiltonian for the two-spin problem is $\hat{H}_2(t) = (1-t/\tau)\hat{H}_i + (t/\tau)\hat{H}_p$.

Although it is possible to tune these parameters in time, with the above form of $\hat{H}_2(t)$, both the linear coupling and the Kerr nonlinearity are fixed throughout the adiabatic evolution.

The ground state of $\hat{H}_2(0)$ is the vacuum state if the initial detuning is greater than the single-photon exchange rate, $\delta_0 > J_{1,2}$. On the other hand, at $t=\tau$, the two degenerate ground states for anti-ferromagnetic (ferromagnetic) coupling are $\{|\bar{0},\bar{1}\rangle, |\bar{1},\bar{0}\rangle\}$ ($\{|\bar{0},\bar{0}\rangle, |\bar{1},\bar{1}\rangle\}$). Accordingly, numerical simulations with both resonators initialized to vacuum show the coupled system to reach the entangled state $\mathcal{N}(|\bar{0},\bar{1}\rangle+|\bar{1},\bar{0}\rangle)$ and $\mathcal{N}(|\bar{0},\bar{0}\rangle+|\bar{1},\bar{1}\rangle)$, under anti-ferromagnetic and ferromagnetic coupling, respectively. In these expressions, $\mathcal{N}=1/\sqrt{2(1+e^{-4|\alpha_0|^2})}$ is a normalization constant. With the realistic parameters $\tau=50/\Delta_{min}$, $\delta_0=K/4$, $J_{1,2}=K/10$ and $\varepsilon_p^0=2K$, corresponding to $\alpha_0=\sqrt{2}$, the state fidelity is 99.9%. Moreover, the probability that the system is in any one of the states $|\bar{0}/\bar{1},\bar{0}/\bar{1}\rangle$ is 99.99%, showing that the evolution is to a very good approximation restricted to this computational subspace.

While the states used in this encoding are tolerant to photon loss, coherence between a superposition of those states is reduced. However the success probability (see Methods) in solving the Ising problem remains high as it depends only on the diagonal elements of the density matrix (e.g., $\langle\bar{1},\bar{1}|\hat{\rho}(\tau)|\bar{0},\bar{1}\rangle$). As an illustration, with the large loss rate $\kappa=50/\tau$, while the fidelity of the final state to the desired superposition $\mathcal{N}(|\bar{0},\bar{0}\rangle+|\bar{1},\bar{1}\rangle)$ or $\mathcal{N}(|\bar{0},\bar{1}\rangle+|\bar{1},\bar{0}\rangle)$ decreases to 37.6%, the average success probability of the algorithm is 75.2%.

To characterize the effect of noise, a useful figure of merit is the ratio $\Delta_{min}/\kappa$ of the minimum energy gap to the loss rate. The dependence of the average success probability on this ratio is presented in FIG. 13 for the algorithm implemented using KNRs (circles) with single-photon loss $\kappa$ or qubits (squares) with pure dephasing $\gamma\phi$. In practice, the average success probability is computed by varying the loss rates at fixed $\Delta_{min}$ and $\tau=20/\Delta_{min}$, and is averaged over all instances of the problem of two coupled spins (i.e., ferromagnetic and anti-ferromagnetic). In the presence of pure dephasing, the success probability with qubits saturates to 50% for large $\gamma\phi$. This is a consequence of the fact that the steady state of the qubits is an equal weight classical mixture of all possible computational states. On the other hand, for KNRs with a finite $\kappa$, the rate at which the instantaneous ground state jumps to the excited state ($\propto\langle\psi_e(t)|\hat{a}|\psi_g(t)\rangle$) is small compared to the rate at which the instantaneous excited state jumps to the ground state ($\propto\langle\psi_g(t)|\hat{a}|\psi_e(t)\rangle$). As a result, even with large single-photon loss rate, for example $\Delta_{min}/\kappa \sim 1$, the success probability is ~75%. Consequently, in the presence of equivalent strength noise, a two-photon driven KNR implementation of AQC has superior performance compared to a qubit implementation (see Methods below for details).

All-to-all Connected Ising Problem with the LHZ Scheme:

The above scheme can be scaled up with pairwise linear couplings in a network of KNRs, while still requiring only single-site drives. However, unlike the above one- and two-spin examples, most optimization problems of interest require controllable long-range interactions between a large number of Ising spins.

Realizing such highly non-local Hamiltonian is a challenging hardware problem, but it may be addressed by embeddings such as the LHZ scheme that map the Ising problem on a graph with local interactions only. In this approach, the relative configuration of pairs of N logical spins is mapped to $M=N(N-1)/2$ physical spins. A pair of logical spins, in which both spins are aligned $|0,0\rangle$ or $|1,1\rangle$ (or anti-aligned $|0,1\rangle$ or $|1,0\rangle$), is mapped on the two levels of the physical spin. The coupling between the logical pairs $J_{i,j}$ (i=1, ... N) is encoded in local magnetic fields on the physical spins $J_k$ (k=1, ... M). For a consistent mapping, M−N+1 energy penalties in the form of four-body coupling are introduced to enforce an even number of spin-flips around any closed loop in the logical spins. A fully connected graph can then be encoded in a planar architecture with only local connectivity. The problem Hamiltonian in the physical spin basis becomes $\hat{H}_p^{LHZ,N}=\Sigma_{k=1}^M J_k\hat{\sigma}_{z,k}-\Sigma_{\langle i,j,k,l\rangle}\mathcal{C}\,\hat{\sigma}_{z,i}\hat{\sigma}_{z,j}\hat{\sigma}_{z,k}\hat{\sigma}_{z,l}$, where $\langle i,j,k,l\rangle$ denotes the nearest-neighbour spins enforcing the constraint.

A circuit QED platform can implement the LHZ scheme by embedding the physical spins in the eigenbasis $\{|\hat{0}\rangle,|\hat{1}\rangle\}$ of two-photon driven KNRs. In practice, KNRs can be realized as a superconducting microwave resonator terminated by a flux-pumped SQUID. The non-linear inductance of the SQUIDs induces a Kerr nonlinearity, and a two-photon drive is introduced by flux-pumping at twice the resonator frequency. This setup can be used to realize Josephson parametric amplifiers (JPAs), and we will therefore refer to this implementation of a Kerr nonlinear resonator as a JPA in the text which follows. A quantum annealing platform can be built with groups of four JPAs of frequencies $\omega_{r,i}$ (i=1, 2, 3, 4) interacting via a single Josephson Junction (JJ) as illustrated in FIG. 14a. To realize a time-dependent two-photon drive, the SQUID loop of each JPA is driven by a flux pump with tunable amplitude and frequency. The pump frequency is varied close to twice the resonator frequency, $\omega_{p,k}(t) \simeq 2\Omega_{r,i}$ (see Methods below). Additional single-photon drives, whose amplitude and frequency can be varied in time, are also applied to each of the JPAs and play the role of effective local magnetic fields. Local four-body couplings are realized through the nonlinear inductance of the central JJ, see Supplementary Notes below. Choosing $\omega_{p,k}(t)+\omega_{p,l}(t)=\omega_{p,m}(t)+\omega_{p,n}(t)$ and taking the resonators to be detuned from each other, the central JJ induces a coupling of the form $-\mathcal{C}(\hat{a}_k^\dagger\hat{a}_l^\dagger\hat{a}_m\hat{a}_n+\text{h.c.})$ in the instantaneous rotating frame of the two-photon drives. This four-body interaction is an always-on coupling and its strength $\mathcal{C}$ is determined by the JJ nonlinearity. Such a group of four JPAs, which we will refer to as a plaquette, is the central building block of our architecture and can be scaled in the form of the triangular lattice required to implement the LHZ scheme. Note that while JPAs within a plaquette have different frequencies, only four distinct JPA frequencies are required for the entire lattice as illustrated in FIG. 14c. Lastly, the LHZ scheme also requires additional N−2 physical spins at the boundary that are fixed to the up state and which are implemented in our scheme as JPAs stabilized in the eigenstate $|\hat{1}\rangle$ by two-photon drives. As an illustration, FIG. 14b depicts all the possible interactions in an Ising problem with N=5 logical spins and FIG. 14c shows the corresponding triangular network of coupled JPAs. To implement the adiabatic protocol for a general N-spin Ising problem with the triangular network of M JPAs, the time-dependent Hamiltonian in a frame where each of the JPAs rotate at the instantaneous drive frequency can be written as $$\hat{H}^{LHZ,N}(t) = \left(1-\frac{t}{\tau}\right)\hat{H}_i + \left(\frac{t}{\tau}\right)\hat{H}_p^{LHZ} + \hat{H}_{fixed}, \quad (36)$$

-continued where $$\hat{H}_i = \sum_{k=1}^{M} \left( \delta_0 \hat{a}_k^\dagger \hat{a}_k - K \hat{a}_k^{\dagger 2} \hat{a}_k^2 \right) - C \sum_{\substack{\langle k,l,m,n \rangle \in \\ \text{plaquette}}} \left( \hat{a}_k^\dagger \hat{a}_l^\dagger \hat{a}_m \hat{a}_n + h.c. \right), \quad (37)$$

$$\hat{H}_p^{LHZ} = \sum_{k=1}^{M} \left\{ -K \hat{a}_k^{\dagger 2} \hat{a}_k^2 + \varepsilon_p \left( \hat{a}_k^{\dagger 2} + \hat{a}_k^2 \right) + J_k \left( \hat{a}_k^\dagger + \hat{a}_k \right) \right\} -$$

$$C \sum_{\substack{\langle k,l,m,n \rangle \in \\ \text{plaquette}}} \left( \hat{a}_k^\dagger \hat{a}_l^\dagger \hat{a}_m \hat{a}_n + h.c. \right),$$

$$\hat{H}_{fixed} = \sum_{k=M+1}^{M+N-2} -K \hat{a}_k^{\dagger 2} \hat{a}_k^2 + \varepsilon_p \left( \hat{a}_k^{\dagger 2} + \hat{a}_k^2 \right).$$

As mentioned above, M=N(N−1)/2 while $J_k$ is the single-photon drive which induces the local effective magnetic field on the $k^{th}$ resonator and $\mathcal{C}$ is the local four-body coupling between the resonators. A final necessary component for a quantum annealing architecture is readout of the state of the physical spin. Here, this is realized by standard homodyne detection which can resolve the two coherent states $|\pm\alpha_0\rangle$ allowing the determination of the ground state configuration of the spins.

In order to demonstrate the adiabatic algorithm for a non-trivial case, we embed on a plaquette a simple three-spin frustrated Ising problem, in which the spins are anti-ferromagnetically coupled to each other, $\hat{H}_p = J \Sigma_{k,j=1,2,3} \hat{\sigma}_{z,k} \hat{\sigma}_{z,j}$ with J>0. This Hamiltonian has six degenerate ground states in the logical spin basis. Following the LHZ approach, a mapping of N=3 logical spins requires M=3 physical spins (in this case 3 JPAs) and one physical spin fixed to up state (in our case a JPA initialized to the stable eigenstate $|\bar{1}\rangle$). Since the physical spins $\{|\bar{0}\rangle, |\bar{1}\rangle\}$ encoded in the JPAs constitute the relative alignment of the logical spins, there are three possible solutions in this basis: $|\bar{1}, \bar{0}, \bar{0}\rangle$, $|\bar{0}, \bar{1}, \bar{0}\rangle$ and $|\bar{1}, \bar{0}, \bar{1}\rangle$. The time-dependent Hamiltonian for the adiabatic protocol then follows from Eq.(36) with M=3. The anti-ferromagnetic coupling between the logical spins is represented by the single-photon drives on each JPA with amplitude $J_k$=J>0. At t=0, the ground state of this Hamiltonian is the vacuum $|0, 0, 0\rangle$. For appropriate magnitude of the four-body coupling (see Supplemental Notes below), the problem Hamiltonian can be expressed as $\hat{H}_p = J (4\alpha_0 \varepsilon_p^2/K) \Sigma_{k=1}^3 \hat{\sigma}_{z,i} - 2\mathcal{C} |\alpha_0|^4 \hat{\sigma}_{z,1} \hat{\sigma}_{z,2} \hat{\sigma}_{z,3} \hat{\sigma}_{z,4}$+cont. with $\alpha_0 = \sqrt{\varepsilon_p/K}$. This realizes the required problem Hamiltonian in the LHZ scheme $\hat{H}_p^{LHZ,N=3}$.

Figure 14:
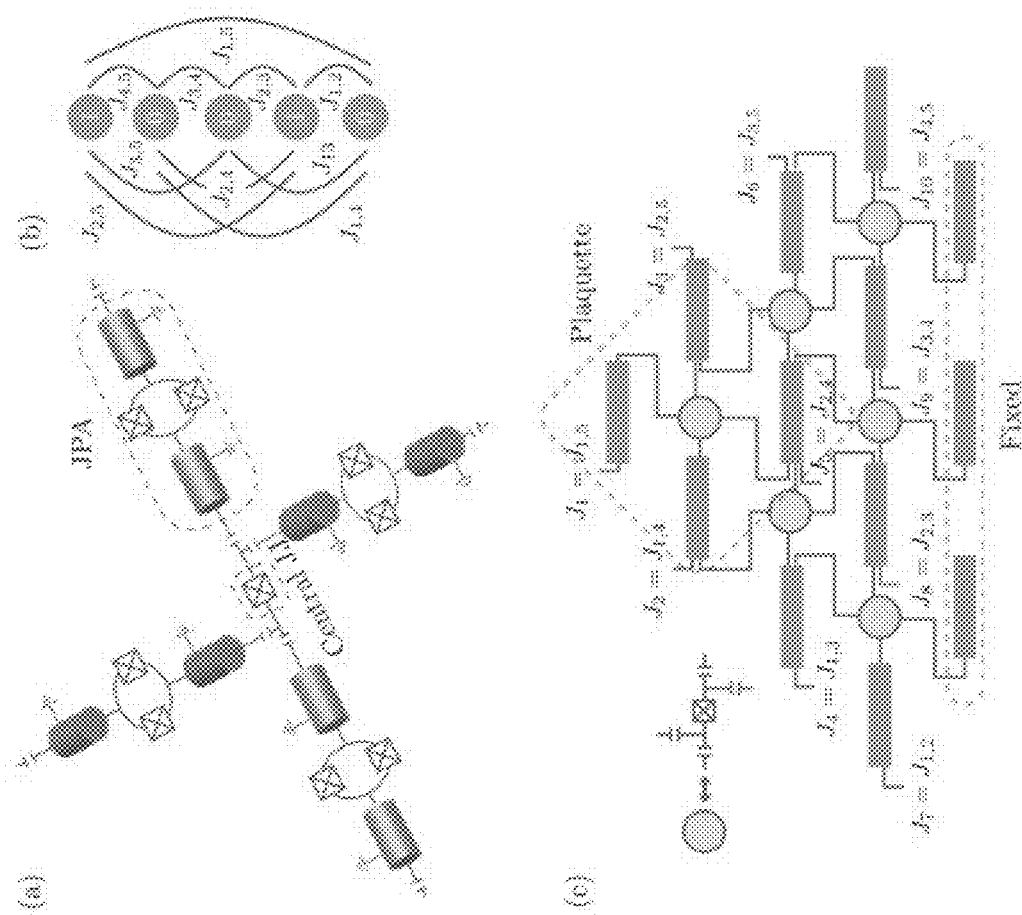
FIG. 14 represents physical realization of the LHZ scheme. (a) illustrates of the plaquette consisting of four JPAs coupled by a Josephson junction (JJ). The four JPAs have different frequencies and are driven by two-photon drives such that $\omega_{p,k}+\omega_{p,l}=\omega_{p,m}+\omega_{p,n}$. The nonlinearity of the JJ induces a four-body coupling between the KNRs. (b) illustrates a fully-connected Ising problem with $N=5$ logical spins. (c) The same problem embedded on $M=10$ physical spins and 3 fixed spins on the boundary.

To illustrate the performance of this protocol, the evolution subjected to the Hamiltonian of Eq.(36) can be simulated with the three resonators initialized to vacuum and the fourth initialized to the state $|\bar{1}\rangle$. With $\varepsilon_p$=2K, $\alpha_0=\sqrt{2}$, J=0.095K, $\mathcal{C}$=0.05K, $\tau=40/\Delta_{min}$ and $\kappa$=0, we find that the success probability to reach the ground state to be 99.3%. The reduction in fidelity arises from the non-adiabatic errors. The probability for the system to be in one of the states $|\bar{0}/\bar{1}, \bar{0}/\bar{1}, \bar{0}/\bar{1}\rangle$ is 99.98% indicating that, with high accuracy, the final state is restricted to this subspace. FIG. 15(a) shows the dependence of the success probability on single-photon loss rate (circles). It also presents the success probability when the algorithm is implemented with qubits (squares) subjected to dephasing noise (see Methods). Again, we find that, in the presence of equal strength noise, the adiabatic protocol with JPAs (or two-photon driven KNRs) has superior performance with respect to qubits. FIG. 15(b) also shows the success probability for the same problem but without using the LHZ embedding, that is, when the three KNRs (circles) or qubits (squares) are directly coupled to each other via a two-body interaction of the form $\hat{H}_p = J \Sigma_{k,j=1,2,3} \hat{\sigma}_{z,k} \hat{\sigma}_{z,j}$ with J>0 (see Methods below). As with embedding, the success probability with KNRs is higher than with qubits for equal strength noise. For the particular example considered here, the degeneracy of the ground state is higher in the un-embedded problem (six) than for the embedded problem (three). As a result, the likelihood to remain in one of the ground states increases and, in the presence of noise, the un-embedded problem performs slightly better than the embedded problem. These examples of simple frustrated three-spin problems demonstrate the performance of a single plaquette. Embedding of large Ising problems requires more plaquettes connected together as shown in FIG. 14. Even in such a larger lattice, each JPA is connected to only four other JPAs, making it likely that the final state remains restricted to the encoded subspace spanned by the states $|\bar{0}\rangle, |\bar{1}\rangle$.

All-to-all Connected Ising Problem with LHZ Variants:

The LHZ embedding introduced above can be referred to as the "even parity" scheme because the four-body constraint ensures that there are only even number physical spins with $\langle \hat{\sigma}_{z,k} \rangle$=1 in a plaquette. In other words, the sum of the spins around a plaquette is −4, 0 or 4. An alternate realization of the LHZ scheme has "odd-parity" constraints. In this realization, the four-body constraint takes the form $+\Sigma_{\langle i,j,k,l \rangle} \mathcal{C} \hat{\sigma}_{z,i} \hat{\sigma}_{z,j} \hat{\sigma}_{z,k} \hat{\sigma}_{z,l}$ and forces the sum of the physical spins around the plaquette to be 2 or −2. In the odd-parity parity scheme, the couplings between the logical spins $J_{i,j}$ is mapped on the local magnetic field to the physical spin k but with an additional phase which depends on i, j. Specifically, $J_k = -J_{i,j}$ if j is even and i is odd and $J_k = J_{i,j}$ otherwise. The KNR-based platform described in the previous section can also be easily extended to implement the odd-parity LHZ embedding by appropriately choosing the phase of the local single-photon drive and realizing a coupling between the resonators of the form $$+C \sum_{\substack{\langle k,l,m,n \rangle \in \\ \text{plaquette}}} \left( \hat{a}_k^\dagger \hat{a}_l^\dagger \hat{a}_m \hat{a}_n + h.c. \right)$$

in which h.c. stands for hermitian conjugate and, in other words, in which KNOs are made to interact via connectors exchanging bosons within groups of 3 or four nearest neighbor KNOs.

Accordingly, an adiabatic protocol performing quantum annealing with all-to-all connected Ising spins in a network of non-linear resonators with only local interactions can be provided. The performance analysis of this annealer in the presence of single-photon loss shows that the success probability can be considerably higher compared to qubits with same amount of loss. Although the implementation of the LHZ scheme has been explored here, other embedding schemes such as minor embedding could be realized by taking advantage of single-photon exchange and the corresponding two-body couplings that it results in. A distinguishing feature of the above-reported scheme is that the spins are encoded in continuous-variable states of resonator fields. The restriction to two approximately orthogonal coherent states only happens in the late stage of the adiabatic evolution, and in general each site must be treated as a continuous variable system displaying rich physics, exemplified by non-Gaussian states, with negative-valued Wigner functions.

The quantum fluctuations around the instantaneous ground and excited states can lead to increased stability of the ground state. As the size of the system increases, these continuous variable states might alter the nature of phase transitions during the adiabatic evolution, something which may lead to changes in computational power. It is also worth pointing out that the circuit QED implementation easily allows for adding correlated phase fluctuations given by interaction terms like $\hat{a}_i^\dagger \hat{a}_i \hat{a}_j^\dagger \hat{a}_j$ (see Supplementary Notes below). These terms do not affect the energy spectrum of the encoded problem Hamiltonian, but may modify the scaling of the minimal gap during the annealing protocol.

Yet another appealing feature that motivates further study is that the time-dependent Hamiltonian of KNRs is generically non-stoquastic in the number basis. A stoquastic Hamiltonian by definition only has real, non-positive off-diagonal entries, and the Hamiltonians in this class are directly amenable to quantum Monte Carlo simulations (stoquastic Hamiltonians do not have the so-called "sign problem"). As an example, the transverse field Ising Hamiltonian, which is the focus of much current experimental efforts, is stoquastic. In contrast, the Hamiltonian of the system presented above has off-diagonal terms $\Sigma_k J_k(\hat{a}_k^\dagger + \hat{a}_k)$ in the LHZ embedding (or $\Sigma_{i,j} J_{i,j} \hat{a}_i \hat{a}_j^\dagger$+h.c. if this embedding is not used) with problem dependent signs (note that simply mapping $\hat{a}_k \rightarrow --\hat{a}_k$ does not solve the problem due to the presence of the quartic terms Eq.(35)). The same is true if one considers matrix elements in the over-complete basis of coherent states. Non-stoquasticity has been linked to exponential speedups in quantum annealing, and is widely believed to be necessary to gain more than constant speedup over classical devices.

Currently, the large Hilbert space size prevents numerically exact simulations with more than a few resonators. Nonetheless, the results here strongly suggest that the adiabatic protocol with two-photon driven KNRs has excellent resistance to photon loss and thermal noise. Together with the highly non-classical physics displayed during the adiabatic evolution, this motivates the realization of a robust, scalable quantum Ising machine based on this architecture.

Methods—Scalability
Eigen-Subspace of a Two-Photon Driven KNR:
The Hamiltonian of the two-photon driven KNR can be expressed as $$\hat{H}_0 = -K\hat{a}^{\dagger 2}\hat{a}^2 + \varepsilon_p(\hat{a}^{\dagger 2} + \hat{a}^2) = -K\left(\hat{a}^{\dagger 2} - \frac{\varepsilon_p}{K}\right)\left(\hat{a}^2 - \frac{\varepsilon_p}{K}\right) + \frac{\varepsilon_p^2}{K}. \quad (38)$$

This form makes it clear that the two coherent states $|\pm\varepsilon_p/K\rangle$, which are the eigenstates of the annihilation operator $\hat{a}$, are also degenerate eigenstates of Eq.(38) with energy $\varepsilon_p^2/K$.

Time-Dependent Hamiltonian in the Instantaneous Rotating Frame:
A demonstration concerning required time-dependence of the amplitude and frequency of the drives to obtain the time-dependent Hamiltonians needed for the adiabatic protocol are now presented. As an illustration, consider the example of a two-photon driven KNR with additional single-photon drive whose Hamiltonian is written in the laboratory frame as $\hat{H}_{1,Lab}(t) = \omega_r \hat{a}^\dagger \hat{a} - K\hat{a}^{\dagger 2}\hat{a}^2 + \varepsilon_p(t)[e^{-i\omega_p(t)t}\hat{a}^{\dagger 2} + e^{i\omega_p(t)t}\hat{a}^2] + \varepsilon_0(t)[e^{-i\omega_p(t)t/2}\hat{a}^\dagger + e^{i\omega_p(t)t/2}\hat{a}].$ Here, $\omega_r$ is the fixed KNR frequency and $\omega_p(t)$ is the time-dependent two-photon drive frequency. The frequency of the single-photon drive, of amplitude $\varepsilon_0(t)$, is chosen to be $\omega_p(t)/2$ such that it is on resonance with the two-photon drive. In a rotating frame defined by the unitary transformation $\hat{U} = \exp[i\omega_p(t)t\hat{a}^\dagger\hat{a}/2]$, this Hamiltonian reads $$\begin{aligned}\hat{H}_1(t) &= \hat{U}(t)^\dagger \hat{H}_{Lab}(t)\hat{U}(t) - i\dot{\hat{U}}(t)^\dagger \hat{U}(t), \\ &= \left(\omega_r - \frac{\omega_p(t)}{2} - \dot{\omega}_p(t)\frac{t}{2}\right)\hat{a}^\dagger\hat{a} - K\hat{a}^{\dagger 2}\hat{a}^2 + \\ & \quad \varepsilon_p(t)(\hat{a}^{\dagger 2} + \hat{a}^2) + \varepsilon_0(t)(\hat{a}^\dagger + \hat{a}).\end{aligned} \quad (40)$$

Choosing the time dependence of the drive frequency as $\omega_p(t) = 2\omega_r - 2\delta_0(1-t/2\tau)$, and the drive strengths as $\varepsilon_p(t) = \varepsilon_p t/\tau$ and $\varepsilon_0(t) = \varepsilon_0 t/\tau$, the above Hamiltonian simplifies to $$\begin{aligned}\hat{H}_1(t) &= \delta_0\left(1-\frac{t}{\tau}\right)\hat{a}^\dagger\hat{a} - K\hat{a}^{\dagger 2}\hat{a}^2 + \left(\frac{t}{\tau}\right)\varepsilon_p(\hat{a}^{\dagger 2} + \hat{a}^2) + \\ & \quad \left(\frac{t}{\tau}\right)\varepsilon_0(\hat{a}^\dagger + \hat{a}) \\ &= \left(1-\frac{t}{\tau}\right)[\delta_0\hat{a}^\dagger\hat{a} - K\hat{a}^{\dagger 2}\hat{a}^2] + \left(\frac{t}{\tau}\right)[-K\hat{a}^{\dagger 2}\hat{a}^2 + \\ & \quad \varepsilon_p(\hat{a}^{\dagger 2} + \hat{a}^2) + \varepsilon_0(\hat{a}^\dagger + \hat{a})].\end{aligned} \quad (41)$$

This has the standard form of a linear interpolation between an initial Hamiltonian and a problem Hamiltonian that is required to implement the adiabatic protocol.

As a second illustration, the time-dependent Hamiltonian for finding the ground state of a frustrated three spin problem embedded on a plaquette is $$\begin{aligned}\hat{H}_{Lab}^{LHZ}(t) &= \sum_{k=1}^{4}(\omega_{r,k}\hat{a}_k^\dagger\hat{a}_k - K\hat{a}_k^{\dagger 2}\hat{a}_k^2) - \\ & \quad C(\hat{a}_1^\dagger\hat{a}_2^\dagger\hat{a}_3\hat{a}_4 + h.c.) + \sum_{k=1}^{3} J(t)\left[e^{-i\omega_{p,k}(t)t/2}\hat{a}^\dagger + e^{i\omega_{p,k}(t)t/2}\hat{a}\right] + \\ & \quad \sum_{k=1}^{3}\varepsilon_p(t)\left[e^{-i\omega_{p,k}(t)t}\hat{a}^{\dagger 2} + e^{i\omega_{p,k}(t)t}\hat{a}^2\right] + \varepsilon_p\left[e^{-i\omega_{p,4}t}\hat{a}^{\dagger 2} + e^{i\omega_{p,4}t}\hat{a}^2\right],\end{aligned} \quad (42)$$

where $\omega_{r,k}$ are the fixed resonator frequencies and $\omega_{p,k}(t)$ the time-dependent two-photon drive frequencies. The resonators labelled k=1, 2 and 3 are driven by time-dependent two-photon and single-photon drives of strengths $\varepsilon_p(t)$, J(t) and frequency $\omega_{p,k}(t)$, $\omega_{p,k}(t)/2$, respectively. On the other hand, the frequency and strength of the two-photon drive on the k=4 resonator is fixed. Applying the unitary $\hat{U} = \exp[i\Sigma_{k=1}^{3}\omega_{p,k}(t)t\hat{a}_k^\dagger\hat{a}_k/2]$ leads to the transformed Hamiltonian $$\begin{aligned}\hat{H}^{LHZ}(t) &= \sum_{k=1}^{3}\left[\left(\omega_{r,k} - \frac{\omega_{p,k}(t)}{2} - \dot{\omega}_{p,k}(t)\frac{t}{2}\right)\hat{a}_k^\dagger\hat{a}_k - \right.\\ & \quad \left. K\hat{a}_k^{\dagger 2}\hat{a}_k^2 + J(t)(\hat{a}_k^\dagger + \hat{a}_k) + \varepsilon_p(t)(\hat{a}_k^{\dagger 2} + \hat{a}_k^2)\right] - \\ & \quad C\left(\hat{a}_1^\dagger\hat{a}_2^\dagger\hat{a}_3\hat{a}_4 e^{i(\omega_{p,1}(t) + \omega_{p,2}(t) - \omega_{p,3}(t) - \omega_{p,4})t/2} + h.c.\right) + \\ & \quad \left(\omega_{r,4} - \frac{\omega_{p,4}}{2}\right)\hat{a}_4^\dagger\hat{a}_4 - K\hat{a}_4^{\dagger 2}\hat{a}_4^2 + \varepsilon_p(\hat{a}_4^{\dagger 2} + \hat{a}_4^2).\end{aligned} \quad (43)$$

To realize Eq.(35) implementing the adiabatic algorithm on this plaquette, we choose the drive frequencies such that $\omega_{p,k}(t) = 2\omega_{r,k} - 2\delta_0(1-t/2\tau)$ and $\omega_{p,4} = 2\omega_{r,4}$, with their sum respecting $\omega_{p,1}(t)+\omega_{p,2}(t)=\omega_{p,3}(t)+\omega_{p,4}$. Moreover, we take the time-dependent amplitudes $\varepsilon_p(t)=\varepsilon_p t/\tau$ and $J(t)=Jt/\tau$.

Figure 13:
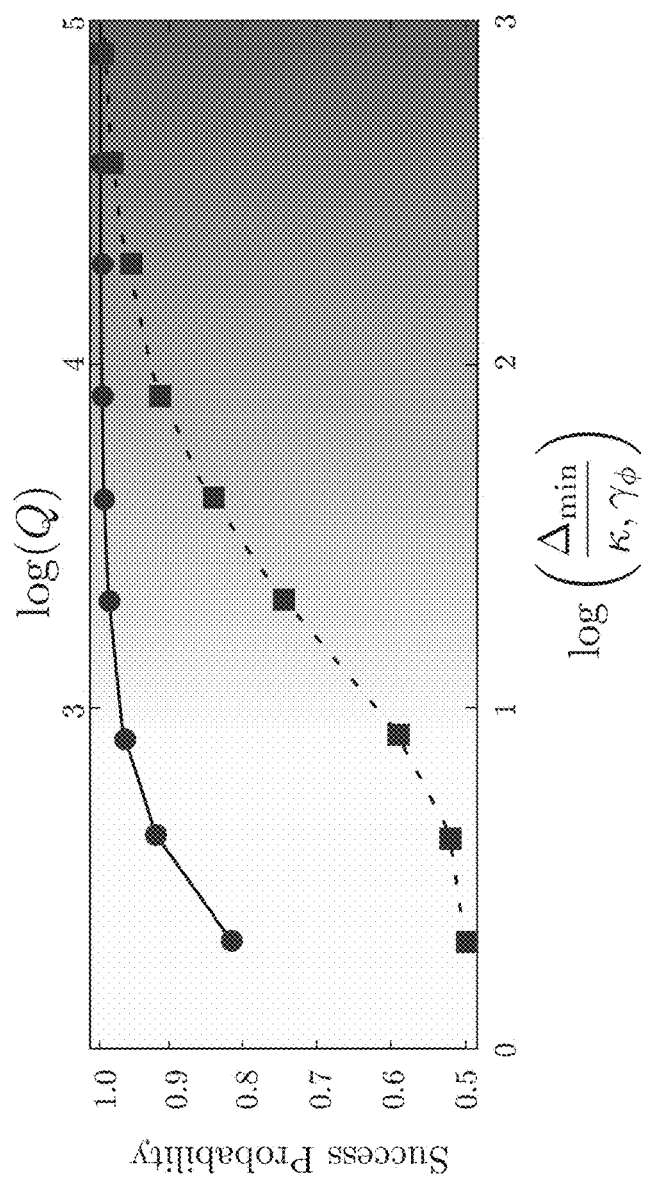
FIG. 13 represents success probability for the two coupled spins problem. Loss-rate dependence of the success probability for the two-spin adiabatic algorithm in a system of two-photon driven KNRs with single-photon loss $\kappa$ (circles) and qubits with pure dephasing at rate $\gamma_\phi$ (squares). The quality factor $Q=\omega_r/\kappa$ is indicated on the top axis for a KNR of frequency $\omega_r/2\pi=5$ GHz.

Estimation of Success Probability:

To estimate the success probability of the adiabatic algorithm with KNRs, as shown by the circles in FIG. 13, we numerically simulate the master equation $\dot{\hat{\rho}}=-[\hat{H}_2(t),\hat{\rho}]+\kappa\mathcal{D}[\hat{a}_1]+\kappa\mathcal{D}[\hat{a}_2]$, where photon loss is accounted for by the Lindbladian $\mathcal{D}[\hat{a}_i]=\hat{a}_i\hat{\rho}\hat{a}_i^\dagger-(\hat{a}_i^\dagger\hat{a}_i\hat{\rho}+\hat{\rho}\hat{a}_i^\dagger\hat{a}_i)/2$. It is important to keep in mind that even though the energy gap is small in the rotating frame, the KNRs laboratory frame frequencies $\omega_{r,k}$ are by far the largest energy scale. As a result, the above standard quantum optics master equation correctly describes damping in this system. Moreover, because we are working with KNR frequencies in the GHz range, as is typical with superconducting circuits, thermal fluctuations are negligible. From this master equation, the success probability can be evaluated as the probability of occupation of the correct ground state at the final time $t=\tau$, that is, $\langle\bar{0}, \bar{1}|\hat{\rho}(\tau)|\bar{0}, \bar{1}\rangle+\langle\bar{1}, \bar{0}|\hat{\rho}(\tau)|\bar{1}, \bar{0}\rangle$ and $\langle\bar{0}, \bar{0}|\hat{\rho}(\tau)|\bar{0}, \bar{0}\rangle+\langle\bar{1}, \bar{1}|\hat{\rho}(\tau)|\bar{1}, \bar{1}\rangle$ for $\varepsilon_0>0$ and $\varepsilon_0<0$, respectively. On the other hand, the master equation used to simulate the adiabatic algorithm with qubits is $\dot{\hat{\rho}}=-[\hat{H}_2^{qubits}(t),\hat{\rho}]+\kappa\mathcal{D}[\hat{\sigma}_{z,1}]+\kappa\mathcal{D}[\hat{\sigma}_{z,2}]$ where $$\hat{H}_2^{qubits}(t) = \left(1-\frac{t}{\tau}\right)\hat{H}_i^{qubits} + \left(\frac{t}{\tau}\right)\hat{H}_p^{qubits}, \quad (44)$$

$$\hat{H}_i^{qubits} = U\sum_{i=1,2}\hat{\sigma}_{x,i}, \quad \hat{H}_p^{qubits} = J\hat{\sigma}_{z,1}\hat{\sigma}_{z,2}, \quad \mathcal{D}[\hat{\sigma}_{z,i}] = \gamma_\phi(\hat{\sigma}_{z,i}\hat{\rho}\hat{\sigma}_{z,i}-\hat{\rho}). \quad (45)$$

Here, $\hat{\sigma}_{z,i}$ and $\sigma_{x,i}$ are Pauli operators in the computational basis formed by the ground $|g\rangle$ and excited state $|e\rangle$ the $i^{th}$ qubit. In these simulations, the qubits are initialized to the ground state of the initial transverse field, and the success probability (squares in FIG. 13) is computed as the probability of occupation of the correct ground state at $t=\tau$, that is, $\langle g, e|\hat{\rho}(\tau)|g, e\rangle+\langle e, g|\hat{\rho}(\tau)|e, g\rangle$ and $\langle g, g|\hat{\rho}(\tau)|g, g\rangle+\langle e, e|\hat{\rho}(\tau)|e, e\rangle$ for $J>0$ and $J<0$, respectively.

Figure 15:
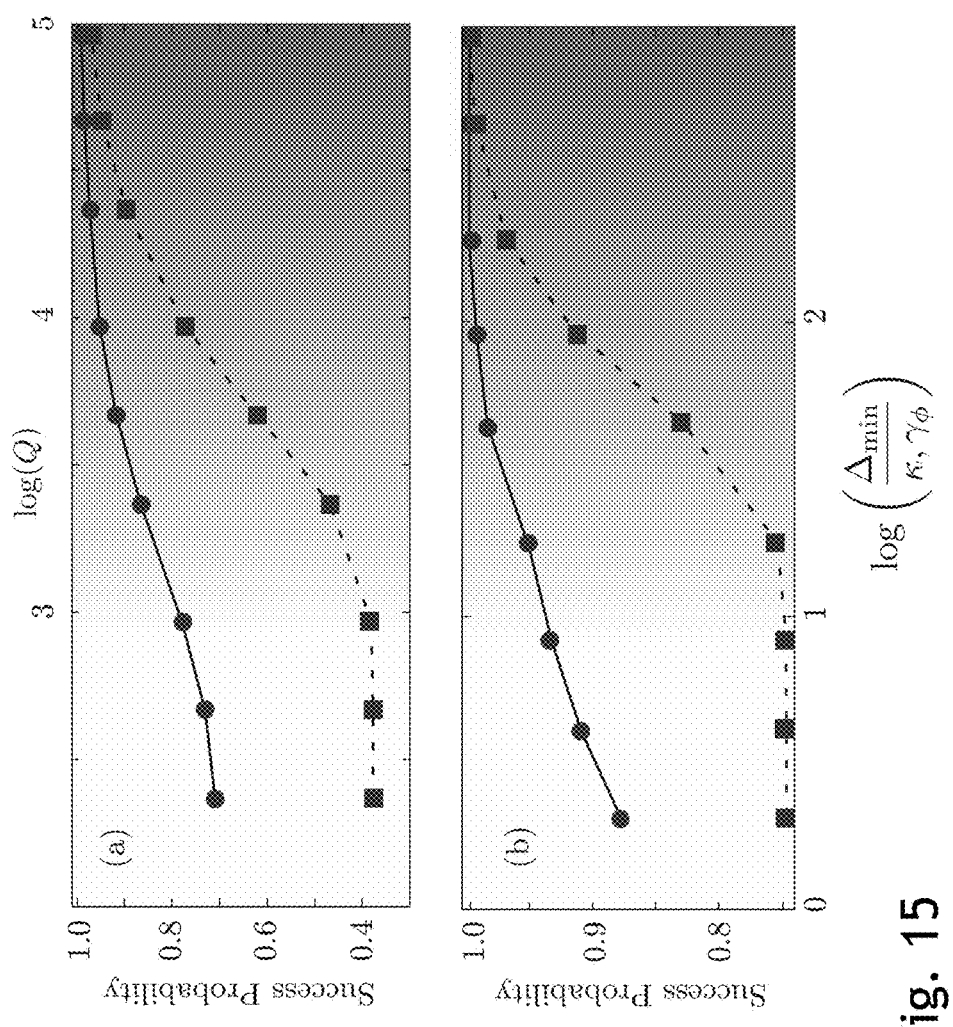
FIG. 15 represents success probability for the frustrated three-spin problem. (a) is a scenario with LHZ encoding in which probability of successfully finding the ground state of a frustrated three-spin Ising problem by implementing the adiabatic algorithm on a plaquette of four KNRs with single-photon loss (circles) for $\varepsilon_p^0=2K$, $\delta_0=0.45K$, $\mathcal{C}=0.05K$, $J=0.095K$. The success probability for an implementation with qubits with pure dephasing rate $\gamma\phi$ is also shown (squares). The two cases are designed to have identical $\Delta_{min}$ and computation time $\tau=40/\Delta_{min}$. The quality factor $Q=\omega_r/\kappa$ is indicated on the top axis for a KNR of frequency $\omega_r/2\pi=5$ GHz. (b) represents a scenario without encoding in which the probability of successfully finding the ground state of a frustrated three-spin Ising problem by implementing the adiabatic algorithm on three directly coupled KNRs with single-photon loss (circles) for $\varepsilon_p^0=2K$, $\delta_0=0.45K$, $J_{k,i}=0.095K$ for k, i=1, 2, 3 Note that the local drive J in the embedded problem is same as the coupling $J_{k,j}$ in the un-embedded one and the minimum energy gap in the un-embedded problem is twice that of the embedded problem. The success probability for an implementation with qubits without encoding and with pure dephasing is also shown (squares).

Finally, to obtain the data for the resonators in FIG. 15 (circles), the simulated master equation is $\dot{\hat{\rho}}=-[\hat{H}^{LHZ}(t),\hat{\rho}]+\Sigma_{i=1,2,3}\kappa\mathcal{D}[\hat{a}_i]$ while, for qubits, it is $\dot{\hat{\rho}}=-[\hat{H}^{LHZ,qubits}(t),\hat{\rho}]+\Sigma_{i=1,2,3}\gamma_\phi\mathcal{D}[\hat{\sigma}_{z,i}]$. In these expressions, $$\hat{H}_2^{LHZ,qubits}(t) = \left(1-\frac{t}{\tau}\right)\hat{H}_i^{qubits} + \left(\frac{t}{\tau}\right)\hat{H}_p^{LHZ,qubits}, \quad (46)$$

$$\hat{H}_i^{qubits} = U\sum_{i=1,2,3}\hat{\sigma}_{x,i}, \quad \hat{H}_p^{LHZ,qubits} = J\sum\hat{\sigma}_{z,i} + C\hat{\sigma}_{z,1}\hat{\sigma}_{z,2}\hat{\sigma}_{z,3}\hat{\sigma}_{z,4}. \quad (47)$$

The success probability is computed as the probability of occupation of the correct ground state at $t=\tau$, that is, $\langle\bar{0}, \bar{1}, \bar{0}|\hat{\rho}(\tau)|\bar{0}, \bar{1}, \bar{0}\rangle+\langle\bar{1}, \bar{0}, \bar{0}|\hat{\rho}(\tau)|\bar{1}, \bar{0}, \bar{0}\rangle+\langle\bar{0}, \bar{0}, \bar{1}|\hat{\rho}(\tau)|\bar{0}, \bar{0}, \bar{1}\rangle$ (circles in FIG. 15) and $\langle g, e, g|\hat{\rho}(\tau)|g, e, g\rangle+\langle e, g, g|\hat{\rho}(\tau)|e, g, g\rangle+\langle g, g, e|\hat{\rho}(\tau)|g, g, e\rangle$ (squares in FIG. 15).

Two Paradigms of Quantum Annealing:

The KNR based quantum annealer proposed above can be based on an adiabatic non-equilibrium evolution, where the system is subject to driven and dissipative processes. This is in stark contrast to the conventional approach to quantum annealing, where a quantum system is at all times in thermal equilibrium at very low temperature such that it stays close to the ground state, as Hamiltonian parameters are adiabatically varied. It is crucial to understand the very different roles played by the bath, modelling the environment of the annealer, in these two different approaches. In the conventional approach, as long as the temperature is sufficiently low compared to the energy gap, the thermal population of the first excited state is negligible and the system is effectively in its ground state. In fact, for large gaps, the coupling to the environment typically helps the annealer by constantly cooling the system towards its ground state. On the other hand, the bath becomes detrimental and will typically lead to large errors as soon as $\Delta\sim k_B T$. Since the gap decreases exponentially with problem size for hard problems, this is a major roadblock for conventional quantum annealing. Even for easier problems when the gap closes polynomially, it quickly becomes extremely challenging to go to large system sizes.

The type of non-equilibrium quantum annealer considered above can overcome this roadblock, but trades the difficulty for a related but different challenge. The crucial point is that although the gap is small in the rotating frame where the annealing schedule is realized, the system still probes the environment at a very high frequency. All coupling and interaction terms in the Hamiltonian are effectively small perturbations of the resonator's bare Hamiltonian $\hat{H}_0=\omega_r\hat{a}^\dagger\hat{a}$, such that the energy cost of adding a thermal photon is to a very good approximation $\hbar\omega_r$, giving a negligible thermal population, $N_{th}=\exp(-\hbar\omega_r/k_B T)$, for typical frequencies in the 5-15 GHz range and temperatures $T\sim 10$ mK. This is also the justification for the master equations used when computing the success probabilities FIGS. 13 and 15.

Although thermal noise is no longer a bottleneck for this type of non-equilibrium quantum annealing, another challenge now arises. Since the system is not in equilibrium, the eigenstates of the rotating frame Hamiltonian are not global eigenstates of the total system, including the bath, and the interaction with the bath therefore does not generically drive the system towards the rotating-frame ground state, even at zero temperature (see Supplementary Notes below). This leads to local dephasing noise for the KNR implementation due to resonator photon loss. We emphasize that when comparing to a qubit implementation in FIGS. 13 and 15, we are comparing to an analogous implementation where the qubits are also only subjected to local dephasing noise, as opposed to thermal noise due to a small gap. This allows a fair comparison of two different physical systems used to realize the Ising spins under equal noise strength.

Realization of Four-Body Coupling: Fixed Coupling

The physical realization of the four-body coupling is described here and more details can be found in Supplementary Notes below. The photon annihilation operators of the four KNRs each of which are driven with a two-photon drive are denoted by $\ddot{a}_i$, with $i=1, 2, 3, 4$. These resonators are capacitively coupled to a central Josephson junction described by the annihilation operator $\ddot{a}_c$ and of energy $-E_J\cos\{(\phi_c/\phi_0)(\hat{a}_c^\dagger+\hat{a}_c)\}$. In this expression, $E_J$ is the Josephson energy, $\phi_0=\hbar/2e$ is the reduced flux quantum and $\phi_c$ is the standard deviation of the zero-point flux fluctuation for the junction mode. The coupling strength $g_i$ between the resonators and the junction is smaller than the detuning between them $\Delta_i$, $g_i\ll\Delta_i$. In this dispersive, limit the mode of the junction becomes dressed with the resonator modes $\hat{a}_c\rightarrow\hat{a}_c-(g_1/\Delta_1)\hat{a}_1-(g_2/\Delta_2)\hat{a}_2+(g_3/\Delta_3)\hat{a}_3+(g_4/\Delta_4)\hat{a}_4$ and the Josephson energy becomes $$-E_J \cos\left\{\frac{\phi_c}{\phi_0}\left(\hat{a}_c - \frac{g_1}{\Delta_1}\hat{a}_1 - \frac{g_2}{\Delta_2}\hat{a}_2 + \frac{g_3}{\Delta_3}\hat{a}_3 + \frac{g_4}{\Delta_4}\hat{a}_4 + h.c\right)\right\}. \tag{48}$$

The fourth-order expansion of the cosine leads to a coupling $-\mathcal{C}\,\hat{a}_1^\dagger\hat{a}_2^\dagger\hat{a}_3\hat{a}_4+h.c$, where $\mathcal{C}=E_J(\phi_c^4/\phi_0^4)g_1g_2g_3g_4/\Delta_1\Delta_2\Delta_3\Delta_4$. In the rotating frame of the drive, this coupling becomes resonant when the frequencies are chosen such that $\omega_{p,1}(t)+\omega_{p,2}(t)=\omega_{p,3}(t)+\omega_{p,4}(t)$. In addition to the above four-body coupling, cross-Kerr terms of the form $\hat{a}_i^\dagger\hat{a}_i\hat{a}_j^\dagger\hat{a}_j$ are also resonant. These terms do not affect the success probability of the algorithm. The strength of the coupling can be estimated with typical parameters $E_J/2\pi=600$ GHz, $\phi_c=0.12\phi_0$, $g_i/\Delta_i\sim0.12$, resulting in $\mathcal{C}/2\pi=63$ KHz. For a typical strength of Kerr nonlinearity $K/2\pi=600$ KHz, this leads to $\mathcal{C}/K\sim0.1$.

The physical realization of the coupling described here presents the general idea of mediating the four-body coupling through a four-wave mixing device. Specifically, in this section we have presented one, perhaps the simplest, example of this device: a single Josephson junction. However, with superconducting circuits there is an extremely broad range of possibilities of realizing such a four-wave mixing device. In addition, the coupling constant can be also be tuned in-situ and from positive to negative values, thus allowing the implementation of both even- and odd-parity LHZ schemes. For instance, an alternate circuit can have a tunable coupling implemented using a Josephson-ring-modulator.

Supplementary Notes—Scalability

Stability Analysis of the Meta-Potential for a Single Two-Photon Driven KNR

The coherent states $|\pm\alpha_0\rangle$, where $\alpha_0=\sqrt{\varepsilon_p/K}$, are eigenstates of the two-photon driven KNR Hamiltonian $$\hat{H}_0=-K\hat{a}^{\dagger 2}\hat{a}^2+\varepsilon_p(\hat{a}^{\dagger 2}+\hat{a}^2). \tag{49}$$

We start by applying a displacement transformation $D(\alpha)=\exp(\alpha\hat{a}^\dagger-\alpha\hat{a})$ to $\hat{H}_0$, so that $$\hat{H}_0' = D^\dagger(\alpha)\hat{H}_0 D(\alpha) \tag{50}$$

$$= \left[(-2K\alpha^2\alpha^* + 2\varepsilon_p\alpha^*)\hat{a}^\dagger + h.c.\right] + \tag{51}$$
$$\left[(-K\alpha^2+\varepsilon_p)\hat{a}^{\dagger 2}+h.c.\right]-4K|\alpha|^2\hat{a}^\dagger\hat{a}-K\hat{a}^{\dagger 2}\hat{a}^2 -$$
$$(2K\alpha\hat{a}^{\dagger 2}\hat{a}+h.c.).$$

In the above expression, the constant term $E(\alpha)=-K|\alpha|^4+\varepsilon_p^*\alpha^2+\varepsilon_p\alpha^{*2}$ which represents a shift in energy is dropped. We choose $\alpha$ such that the coefficient of $\hat{a}^\dagger$ satisfies $-2K\alpha^2\alpha^*+2\varepsilon_p\alpha^*=0$, which is equivalent to finding the turning points of the metapotential of FIG. 11 of the manuscript. This equation has two solutions: $(0, 0)$, $(\pm\alpha_0, 0)$ corresponding to the dip and two peaks of the inverted double-well metapotential. At $(0, 0)$, the Hamiltonian in Eq.(51) represents a resonantly driven parametric amplifier. Therefore, in the absence of losses, large fluctuations make the system unstable around $(0, 0)_2$. On the other hand, at $(\pm\alpha_0, 0)$ the Hamiltonian Eq.(51) takes the form $$\hat{H}_0'(\alpha=\pm\alpha_0)=-4K|\alpha_0|^2\hat{a}^\dagger\hat{a}-K\hat{a}^{\dagger 2}\hat{a}^2-(\pm 2K\alpha_0\hat{a}^{\dagger 2}\hat{a}+h.c.). \tag{52}$$

With this normally ordered form, we immediately conclude that the vacuum $|0\rangle$ is an eigenstate of $\hat{H}_0'$ in the displaced frame. It immediately follows that the coherent states $|\pm\alpha_0\rangle$ are the eigenstates of the Hamiltonian $\hat{H}_0$ in the non-displaced frame. Furthermore, these are degenerate eigenstates as $E(\alpha_0)=E(-\alpha_0)$.

The Eigen-Subspace in the Presence of Single-Photon Drive

The Hamiltonian of a two-photon driven KNR with an additional single-photon drive is given by $$\hat{H}=-K\hat{a}^\dagger\hat{a}^\dagger\hat{a}\hat{a}+\varepsilon_p(\hat{a}^{\dagger 2}+\varepsilon^2)+\varepsilon_0(\hat{a}^\dagger+\hat{a}). \tag{1}$$

Under a displacement transformation $D(\alpha)$ this Hamiltonian reads $$\hat{H}'=[(-2K\alpha^2\alpha^*+2\varepsilon_p\alpha^*+\varepsilon_0)\hat{a}^\dagger+h.c.]+[(-K\alpha^2+\varepsilon_p)\hat{a}^{\dagger 2}+h.c.]-4K|\alpha|^2\hat{a}^\dagger\hat{a}-K\hat{a}^{\dagger 2}\hat{a}^2-(2K\alpha\hat{a}^{\dagger 2}\hat{a}+h.c.), \tag{54}$$

where the constant term $E(\alpha)=-K|\alpha|^4+\varepsilon_p(\alpha^2+\alpha^{*2})+\varepsilon_0(\alpha+\alpha^*)$ representing a shift in energy is dropped. Following the same steps as above, the coefficient of the $\hat{a}^\dagger$ terms vanish if $$-2K\alpha^2\alpha^*+2\varepsilon_p\alpha^*+\varepsilon_0=0. \tag{55}$$

For small $\varepsilon_0$, this equation has three solutions of the form $(\pm\alpha_0+\varepsilon, 0)$, $(\varepsilon, 0)$ with $\varepsilon=\varepsilon_0/4\varepsilon_p$. In practice, we assume that the amplitude of the single-photon drive is small compared to that of the two-photon drive, $\varepsilon_0\ll\varepsilon_p$, so that $\varepsilon\to 0$. If the condition Eq. (55) is satisfied, then the Hamiltonian in the displaced frame reduces to $$\hat{H}' = \left[-\frac{\varepsilon_0}{2\alpha^*}\hat{a}^{\dagger 2}+h.c.-4K|\alpha|^2\hat{a}^\dagger\hat{a}\right]-K\hat{a}^{\dagger 2}\hat{a}^2-\left(2K\alpha\hat{a}^{\dagger 2}\hat{a}+h.c.\right). \tag{56}$$

Following Supplementary Note 1, $|0\rangle$ is an eigenstate of $\hat{H}'$ except for the first term which represents an off-resonant parametric drive of strength $|\varepsilon_0/2\alpha^*|$ detuned by $4K|\alpha|^2$. If $|\varepsilon_0/\alpha|\ll 4K|\alpha|^2$, fluctuations around $\alpha$ are small and $|0\rangle$ remains an eigenstate in the displaced frame. Of the three solutions to Eq.(55), only $(\pm\alpha_0+\varepsilon, 0)$ satisfy the condition $|\varepsilon_0/(\pm\alpha_0+\varepsilon)|\ll 4K|\pm\alpha_0+\varepsilon|^2$. The third solution $(\varepsilon, 0)$ is unstable because of the large quantum fluctuations around this point. As a result, in the non-displaced frame, the eigenstates of the system are $|\alpha_0+\varepsilon\rangle$ and $|-\alpha_0+\varepsilon\rangle$, where $\varepsilon$ is a small correction. From the expression for $E(\alpha)$, it also clear that the degeneracy between the eigenstates $|\alpha_0+\varepsilon\rangle$ and $|-\alpha_0+\varepsilon\rangle$ is lifted by an amount $E(\alpha_0)-E(-\alpha_0)=4\varepsilon_0\alpha_0$.

Figure 16:
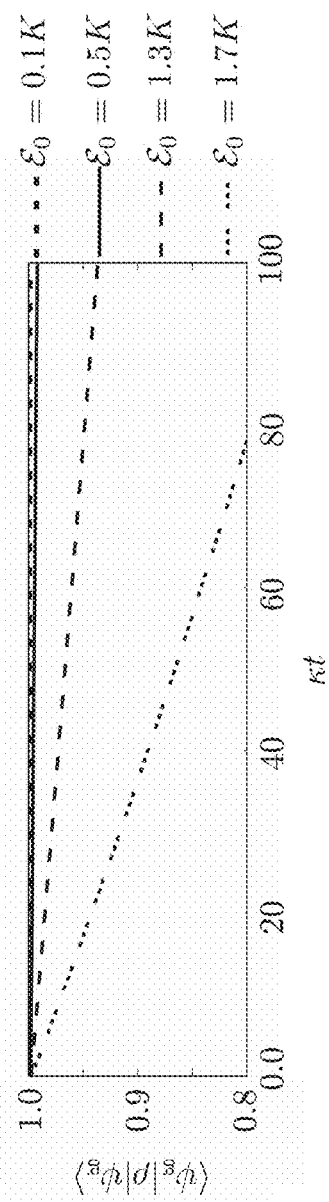
FIG. 16 represents ground state in presence of single-photon drive, and more specifically time evolution of the probability of a single resonator to remain in the ground state $\langle\psi_g|\hat{\rho}|\psi_g\rangle$, for different single-photon drive strength. The two-photon drive strength is fixed to $\varepsilon_p=2K$ and $\kappa=0.2K$.

Increasing $\varepsilon_0$, leads to squeezing due to the first term of Eq.(56). As a result, the states are no longer coherent or, in other words, they are no longer the eigenstates of the photon annihilation operator $\hat{a}$, and hence are no longer protected against the single-photon loss channel. To illustrate this effect quantitatively, we numerically diagonalize the Hamiltonian in Eq.(53) to evaluate the ground state for a fixed two-photon drive strength $\varepsilon_p=2K$ and variable strength single-photon drive amplitude. We numerically solve the master equation for the Hamiltonian in Eq.(53), $\dot{\hat{\rho}}=-i[\hat{H}, \hat{\rho}]+\kappa[\hat{a}\hat{\rho}\hat{a}^\dagger-(\hat{a}^\dagger\hat{a}\hat{\rho}+\hat{\rho}\hat{a}^\dagger\hat{a})/2]$ with the system initialized to the ground state at $t=0$ and $\kappa=0.2K^{3,4}$. Finally, from these results, we compute the probability of the system to remain in the ground state $\langle\psi_g|\hat{\rho}|\psi_g\rangle$ after time t, presented in FIG. 16. As seen from these numerical results, the ground state is invariant to single-photon loss for small $\varepsilon_0$, confirming our prediction from the simple theoretical analysis.

Effect of Single Photon Loss During the Annealing Protocol for a Single Driven KNR The behaviour of the instantaneous ground and excited state during the annealing protocol with a single driven KNR in the presence of single-photon loss can perhaps be best presented as follows. The time-dependent Hamiltonian of this system is given by $$\hat{H}_1(t) = \left(1 - \frac{t}{\tau}\right)\delta_0 \hat{a}^\dagger \hat{a} - K\hat{a}^{\dagger 2}\hat{a} + \left(\frac{t}{\tau}\right)[\varepsilon_p(\hat{a}^{\dagger 2} + \hat{a}^2) + \varepsilon_0(\hat{a}^\dagger + \hat{a})]. \quad (57)$$

In the presence of single-photon loss, the dynamics of the system is described by the master equation $\dot{\hat{\rho}} = -i[\hat{H}_{1,\mathit{eff}}(t)\hat{\rho} - \hat{\rho}\hat{H}_{1,\mathit{eff}}^\dagger(t)] + \kappa\hat{a}\hat{\rho}\hat{a}^\dagger$, where $\kappa$ is rate of photon loss and $\hat{H}_{1,\mathit{eff}}(t) = \hat{H}_1(t) - \kappa\hat{a}^\dagger\hat{a}/2$. We apply a displacement transformation $D(\alpha)$ to $\hat{H}_{1,\mathit{eff}}(t)$ $$\hat{H}'_{1,\mathit{eff}} = \left[(-2K\alpha^2\alpha^* + 2\varepsilon_p(t)\alpha^* + \delta(t)\alpha - i\frac{\kappa}{2}\alpha + \varepsilon_0(t))\hat{a}^\dagger + h.c.\right] + \quad (58)$$
$$[(-K\alpha^2 + \varepsilon_p)\hat{a}^{\dagger 2} + h.c.] - 4K|\alpha|^2\hat{a}^\dagger\hat{a} +$$
$$\delta(t)\hat{a}^\dagger\hat{a} - i\frac{\kappa}{2}\hat{a}^\dagger\hat{a} - K\hat{a}^{\dagger 2}\hat{a}^2 - (2K\alpha\hat{a}^{\dagger 2}\hat{a} + h.c.).$$

For convenience, the variables have been redefined as $\delta(t) = \delta_0(1-t/\tau)$, $\varepsilon_p(t) = \varepsilon_p t/\tau$ and $\varepsilon_0(t) = \varepsilon_0 t/\tau$. Again, we take $\alpha$ to satisfy $$-2K\alpha^2\alpha^* + 2\varepsilon_p(t)\alpha^* + \delta(t)\alpha - i\frac{\kappa}{2}\alpha + \varepsilon_0(t) = 0, \quad (59)$$

such that the effective Hamiltonian reads $$\hat{H}'_{1,\mathit{eff}} = [(-K\alpha^2 + \varepsilon_p)\hat{a}^{\dagger 2} + h.c.] - 4K|\alpha|^2\hat{a}^\dagger\hat{a} + \quad (60)$$
$$\delta(t)\hat{a}^\dagger\hat{a} - i\frac{\kappa}{2}\hat{a}^\dagger\hat{a} - K\hat{a}^{\dagger 2}\hat{a}^2 - (2K\alpha\hat{a}^{\dagger 2}\hat{a} + h.c.).$$

Eq.(59) admits three solutions: $\sim(0, 0)$, $(\pm\alpha_0', 0)$, with $\alpha_0' = \sqrt{[2\varepsilon_p(t) + \delta(t)]/2K}$. Repeating the procedure described above we find, at short times when $\delta(t) \gg 2\varepsilon_p(t)$, that $|0\rangle$ is approximately the lower energy, stable eigenstate of the Hamiltonian. As the evolution proceeds, the strength of the detuning and two-photon drive is modified as $\delta(t) \ll 2\varepsilon_p(t)$. In this case $(0, 0)$ is not a stable eigenstate. On the other hand, at $(\pm\alpha_0', 0)$ the Hamiltonian reads $$\hat{H}'_{1,\mathit{eff}} = \frac{1}{2}\left[\left\{-(\delta(t) - i\frac{\kappa}{2})\frac{\alpha}{2\alpha_0^{'*}} - \frac{\varepsilon_0}{\alpha_0^{'*}}\right\}\hat{a}^{\dagger 2} + h.c.\right] - \quad (61)$$
$$4K|\alpha_0'|^2\hat{a}^\dagger\hat{a} + \delta(t)\hat{a}^\dagger\hat{a} - i\frac{\kappa}{2}\hat{a}^\dagger\hat{a} - K\hat{a}^{\dagger 2}\hat{a}^2 - (2K\alpha_0'\hat{a}^{\dagger 2}\hat{a} -$$

In the absence of the first term, $|0\rangle$ would be the eigenstate of the above Hamiltonian and hence the coherent states $|\pm\alpha_0'\rangle$ the eigenstates in the non-displaced frame. The first term represents a parametric drive of amplitude $\zeta = |-(\delta(t) - i\kappa/2)(\alpha_0'/2\alpha_0^{'*}) - \varepsilon_0/\alpha_0^{'*}|$ and detuned by $|-4K|\alpha_0'|^2\hat{a}^\dagger\hat{a} + \delta(t)\hat{a}^\dagger\hat{a} - i\kappa/2|$. In other words, the effect of detuning, photon-loss and single-photon drive is to squeeze the fluctuations around $(\pm\alpha_0', 0)$. When $\delta(t) < 2\varepsilon_p(t)$, $\kappa < 8\varepsilon_p(t)$ and $\varepsilon(t) < 4K|\alpha_0'|^3$ then squeezing is negligible and the eigenstates in the non-displaced frame are approximately coherent states $|\pm\alpha_0'\rangle$. If $\varepsilon_0 > 0$, then $(-\alpha_0', 0)$ corresponds to the lower energy state, and, on the other hand, if $\varepsilon_0 < 0$, $(\alpha_0', 0)$ corresponds to the lower energy state.

Importantly, the amplitude of the squeezing drive for the lower energy state, $|\zeta| = |-[\delta(t) - i\varepsilon(t)]/\sqrt{2\varepsilon_p(t) + \delta(t)}/2K] - i\kappa/2$, is smaller than that for higher energy state, $|\zeta| = |-[\delta(t) + i\varepsilon(t)]/\sqrt{2\varepsilon_p(t) + \delta(t)}/2K] - i\kappa/2$. As a result, the deviation of the lower energy state from a coherent state is smaller than the similar deviation of the higher energy state. For this reason, during the adiabatic evolution, the lower energy state which is the computational ground state is more stable against photon-jump operation. On the other hand, with $\delta(t)$ having the opposite sign, $|\zeta|$ for the higher energy state becomes smaller than that for the lower energy state. As a result, the instantaneous excited state is then more stable than the instantaneous ground state. This further exemplifies that stability is related to the nature of quantum fluctuations rather than to energy. In the main body of the paper, we take $\delta(t) > 0$ to ensure that the instantaneous ground state is more stable. One could just as easily have chosen $\delta(t) < 0$ and inverted the Ising problem so that the desired solution would be given by the excited state which would then be more stable to single photon loss.

Effect of Fast-Rotating Terms

The two-photon driven KNR Hamiltonian of Eq.(49) describes the physics of the system in a frame rotating at the 2-photon drive frequency. To obtain this Hamiltonian, fast rotating terms have been dropped following the standard rotating wave approximation (RWA). As discussed above, under that approximation the coherent states $|\pm\alpha_0\rangle$ are eigenstates of the system.

Conventionally disregarded fast rotating terms can lead to tunneling between $|\alpha_0\rangle$ and $|-\alpha_0\rangle$. This tunneling is a result of resonant transitions between $|\pm\alpha_0\rangle$ and other eigenstates of the two-photon driven KNR. Fortunately for the present situation, the corresponding transition rate decreases exponentially with an increase of the ratio of frequency of the two-photon drive $\omega_p$ and the tunneling barrier which, in the notation used above, is $\Delta U = \varepsilon_p^2/K$. This is because of increasing difference between the momentum of the states $|\pm\alpha_0\rangle$ and the other eigenstates which can resonantly mix with $|\pm\alpha_0\rangle$ also increases with $\omega_p$. Given the parameters that we suggest using, and which are realizable in the laboratory, this tunneling is in practice negligible.

This can be illustrated with a numerical example. For this purpose, consider the Hamiltonian of the two-photon driven KNR without the RWA which reads $$\hat{H}(t) = \omega_r \hat{a}^\dagger\hat{a} - K\hat{a}^{\dagger 2}\hat{a}^2 + 2\varepsilon_p \cos(\omega_p t)(\hat{a}^{\dagger 2} + \hat{a}^2), \quad (62)$$

with $\omega_p = 2\omega_r$. In the presence of single-photon loss, the dynamics of the system is described by the master equation $$\dot{\rho} = -i[\hat{H}(t), \hat{\rho}] + \kappa\left(\hat{a}\hat{\rho}\hat{a}^\dagger - \frac{1}{2}\hat{a}^\dagger\hat{a}\hat{\rho} - \frac{1}{2}\hat{\rho}\hat{a}^\dagger\hat{a}\right). \quad (63)$$

Before considering the effect of the non-RWA terms, it is worth pointing out that the presence of damping leads to a transfer of population between the non-orthogonal states $|\pm\alpha_0\rangle$ at a rate $\kappa\alpha_0^2\exp(-2|\alpha_0|^2)$. This effect if negligibly small at large enough $\alpha_0$ and for the small values of $\kappa$ that are relevant here.

Figure 17:
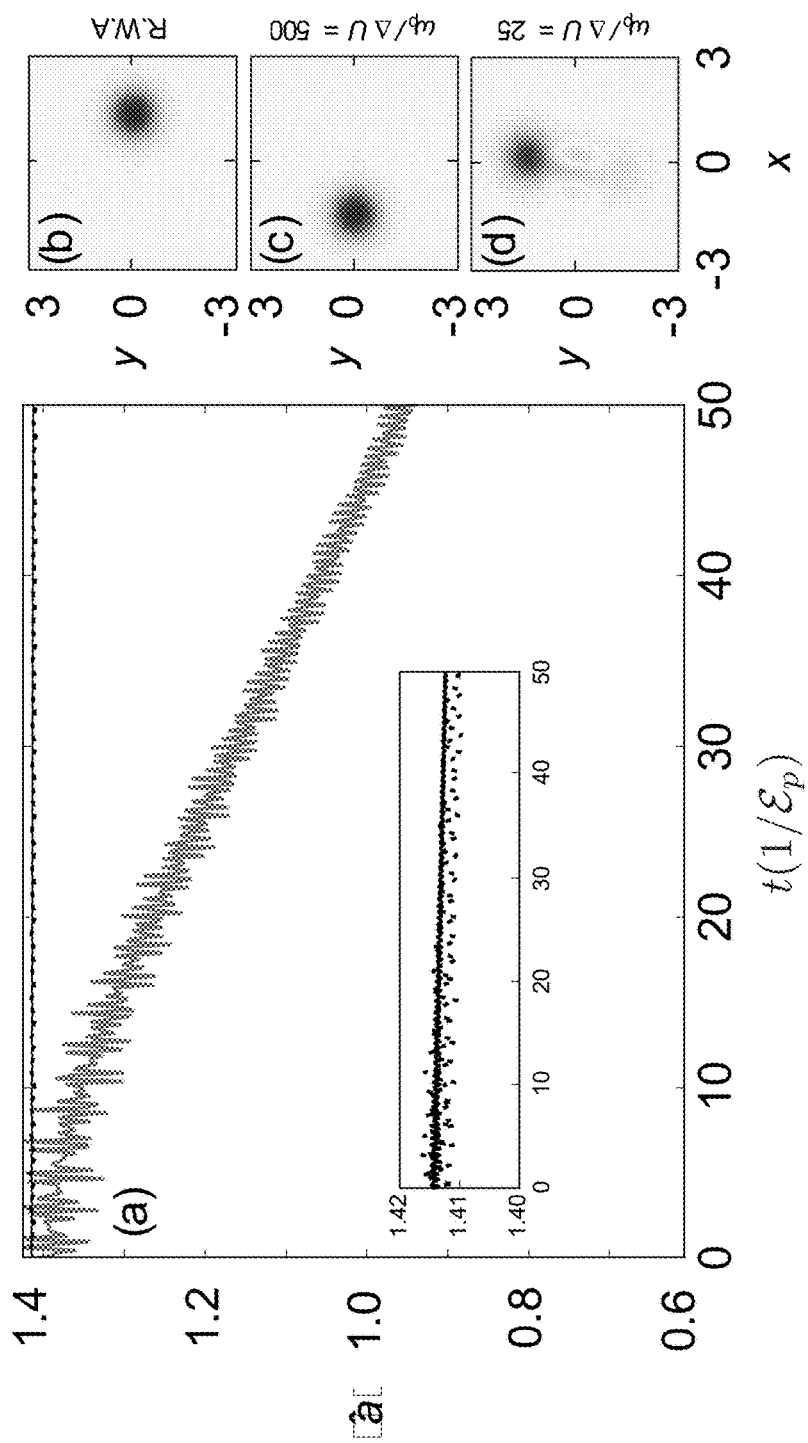
FIG. 17. Amplitude of field with and without RWA: (a) Time dependence of the field $|\langle\hat{a}\rangle|$ in a two-photon driven KNR initialized to $|\alpha_0\rangle$ in the presence of single-photon loss and without making the rotating wave approximation (RWA). By increasing the ratio of frequency of the two-photon drive $\omega_p$ to the tunneling barrier $\Delta U=\varepsilon_p^2/K$, the probability of resonant excitations exponentially decreases and the field amplitude remains essentially constant at its original value. The solid grey and dotted black lines correspond to $\omega_p/\Delta U=25$ and 500, respectively. The solid black line is obtained under the RWA. The inset shows an enlarged view of the non-RWA results with $\omega_p/\Delta U=500$ (dotted black line) and RWA results (solid black line). The other parameters are $\kappa=K/100$, $\varepsilon_p=2K$, $\alpha_0=\sqrt{2}$ and $\Delta U=4K$. Wigner function (b) in the rotating frame at time $t=50/\varepsilon_p$ under RWA, (c) in the laboratory frame without RWA and $\omega_p/\Delta U=500$, and (d) in the laboratory frame without RWA and $\omega_p/\Delta U=25$.

In the presence of the non-RWA terms, the states $|\alpha_0\rangle$ are no longer the exact eigenstates of the system. In this situation, the tunneling rate increases due to mixing with other eigenstates. This is illustrated in FIG. 17a) which shows $\langle\hat{a}\rangle$ as a function of time obtained numerically by solving Eq.(62) with $\omega_p/\Delta U = 25$ (solid gray line) and 500 (dotted black line) for $\alpha_0 = \sqrt{2}$. The solid black line line on this Figure shows the equivalent result under the RWA. The transition between the two coherent states is readily apparent for the small value of $\omega_p/\Delta U = 25$. On the other hand, apart from rapid oscillations (see inset), the more relevant case $\omega_p/\Delta U=500$ is barely distinguishable from the RWA results.

FIG. 17d) shows the numerically evaluated Wigner function in the lab frame at time t=0 and t=50/$\varepsilon_p$. The appearance of the additional peak and interference fringe pattern at t=50/$\varepsilon_p$ signifies the enhanced tunneling due to the fast-rotating terms when $\omega_p/\Delta U=25$. On the other hand, when $\omega_p/\Delta U=500$, the fringe pattern and the additional peak is diminished, as illustrated by the Wigner function in FIG. 17c). In a realistic implementation of this scheme $\omega_p$ is typically of the order of a 10-20 GHz, whereas, $\Delta U$ is of the order of 10-20 MHz, which means that $\omega_p/\Delta U>500$ and the tunneling due to resonant excitations via the fast rotating terms will not adversely affect the annealing schedule. Note that the rotations in the Wigner function in FIG. 17c,d) is due to the choice of working in the lab frame. The rotation in the coherent state is not seen if we instead work in the rotating frame as is shown in FIG. 17b).

In addition to non-RWA corrections, the Hamiltonian of realistic superconducting circuit implementations will have higher order non-linearities than Eq.(62). To verify that these higher-order terms do not change the above conclusion, we consider the time-dependent annealing Hamiltonian for the problem of a single-spin in magnetic field with the full cosine potential of the Josephson junction, $$\hat{H}_1(t) = \omega_r \hat{a}^\dagger \hat{a} + i\varepsilon(t)(\hat{a}^\dagger - \hat{a}) - 2\left\{E_J \cos\left(\frac{\Phi(t)}{\phi_0}\right)\cos\left(\frac{\hat{\phi}}{\phi_0}\right) + \frac{1}{2}\frac{\hat{\phi}^2}{\phi_0^2}\right\} \quad (64)$$

Figure 18:
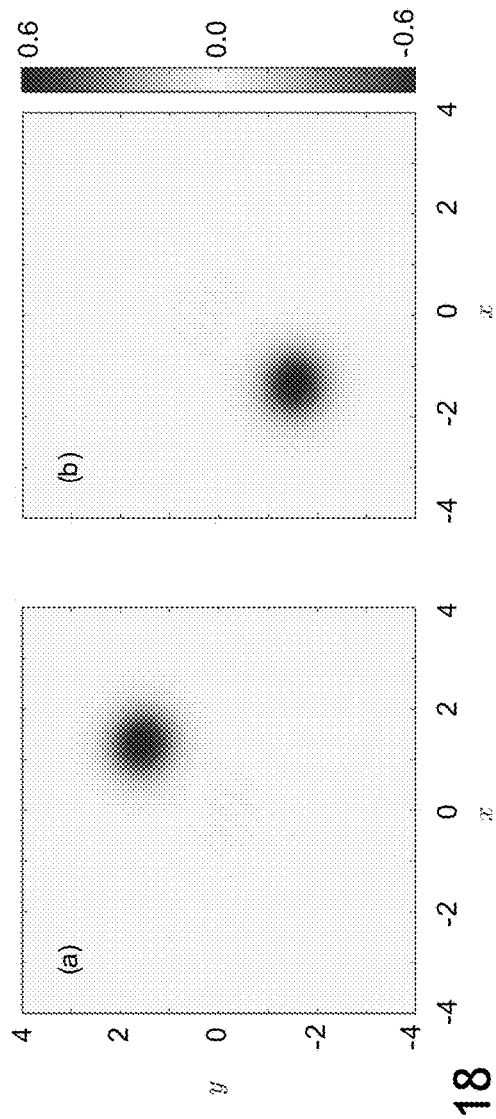
FIG. 18 represents a Wigner function in the laboratory frame after the annealing schedule: (a) single-photon drive amplitude $\varepsilon_0>0$ and (b) $\varepsilon_0<0$. Evolution is simulated using the full Cosine potential given of Eq.(64). As expected, the final coherent states for $\varepsilon_0>0$ and $\varepsilon_0<0$ are separated by a phase of $\pi$.

In the above expression, $\phi_0=\hbar/2e$ is the flux quanta, $\hat{\phi}=\phi(\hat{a}^\dagger+\hat{a})$ where $\phi$ the zero-point fluctuations of the resonator mode and $E_J$ the Josephson energy. Recall the annealing protocol, in which the external flux $\Phi(t)$ is modulated close to twice the frequency of the resonator to obtain the two-photon drive and its amplitude is adiabatically increased. In the numerical simulations, we take $\Phi(t)=\Phi_x\phi_0+\delta\Phi_x(t/\tau)\phi_0 \cos [2\omega_r t+\delta_0 t(1-t/2\tau)]$ with $\tau$ the final time and $\delta_0$ is the initial detuning (as defined in the manuscript). Similarly, the single-photon drive is modulated as $\varepsilon(t)=2\varepsilon_0(t/\tau)\sin(\omega_r t+\delta_0 t(1-t/2\tau)/2)$. Here $\varepsilon_0$ is the single photon drive required to encode the problem of a single spin in the magnetic field, as described in the manuscript. With these values, the effective two-photon drive and Kerr non-linearity are $\varepsilon_p=2E_J\phi^2 \sin(\Phi_x)\sin(\delta\Phi_x)/4$, $K=2E_J\phi^4 \cos(\Phi_x)\cos(\delta\Phi_x)/4$ and we take $\Phi_x=0.2$ and $\delta\Phi_x=0.03$. The resonator is initialized to vacuum at t=0 and its state at t=$\tau$ is determined by evolving under the Hamiltonian $\hat{H}_1(t)$. The parameters used in the simulation are such that the effective barrier potential $\Delta U=14.45K$, $\varepsilon_p \sim 1.95K$, $\omega_r \sim 4984.4K$, $\varepsilon_0=0.8K$, $\delta_0=0.8K$ and $\tau=250/K$. We numerically simulate the evolution of the state of the resonator under the annealing Hamiltonian in Eq.(64) and FIG. 18 illustrate the resulting Wigner function in the laboratory frame at t=$\tau$ for (a) $\varepsilon_0>0$ and (b) $\varepsilon_0<0$.

For the reasonable choice of parameters made here, the final state is essentially not affected by higher-order nonlinearities or fast rotating terms. Indeed, apart from a rotation due to the choice of frame, the result is very close to coherent states and follows the expected dependence of the sign of the single-photon drive. For $\varepsilon_0>0$ and $\varepsilon_0<0$ the overlap of the final state of the resonator with the coherent states $|\pm\alpha\rangle$ where $\alpha=1.37+1.44i$ is 99.92%. This large overlap with coherent states indicates that for $\omega_p/\Delta U \sim 690$ the effect of fast rotating terms is small and do not cause tunneling to the incorrect state, thereby ensuring that a high success probability of 99.92% is obtained.

Energy Spectrum and Average Success Probability of Problems Encoded on a Single Plaquette There are eight fully-connected Ising problems for three logical spins with weights $J_{i,j}=\pm 1$: one where all spins are ferromagnetically coupled, one where all are anti-ferromagnetically coupled, three problems where two spins are ferromagnetically coupled, while the coupling to the third is anti-ferromagnetic and three problems where two spins are anti-ferromagnetically coupled, while the coupling to the third is ferromagnetic. All these problems can be encoded on a single plaquette by appropriately choosing the sign of the single-photon drive. For example, as shown in the manuscript, the problem with anti-ferromagnetic coupling between all logical spins is embedded on the KNRs by applying single-photon drives such that J>0. Similarly, to embed a problem where all logical spins are coupled ferromagnetically, all the applied single-photon drives must be such that J<0. In order to embed the problem correctly in the LHZ scheme, the four-body coupling must be larger than local magnetic fields[6]. In our case, this implies $\mathcal{C}|\alpha_0|^3>J$. Furthermore, for the Hilbert space to be defined in the coherent state basis, the four-body coupling should be small enough so that it acts merely as a perturbation on the two-photon driven KNR ($\mathcal{C}|\alpha_0|^3<<4K|\alpha_0|^3$ or $\mathcal{C}<<4K$).

Figure 19:
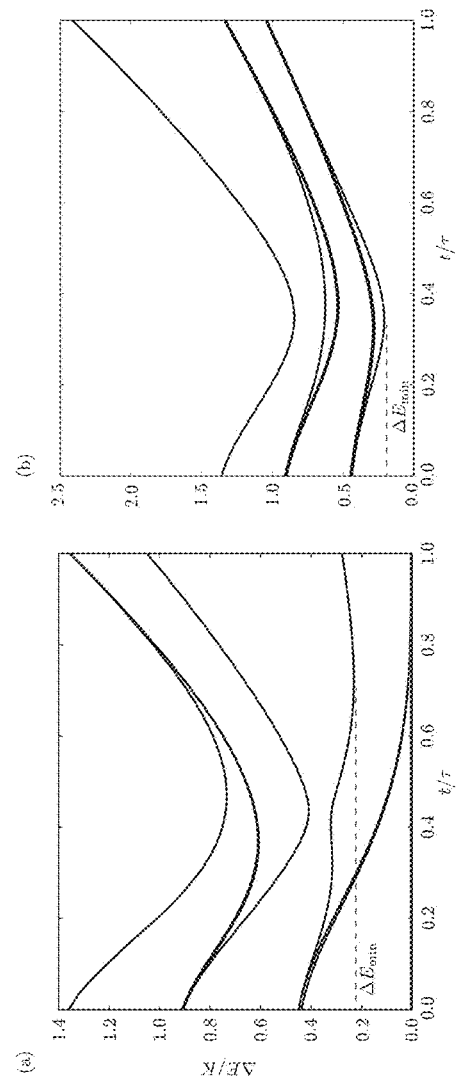
FIG. 19 represents evolution of the energy spectrum during the adiabatic evolution, and more specifically the time-dependent energy spectrum during the adiabatic protocol for the fully connected three spin problem on a plaquette when the interactions between the spins is (a) anti-ferromagnetic, in which case the ground state of the problem in the physical spin basis is three fold-degenerate and (b) ferromagnetic, in which case the ground state of the problem in the physical spin basis is non-degenerate. The energy is measured with respect to the ground state $\Delta E = E_i - E_0$.

To illustrate a particular case, we consider all the logical spins to be coupled anti-ferromagnetically. The ground state is then sixfold degenerate: $\{|0, 0, 1\rangle, |0, 1, 0\rangle, |1, 0, 0\rangle, |1, 1, 0\rangle, |1, 0, 1\rangle, |0, 1, 1\rangle\}$. In the basis of physical spins, which map the relative configuration of the logical spins, the ground state is threefold degenerate: $\{|\overline{0}, \overline{0}, \overline{1}\rangle, |\overline{0}, \overline{1}, \overline{0}\rangle, |\overline{1}, \overline{0}, \overline{0}\rangle\}$. Supplementary FIG. 19(a) shows the change in the energy spectrum during the adiabatic protocol with $\varepsilon_p=2K$, $\mathcal{C}=0.05K$ and single-photon drive to all the resonators J=0.095K. The energy is referred to the ground state. As expected, at t=$\tau$, the ground state becomes threefold degenerate.

On the other hand, if the logical spins are coupled ferromagnetically, then there are two possible ground states: $\{|0, 0, 0\rangle, |1, 1, 1\rangle\}$. This implies that, in the physical spin basis, there is a single non-degenerate ground state: $|\overline{1}, \overline{1}, \overline{1}\rangle$. Supplementary FIG. 19(b) shows the change in the energy spectrum during the adiabatic protocol with $\varepsilon_p=2K$ and $\mathcal{C}=0.05K$ but with the single-photon drive J=-0.095K on all the resonators.

Figure 20:
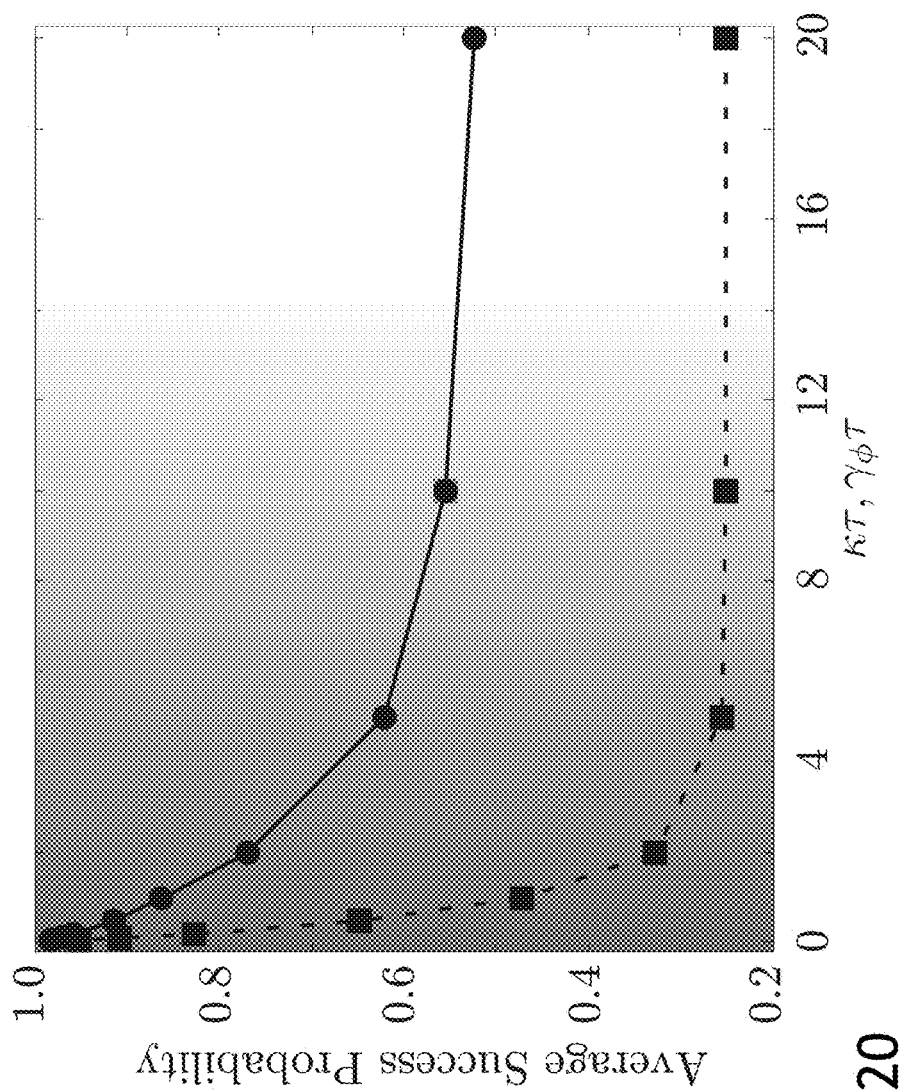
FIG. 20 represents average success probability for all problem instances on a plaquette, and more specifically the dependence of the average success probability for all fully connected problems on a single plaquette when the adiabatic protocol is implemented using KNRs (circles) characterized by single photon loss rate $\kappa$ and qubits (squares) characterized by the dephasing rate $\gamma\phi$. The total computation time $\tau$ is the same for both cases.

In a similar way, it is possible to encode all eight problems on the plaquette. We find that, in the absence of single-photon loss, the average success probability to find the correct ground state with the adiabatic algorithm is 99.7% in time $\tau=200/K$. FIG. 20 shows the dependence of the success probability on the rate of single-photon loss. It also presents the success probability of the protocol implemented using qubits with dephasing rate $\gamma_\phi$. The time-dependent Hamiltonian for qubits is designed to have the same minimum energy gap as that with the JPAs and the duration of the protocol is also chosen to be the same. Clearly the adiabatic protocol with the JPAs outperform that with qubits in the presence of equal strength noise.

Physical Realization of a Plaquette

Josephson parametric amplifiers (JPAs) are arranged in a triangular lattice and coupled together using Josephson junctions (JJ). As described in the main text, a single plaquette is comprised of four JPAs and a coupling JJ. The JPA is realized by embedding a SQUID in a resonator and modulating the flux through the SQUID at a frequency close to twice the frequency of the resonator. To implement the adiabatic protocol described in the manuscript (see Eq.(36) and Methods section in the manuscript), the flux modulation frequency is linearly varied from $\omega_{p,k}(0)=2\omega_{r,k}-2\delta_0$ at t=0 to $\omega_{p,k}(\tau)=2\omega_{r,k}-\delta_0$ at t=$\tau$. With an additional single-photon drive, the Hamiltonian of the $k^{th}$ JPA can then be written as $$\hat{H}_{JPA,k}=\omega_{r,k}\hat{a}_k^\dagger\hat{a}_k - K\hat{a}_k^{\dagger 2}\hat{a}_k^2 + J(t)[e^{-i\omega_{p,k}(t)t/2}\hat{a}^\dagger + e^{i\omega_{p,k}(t)t/2}\hat{a}] + \varepsilon_p(t)[e^{-i\omega_{p,k}(t)t}\hat{a}^{\dagger 2} + e^{i\omega_{p,k}(t)t}\hat{a}^2]. \quad (65)$$

The Kerr nonlinearity K and frequency $\omega_{r,k}$ are determined by the charging and Josephson energy of the junctions in the SQUID. The two-photon drive $\varepsilon_p$ depends on the magnitude of the flux modulation.

Figure 21:
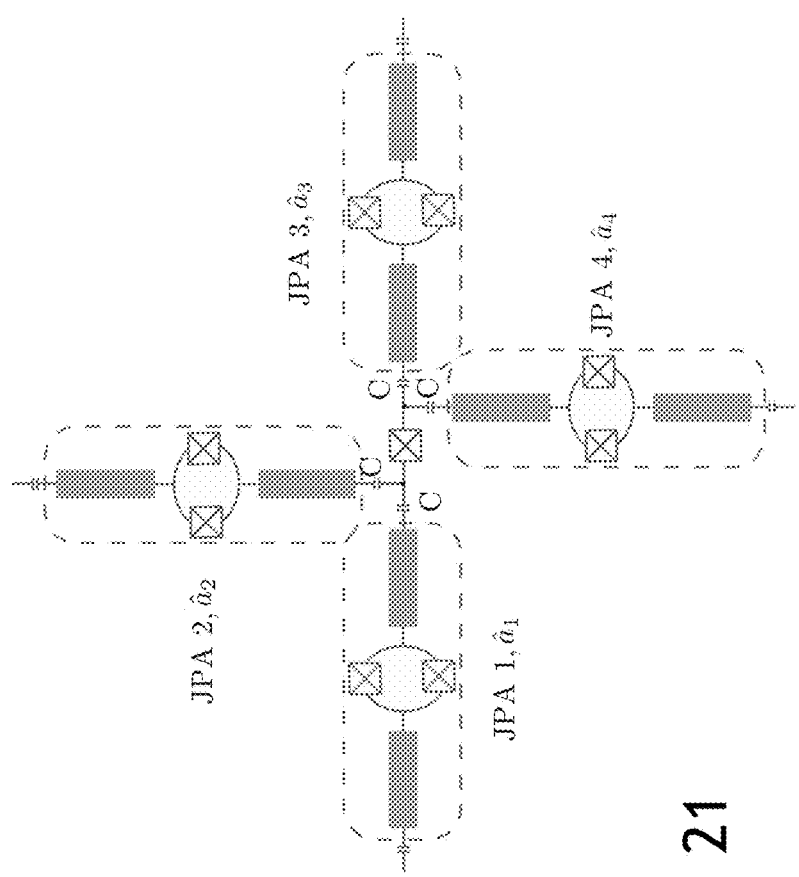
FIG. 21 illustrates an example circuit for physical realization of a plaquette in which four JPAs are linearly coupled to a mode of a Josephson junction via capacitors. The JPA modes are far detuned from the junction mode so that the coupling between them is dispersive. The non-linearity of the junction induces a four-body coupling between the JPAs if the frequencies of the two-photon drives to the JPAs are such that $\omega_{p,1} + \omega_{p,2} = \omega_{p,3} + \omega_{p,4}$.

FIG. 21 shows four JPAs of different frequencies capacitively coupled to a single JJ. The Hamiltonian of this plaquette is given by $$\hat{H} = \sum_{k=1}^{4} \hat{H}_{JPA,k} + \hat{H}_c, \quad (66)$$

where the Hamiltonian of each JPA is given in Eq.(65) and the coupling Hamiltonian is given by $$\hat{H}_c = \omega_c \hat{a}_c^\dagger \hat{a}_c + g_1(\hat{a}_c^\dagger \hat{a}_1 + \hat{a}_1^\dagger \hat{a}_c) + g_2(\hat{a}_c^\dagger \hat{a}_2 + \hat{a}_2^\dagger \hat{a}_c) - g_3(\hat{a}_c^\dagger \hat{a}_3 + \hat{a}_3^\dagger \hat{a}_c) - g_4(\hat{a}_c^\dagger \hat{a}_4 + \hat{a}_4^\dagger \hat{a}_c) - E_J\left(\cos\left(\frac{\hat{\Phi}}{\phi_0}\right) + \frac{1}{2}\left(\frac{\hat{\Phi}}{\phi_0}\right)^2\right), \quad (67)$$

where $\hat{\Phi}=\phi_c(\hat{a}_c^\dagger + \hat{a}_c)$, $\phi_0 = \hbar/2e$ is the flux quantum, $\hat{a}_c(\hat{a}_c^\dagger)$ is the annihilation (creation) operator for the mode across the coupling JJ and $\phi_c$ is the standard deviation of the zero-point flux fluctuation for this JJ mode. $\hat{\Phi}$ is the phase across the junction, $E_J$ is its Josephson energy, $\omega_c$ is the frequency of the junction mode and $g_k$ is the rate at which energy is exchanged between this mode and the $k^{th}$ JPA. Following the definition for the mode operators, the quadratic term $\propto \hat{\Phi}^2$ has been removed from the cosine. The coupling rate can be expressed as $g_k = \phi_0^2 e^2/2\,\mathcal{C}\,\phi_c \phi_k$ in terms of the coupling capacitor $\mathcal{C}$ and the zero point flux fluctuation for the JPA mode ($\phi_k$). The total Hamiltonian is obtained by substituting Eq.(65) and Eq.(67) in Eq.(66).

The frequency of the junction mode is designed to be largely detuned from the JPA modes, such that $\Delta_k = \omega_c - \omega_{r,k} \gg g_k$. It is then possible to apply a dispersive unitary transformation $\hat{U}=\exp(-i(g_1/\Delta_1)\hat{a}_c^\dagger \hat{a}_1 - i(g_2/\Delta_2)\hat{a}_c^\dagger \hat{a}_2 + i(g_3/\Delta_3)\hat{a}_c^\dagger \hat{a}_3 + i(g_4/\Delta_4)\hat{a}_c^\dagger \hat{a}_4 + h.c.)$ to the total Hamiltonian, so that, to the second order in $g_k/\Delta_k$, the total Hamiltonian becomes $$\hat{H} \sim \sum_{k=1}^{4}\left(\hat{H}_{JPA,k} - \frac{g_k^2}{\Delta_k}\hat{a}_k^\dagger \hat{a}_k\right) + \left(\omega_c + \frac{g_k^2}{\Delta_k}\right)\hat{a}_c^\dagger \hat{a}_c - E_J\left(\cos\left(\frac{\hat{\Phi}'}{\phi_0}\right) + \frac{1}{2}\left(\frac{\hat{\Phi}'}{\phi_0}\right)^2\right), \quad (68)$$

$$\sim \sum_{k=1}^{4}\left(\hat{H}_{JPA,k} - \frac{g_k^2}{\Delta_k}\hat{a}_k^\dagger \hat{a}_k\right) + \left(\omega_c + \frac{g_k^2}{\Delta_k}\right)\hat{a}_c^\dagger \hat{a}_c - E_J \frac{1}{4!}\frac{\hat{\Phi}'^4}{\phi_0^4}, \quad (69)$$

where $$\hat{\Phi}' = \phi_c\left(\hat{a}_c^\dagger - \frac{g_1}{\Delta_1}\hat{a}_1^\dagger - \frac{g_2}{\Delta_2}\hat{a}_2^\dagger + \frac{g_3}{\Delta_3}\hat{a}_3^\dagger + \frac{g_4}{\Delta_4}\hat{a}_4^\dagger + h.c.\right). \quad (70)$$

The expression in Eq.(69) is obtained by expanding the cosine term to the fourth order.

The central Josephson junction mode is far detuned from the JPAs and is not driven externally so that we have $\langle\hat{a}_c\rangle = \langle\hat{a}_c^\dagger\hat{a}_c\rangle = 0$. As a result, it is possible to eliminate this mode and obtain a Hamiltonian for the JPA modes only.

Furthermore, in a frame rotating at the frequencies of the two-photon drives, the photon annihilation operators transform as $\hat{a}_k \to e^{-i\omega_{p,k}(t)t}\hat{a}_k$. As discussed in the text, the two-photon drive frequencies are such that $\omega_{p,k} \neq \omega_{p,m}$ and $\omega_{p,1} + \omega_{p,2} = \omega_{p,3} + \omega_{p,4}$. As a result, we can eliminate fast rotating terms in the expansion of the last term in Eq.(69) and realize the plaquette Hamiltonian $$\hat{H}_{plaquette} \sim \sum_{k=1}^{4}\left(\hat{H}_{JPA,k} - \frac{g_k^2}{\Delta_k}\hat{a}_k^\dagger \hat{a}_k\right) - E_J \frac{\phi_c^4}{\phi_0^4}\frac{g_1 g_2 g_3 g_4}{\Delta_1\Delta_2\Delta_3\Delta_4}(\hat{a}_1^\dagger \hat{a}_2^\dagger \hat{a}_3 \hat{a}_4 + h.c.) - E_J \frac{\phi_c^4}{\phi_0^4}\sum_{k\neq m=1}^{4}\frac{g_k^2 g_m^2}{\Delta_k^2 \Delta_m^2}\hat{a}_k^\dagger \hat{a}_k \hat{a}_m^\dagger \hat{a}_m. \quad (71)$$

The second part of the first term results in a frequency shift of the JPA modes due to off-resonant coupling with the JJ and only leads to a renormalization of the energies.

The second term in the above expression is the desired four-body coupling between the JPAs. The four-body coupling strength $\mathcal{C}$ defined in the manuscript can be written in terms of circuit parameters as $$C = E_J \frac{\phi_c^4}{\phi_0^4}\frac{g_1 g_2 g_3 g_4}{\Delta_1\Delta_2\Delta_3\Delta_4}.$$

As an example, choosing $E_J/2\pi=600$ GHz, $\phi_c=0.12\phi_0$, $g_k/\Delta k \sim 0.12$ we estimate $\mathcal{C}/2\pi=63$ KHz. For a typical strength of Kerr nonlinearity $E_J/2\pi=600$ KHz this leads to $\mathcal{C}/K \sim 0.1$. The last term gives rise to a cross-Kerr interaction between the JPAs. As discussed in the following section, if the amplitude of the coherent states forming the computational subspace is large, then this term does not affect the structure of the energy spectrum.

Effect of the Cross-Kerr Coupling Between the JPAs

In the computational subspace, the cross-Kerr coupling between the JPAs can be written $\hat{a}_k^\dagger \hat{a}_k \hat{a}_m^\dagger \hat{a}_m = |\alpha_0|^4 e^{-4|\alpha_0|^2}\hat{\sigma}_{k,x}\oplus\hat{\sigma}_{m,x}+const.$, where $\sigma_{k,x}$ is the Pauli operator $|\bar{1}\rangle\langle\bar{0}|+|\bar{0}\rangle\langle\bar{1}|$. If $\alpha_0$ is large then $e^{-4|\alpha_0|^2} \to 0$ and the cross-Kerr term only leads to a constant shift in energy without inducing any errors in the encoding. This can be confirmed by numerically evaluating the energy spectrum, for example, for the frustrated three spin problem on a single plaquette. For $\mathcal{C}|\alpha_0|^3 > J$, we expect that, at the end of the adiabatic protocol, the ground state is triple-fold degenerate $\{|\bar{0},\bar{0},\bar{1}\rangle, |\bar{0},\bar{1},\bar{0}\rangle, |\bar{1},\bar{0},\bar{0}\rangle\}$, where $|\bar{0}/\bar{1}\rangle=|\pm\alpha_0\rangle$. However, in presence of the cross-Kerr terms, we find that that the degeneracy is lifted by $\sim 0.005K$ if $\alpha_0=\sqrt{2}$. If, on the other hand, $\alpha_0=\sqrt{3}$, then the lift in the degeneracy reduces to 0.0004K. This confirms that as $\alpha_0$ increases, the errors due to the cross-Kerr terms decrease.

Furthermore, to ensure that the cross-Kerr terms do not induce additional dephasing in the presence of single-photon loss, we repeat the numerical simulations for the problem of three coupled spins embedded on a plaquette with these terms included and determine the average success probability. The numerical simulations are limited by the size of the Hilbert space and we take $\alpha_0=\sqrt{2}$ with the time-dependent Hamiltonian $$\hat{H} = \left(1 - \frac{t}{\tau}\right)\hat{H}_i + \left(\frac{t}{\tau}\right)\hat{H}_p, \tag{72}$$

where $$\hat{H}_i = \sum_{k=1}^{3}\left(\delta_0 \hat{a}_k^\dagger \hat{a}_k - K\hat{a}_k^{\dagger 2}\hat{a}_k^2\right) - \left(C\hat{a}_1^\dagger \hat{a}_2^\dagger \hat{a}_3 \hat{a}_4 + h.c.\right) -$$

$$C\sum_{k,m=1}^{3} \hat{a}_k^\dagger \hat{a}_k \hat{a}_m^\dagger \hat{a}_m,$$

$$\hat{H}_p^{LHZ} = \sum_{k=1}^{3}\left\{(1-f)\delta_0 \hat{a}_k^\dagger \hat{a}_k - K\hat{a}_k^{\dagger 2}\hat{a}_k^2 + \varepsilon_p\left(\hat{a}_k^{\dagger 2} + \hat{a}_k^2\right) + \right.$$

$$\left. J\left(\hat{a}_k^\dagger + \hat{a}_k\right)\right\} - \left(C\hat{a}_1^\dagger \hat{a}_2^\dagger \hat{a}_3 \hat{a}_4 + h.c.\right) - C\sum_{k,m=1}^{3} \hat{a}_k^\dagger \hat{a}_k \hat{a}_m^\dagger \hat{a}_n$$

$$\hat{H}_{fixed} = -K\hat{a}_4^{\dagger 2}\hat{a}_4^2 + \varepsilon_p\left(a_4^{\dagger 2} + a_4^2\right).$$

Figure 22:
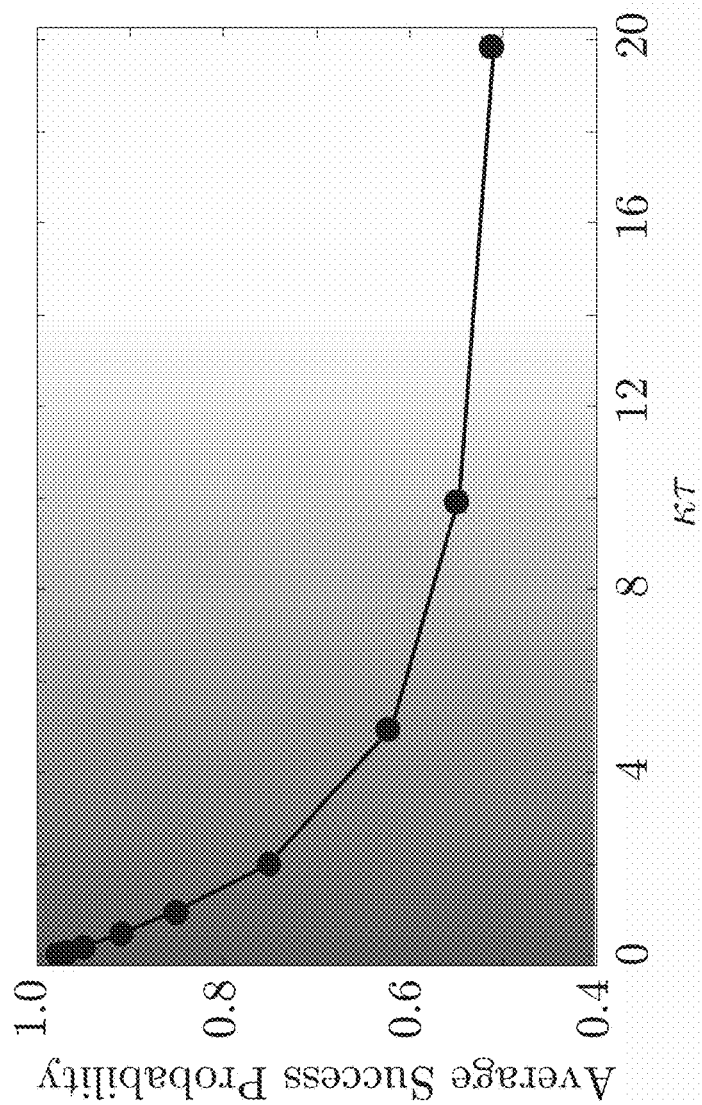
FIG. 22 represents average success probability for all problem instances on a plaquette with residual interactions, and more specifically shows the dependence of the average success probability for all fully connected problems on a single plaquette with the $\Sigma_{k,m=1}^3 \hat{a}_k^\dagger \hat{a}_k^\dagger \hat{a}_m^\dagger \hat{a}_m$ term included.

In contrast to Eq.(36) in the main text, we have included here the cross-Kerr terms. In addition, we have included additional detuning to the problem Hamiltonian $\propto (1-f)$ in order to remove the above mentioned lifting of degeneracy for small $\alpha_0$. In the example presented here we use $f=0.7$. The average success probability for all the eight possible problems on the plaquette, shown in FIG. 22, effectively does not change compared to the case when the $\Sigma_{k,m=1}^3 \hat{a}_k^\dagger \hat{a}_k \hat{a}_m^\dagger \hat{a}_m$ term is neglected.

Tunable Four-Body Coupling with a Josephson Ring Modulator

Figure 23:
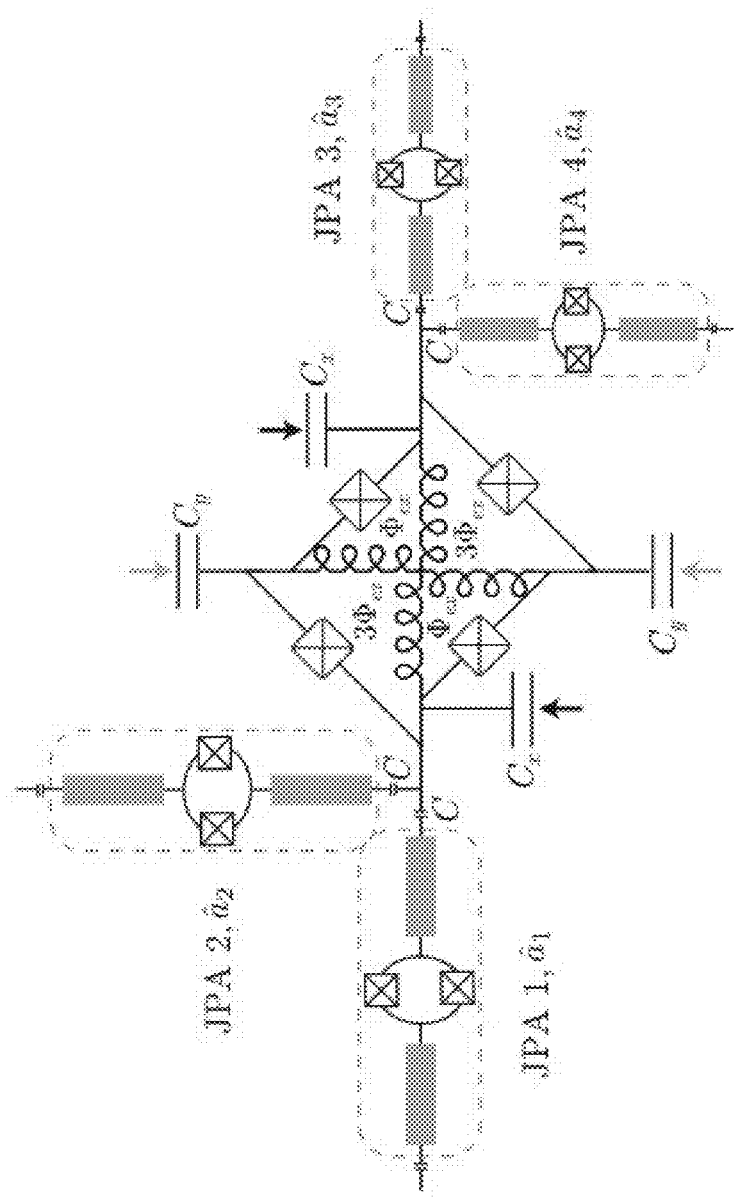
FIG. 23 is a schematic circuit for implementing a tunable four-body interaction using a Josephson ring modulator (JRM). Classical microwave drives of equal strength but opposite phase, as shown with the dark and light arrows, activates the four-body coupling between the JPAs.

An alternative way to implement a four-body interaction in a tunable way is by using an imbalanced shunted Josephson Ring Modulator (JRM) as illustrated in FIG. 23. The JRM consists of 3 orthogonal mutually interacting modes $\hat{\phi}_x$, $\hat{\phi}_y$ and $\hat{\phi}_z$[10,11], which also couple with the JPA modes. The Hamiltonian can be expressed as $$\hat{H}_c = \omega_x \hat{a}_x^\dagger \hat{a}_x + \omega_y \hat{a}_y^\dagger \hat{a}_y + \omega_z \hat{a}_z^\dagger \hat{a}_z + \tag{73}$$

$$\sum_{\alpha=x,y,z}\sum_{i=1}^{4} g_i^\alpha\left(\hat{a}_i^\dagger \hat{a}_\alpha + \hat{a}_\alpha^\dagger \hat{a}_i\right) + U_J\left(\hat{\phi}_x, \hat{\phi}_y, \hat{\phi}_z\right).$$

In the above expression, $\hat{a}_\alpha$ are the JRM mode operators and in terms of the zero point flux fluctuation, $\hat{\phi}_\alpha = \phi_\alpha(\hat{a}_\alpha + \hat{a}_\alpha^\dagger)$. The coupling rate is $g_i^\alpha = e^2 \phi_0^2/(2\mathcal{C}\phi_\alpha\phi_i)$. The potential $U_J$ represents the interaction between the JRM modes and is expressed as $$U_J = -E_J\left[2\cos\left(\frac{\phi_x - \phi_y}{2\phi_0}\right)\cos\left(\frac{\phi_z}{\phi_0} + 3\Phi_{ex}\right) + \right. \tag{74}$$

$$\left. 2\cos\left(\frac{\phi_x + \phi_y}{2\phi}\right)\cos\left(-\frac{\phi_z}{\phi_0} + \Phi_{ex}\right)\right],$$

where $3\Phi_{ex}$ and $\Phi_{ext}$ are the unit-less external flux applied to the big and small loops respectively of the JRM. Note that one should subtract the second order term of each mode from the potential but, for simplicity, we omit these terms here because the correction to the frequencies are small. We now choose the external flux to be $\Phi_{ex} = \pi/2$ such that $$U_J = -4E_J \cos\left(\frac{\phi_x}{2\phi_0}\right)\cos\left(\frac{\phi_y}{2\phi_0}\right)\sin\left(\frac{\phi_z}{\phi_0}\right). \tag{75}$$

The above expression for $U_J$ is substituted in Eq.(73) to obtain a complete expression for the coupling Hamiltonian.

It is now possible to provide an overview for the generation of a tunable coupling between the JPA modes: the frequencies are designed such that the JPA modes are dispersively coupled only to the x-modes, and a classical drive of frequency $\omega_d$ on the far detuned z-mode triggers the four-body coupling. The z-mode is driven by applying fields with equal strength, but opposite phases to the capacitors $\mathcal{C}_x$ and $\mathcal{C}_y$, as indicated by the dark and light arrows FIG. 23. Since there is no drive to the Y-mode, it can be dropped from the Hamiltonian. As a result, the total Hamiltonian can be written as $$\hat{H} = \sum_{k=1}^{4}\left[\hat{H}_{JPA,k} + g_k^x\left(\hat{a}_i^\dagger \hat{a}_x + \hat{a}_x^\dagger \hat{a}_k\right) + g_k^z\left(\hat{a}_k^\dagger \hat{a}_z + \hat{a}_z^\dagger \hat{a}_k\right)\right] + \tag{76}$$

$$E_J \frac{\hat{\phi}_x^2}{2\phi_0^3}\hat{\phi}_z - E_J \frac{\hat{\phi}_x^4}{96\phi_0^5}\hat{\phi}_z.$$

Furthermore, if $\Delta_k = \omega_x - \omega_{r,k} \gg g_k$, then it is possible to apply a dispersive unitary transformation $\hat{U} = \exp[-i(g_1/\Delta_1)\hat{a}_x^\dagger \hat{a}_1 - i(g_2/\Delta_2)\hat{a}_x^\dagger \hat{a}_2 + i(g_3/\Delta_3)\hat{a}_x^\dagger \hat{a}_3 + i(g_4/\Delta_4)\hat{a}_x^\dagger \hat{a}_4 + h.c.]$ to the total Hamiltonian. As mentioned before, the z-mode is driven classically by a field of frequency $\omega_d$ and we therefore replace $\hat{\phi}_z$ by the classical amplitude $2\phi_z\sqrt{n}\cos(\omega_d t)$, where n is the number of photons in the mode z. If $\omega_d = \omega_{p,1} + \omega_{p,2} + \omega_{p,3} - \omega_{p,4}$ then it is possible to eliminate the fast rotating terms and the resulting Hamiltonian is $$\hat{H}_{plaquette} \approx \sum_{k=1}^{4}\left(\hat{H}_{JPA,k} - \frac{(g_k^x)^2}{\Delta_k^x}\hat{a}_k^\dagger \hat{a}_k\right) - C_{jrm}\left(\hat{a}_1^\dagger \hat{a}_2^\dagger \hat{a}_3^\dagger \hat{a}_4 + h.c.\right), \tag{77}$$

where $$C_{jrm} = E_J \sqrt{n} \frac{\phi_x^4 \phi_z}{4\phi_0^5} \frac{g_1 g_2 g_3 g_4}{\Delta_1 \Delta_2 \Delta_3 \Delta_4}. \tag{78}$$

Note that, in the computational basis, the interaction term $\mathcal{C}_{jrm}(\hat{a}_1^\dagger \hat{a}_2^\dagger \hat{a}_3^\dagger \hat{a}_4 + h.c.)$ can be expressed as $2\mathcal{C}_{jrm}\text{Re}[\alpha_0^3 \alpha_0^*]\hat{\sigma}_{z,1}\hat{\sigma}_{z,2}\hat{\sigma}_{z,3}\hat{\sigma}_{z,4}$, which is the desired four-body coupling.

By taking $E_J/2\pi=860$ GHz, $g_k/\Delta_k=0.12$, $\phi_x/\phi_0=\phi_z/\phi_0=0.12$ and $n=2.225$, it is possible to obtain a four-body coupling strength $\mathcal{C}_{jrm}/2\pi=1.7$ KHz. Note that this is a higher-order coupling compared with the fixed one analyzed in Supplementary Note 4 and therefore is an order of magnitude smaller. The advantage of this scheme, however, is that it is tunable and that the coupling strength can be increased by increasing $\sqrt{n}$, which is proportional to the strength of the applied microwave drive. The coupling could also be increased by increasing the zero-point flux fluctuations $\phi_x$ and $\phi_z$. Moreover, in addition to amplitude-tunable four-body coupling, the classical drive also provides a control for the phase or parity of the four-body coupling. Changing the phase of the drive by π, for example, will also change the phase of the four-body coupling coefficient $\mathcal{C}_{jrm} \rightarrow -\mathcal{C}_{jrm}$. This configuration can therefore be used to implement the odd-parity LHZ scheme.

It will be understood that in practice a quantum processor will include some form of controller which will be used to "apply drives", and some form of detector which will be used to perform the readout (homodyne or heterodyne detection), and that the controller and the detector can be separate devices, or integrated as modules of a same device or system.

Using technology available at the time of filing the patent application, the core KNO circuit can need to be operated at very low temperatures, e.g. a few milli-Kelvins, which can be achieved with dilution refrigerators, for instance. It will be understood by persons skilled in the art that this will change as new technological developments become available, and may allow to greatly simplifying the actual preferred setup, however such a low temperature core setup will now be described for the purpose of providing a tangible example.

In such a setup, the controller can include commercially available microwave generators which can operate at room temperature and pass through various other commercially available input electronics to reach the core KNO circuit. The input electronics can ensure that noise at room temperature does not enter the device being operated at very low temperatures. Standard devices known to persons having ordinary skill in the art can be used. Alternately, low temperature generators or on-chip sources of field may be used if and when they become available.

For homodyne or heterodyne detection, again the output from the core KNO circuit passes through output electronics (amplifiers, circulators etc) allowing the signal to exit the dilution refrigerator at room temperature. These signal are mixed with a strong carrier (one, two or more) or drives such as local oscillators at the frequency of the output signal but at a different phase. The phase can have an effect analogous to deciding what "quadrature" of output field is being measured. Again, this can be done using known techniques.

In different embodiments, the input electronics and the output electronics can be more or less intermeshed or distinct.

FIG. 24 shows an example of such a quantum processor 10. The quantum processor 10 has a controller 12 connected to the core KNO circuit 16 via input electronics 14. Moreover, the quantum processor 10 includes a detector 20 receiving an output of the core KNO circuit 16 via output electronics 18.

In this specific example wherein the KNOs operate based on microwave radiation, the controller 12 includes a waveform generator, a microwave source and an I/Q mixer. The reader includes an I/Q mixer, a microwave source, and an analog to digital converter.

The input electronics can include attenuators, filters, etc. The output electronics can include circulators, filters, amplifiers, etc.

Such electronic components are commercially available. For instance, Agilent™ provides function generators, Tektronix™ provides waveform generators, Marki™ provides I/Q mixers, Pamtech™ provides circulators and XMA™ provides attenuators.

The actual setup can widely vary from one application to another. For instance, depending on the underlying core KNO circuit, one may need different power at different frequencies, and the bandwidth of filters, circulators, etc. and the amount of attenuation can be adapted on this basis. While such technologies are not widespread, they are well known to persons skilled in this specific area of art, and examples are presented in some publications such as "Confining the state of light to a quantum manifold by engineered two-photon loss", Dec. 16, 2014, by Leghtas et al, https://arxiv.org/pdf/1412.4633.pdf (see Fig. S1), "Coherent oscillations inside a quantum manifold stabilized by dissipation", Nov. 15, 2017, by Touzard et al, https://arxiv.org/pdf/1705.02401.pdf (see Fig. SS1), "Deterministic Quantum State Transfer and Generation of Remote Entanglement using Microwave Photons" Dec. 25, 2017 by Kurpiers et al, https://arxiv.org/pdf/1712.08593.pdf (see FIG. 1) and "Fault tolerant measurement of a quantum error syndrome" March 2018, by Rosenblum et al, https://arxiv.org/pdf/1803.00102.pdf (see Fig. S1).

As can be understood, the examples described above and illustrated are intended to be exemplary only. Indeed, as will be understood by persons having ordinary skill in the art in light of the above disclosure, the teachings of this description can be applied to other type of bosons than microwave photons, and other types of KNOs than KNRs can be used, with connectors selected as a function of the given application. For instance, one possible implementation uses a Josephson-parametric-amplifier (JPA) like setup. The JPA, is basically a SQUID embedded in a coplanar waveguide resonator. The two-boson drive can be provided by modulating flux through the SQUID loop, and the SQUID can also provide the Kerr-nonlinearity. Other implementations can use transmon (or single-Josephson junction) and cavities (e.g. 2D or 3D cavities). Transmons can be embedded in a coplanar waveguide cavity for instance. 3D cavities (resonators) are quite common. The transmon provides the Kerr-nonlinearity and a microwave drive applied through the transmon at the appropriate frequency can provide to the two-photon drive. Another possible implementation is with a Superconducting Nonlinear Asymmetric Inductive Element (SNAIL) embedded in 3d cavities. The external flux applied through the SNAIL is such that both the fourth and third order nonlinearities are large. A microwave drive applied at twice the frequency of the SNAIL would result in the desired two-photon drive, due to three-wave mixing coming from the third order nonlinearity. The fourth order nonlinearity gives the required Kerr term. Other applications can be based on optical photons. Indeed, there are several ways to realize a parametric oscillator in optical systems. For example, one way could be to use a non-linear crystal like periodically poled lithium niobate (PPLN) crystal. Another example is silica-based toroidal microcavities. Persons having ordinary skill in the art can design connectors for 4-body coupling without undue experimentation, for instance, there are many non-linear crystals which have a 4 wave mixing property which could be used as connectors while maintaining the conditions a+b=c+d. Other applications can be based on phonons. For instance, two coupled Kerr-nonlinear mechanical resonators sustaining phonons in symmetric and asymmetric vibration modes can be used. In this scenario, the two-boson drive can be obtained by modulating the spring constant of either mode with the application of an AC-voltage to induce stress from a piezo-electric transducer, for instance. Persons having ordinary skill in the art can design connectors for 4-body coupling without undue experimentation, for instance the mechanical resonators could be coupled to optical or micro-wave cavities and then the 4 way mixing could be performed via the optical or micro-wave cavities. Accordingly, the scope is indicated by the appended claims.

What is claimed is:

1. A method of quantum processing using a quantum processor comprising a plurality of Kerr non-linear oscillators (KNOs), each operably drivable by both i) a controllable single-boson drive and ii) a controllable two-boson drive, the method comprising
simultaneously controlling a drive frequency and a drive amplitude of the controllable single-boson drives to define a problem, and a drive frequency and a drive amplitude of the two-photon drives to define the Hilbert space, in accordance with a protocol, said protocol including increasing the amplitude of the two-boson drive and reaching both amplitude conditions
a) 4 times the amplitude of the two-boson drives being greater than the loss rate, and
b) the amplitude of the two-boson drives being greater than the amplitude of the single-boson drive, and
maintaining both amplitude conditions a) and b) until a solution to the problem is reached; and,
reading the solution.

2. The method of quantum processing of claim 1 wherein said reading the solution includes measuring the phase of at least some of the KNOs.

3. The method of quantum processing of claim 2 wherein said measuring the phase is performed by homodyne detection.

4. The method of claim 1 wherein the amplitude condition a) is 4 times the amplitude of the two-boson drives being at least 4 times greater than the loss rate.

5. The method of claim 1 wherein the amplitude condition a) is 4 times the amplitude of the two-boson drives being at least 10 times greater than the loss rate.

6. The method of claim 1 wherein the amplitude condition a) is 4 times the amplitude of the two-boson drives being at least 100 times greater than the loss rate.

7. The method of claim 1 wherein the amplitude condition b) is the amplitude of the two-boson drives being at least two times greater than the amplitude of the single-boson drive.

8. The method of claim 1 wherein the amplitude condition b) is the amplitude of the two-boson drives being at least four times greater than the amplitude of the single-boson drive.

9. The method of claim 1, wherein the bosons are photons and the KNOs are Kerr non-linear resonators (KNRs).

10. The method of claim 1, wherein the KNOs are arranged in a triangular lattice structure wherein the KNOs are arranged in a plurality of rows including a first row having a single KNO and subsequent rows each having a number of KNOs corresponding to the number of KNOs of the previous row plus one, and in which the KNOs are arranged in groups of nearest neighbor KNOs in which the KNOs of each group are locally interconnected to one another for boson exchange within the corresponding group via a corresponding connector, and wherein the KNOs of each group have individual frequencies a, b, c, d, different from one another while respecting a+b=c+d throughout the triangular lattice structure, the method further comprising:
performing boson exchange within groups of nearest neighbors at corresponding coupling strengths and coupling constants, the KNOs of each group of nearest neighbors having a corresponding strength of Kerr-nonlinearity, wherein said protocol further includes controlling the drives in a manner that, for at least a portion of the protocol leading to the reaching of the solution i) each coupling strength is maintained greater than the amplitude of the corresponding single-boson drives and ii) each coupling constant is maintained smaller than the corresponding strengths of Kerr-nonlinearity.

11. A quantum annealer comprising a plurality of Kerr non-linear oscillators (KNOs), each operably drivable by both i) a controllable single-boson drive and ii) a controllable two-boson drive, the KNOs being arranged in a triangular lattice structure wherein the KNOs are arranged in a plurality of rows including a first row having a single KNO and subsequent rows each having a number of KNOs corresponding to the number of KNOs of the previous row plus one; and a plurality of connectors, each connector connecting the KNOs in a manner to allow boson exchange between KNOs within groups of nearest neighbors.

12. The quantum annealer of claim 11 wherein, in the triangular lattice structure, KNOs are arranged in groups of nearest neighbor KNOs in which the KNOs of each group are locally interconnected to one another for boson exchange within the corresponding group via a corresponding connector, and wherein in each group of nearest neighbors, the KNOs can have individual frequencies a, b, c, d, different from one another while respecting a+b=c+d throughout the triangular lattice structure.

13. The quantum annealer of claim 12 wherein the triangular lattice structure are terminated by a plurality of fixed phase sources forming a termination row, the groups of nearest neighbors thus being either formed of four KNOs, or of three KNOs and a corresponding one of said fixed phase sources, wherein in the groups of nearest neighbors formed of three KNOs and a corresponding one of said fixed phase sources, the individual frequencies a, b, c, d, of the KNOs and of the fixed source are also different from one another while respecting a+b=c+d.

14. The quantum annealer of claim 13 wherein the fixed phase sources are oscillators, driven in a manner to be maintained at a fixed phase.

15. The quantum annealer of claim 13 wherein the fixed phase sources are coherent drives.

16. The quantum annealer of claim 11 wherein the KNOs are Kerr non-linear resonators (KNRs) in which the bosons are photons.

17. The quantum annealer of claim 11 wherein the two-photon drives include superconducting Josephson parametric amplifiers.

* * * * *